United States Patent
Iwasaki

[11] Patent Number: 6,134,482
[45] Date of Patent: Oct. 17, 2000

[54] METHOD AND APPARATUS FOR CONTROLLING SEMICONDUCTOR WAFER FABRICATION EQUIPMENT BASED ON A REMAINING PROCESS TIME APPLICABLE TO THE PROCESSORS

[75] Inventor: Junji Iwasaki, Tokyo, Japan

[73] Assignee: Mitsubishi Denki Kabushiki Kaisha, Tokyo, Japan

[21] Appl. No.: 09/073,429

[22] Filed: May 6, 1998

[30] Foreign Application Priority Data

Oct. 15, 1997  [JP]  Japan .................................. 9-281984

[51] Int. Cl.[7] .................................................. G06F 19/00
[52] U.S. Cl. ........................ 700/121; 710/58; 710/244; 709/103; 700/100; 700/101; 414/14
[58] Field of Search .................................. 710/5, 20, 58, 710/244; 700/121, 100, 101; 414/14; 709/103

[56] References Cited

U.S. PATENT DOCUMENTS

| | | | |
|---|---|---|---|
| 4,517,641 | 5/1985 | Pinheiro | 710/20 |
| 4,627,018 | 12/1986 | Trost et al. | 711/149 |
| 5,179,709 | 1/1993 | Bailey et al. | 710/23 |
| 5,546,426 | 8/1996 | Tomiyori | 375/242 |
| 5,615,376 | 3/1997 | Ranganathan | 713/322 |
| 5,818,716 | 10/1998 | Chin et al. | 364/468.06 |

FOREIGN PATENT DOCUMENTS

| | | |
|---|---|---|
| 63-263903 | 5/1990 | Japan . |
| 7-244504 | 9/1995 | Japan . |

*Primary Examiner*—Thomas C. Lee
*Assistant Examiner*—Thuan Du
*Attorney, Agent, or Firm*—McDermott, Will & Emery

[57] ABSTRACT

Semiconductor wafer fabrication equipment comprising a selecting device for selecting semiconductor wafers destined to a processor on the basis of a remaining process time applicable to that processor in the equipment, a transporting device for transporting the selected semiconductor wafers to the processor, another selecting device for selecting a processor or a storage device constituting a transport destination to which to transport processed semiconductor wafers, and another transporting device for transporting the semiconductor wafers to the destination processor or storage device in accordance with a transport control changeover code read from the processors and storage devices of the equipment.

20 Claims, 57 Drawing Sheets

HORIZONTAL POSITION

PERPENDICULAR POSITION

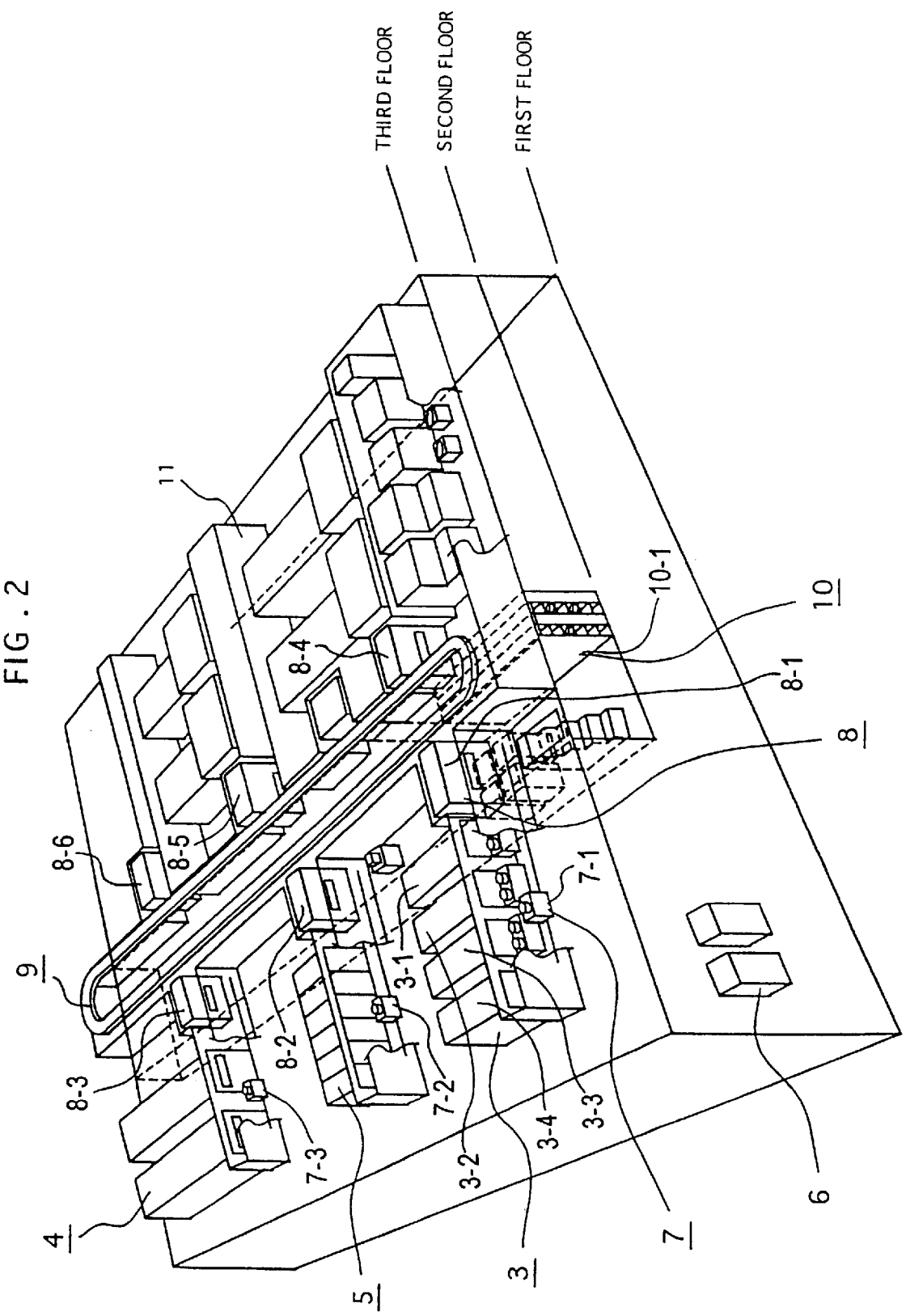

FIG. 52

PROCESSOR = 3 - 12

| NO. | ID | IN-PROCESS SITE | REGION | TRANSPORT ROUTE | TRANSPORT TASK EXECUTION TIME | PRIORITY | RESERVE FLAGS | |
|---|---|---|---|---|---|---|---|---|
| | | | | | | | TEMPORARY | REAL |
| 1 | D | 3-11 | | 3-11:7-11:8-11:9:8-12:7-12:3-12 | td | 1 | | |
| 2 | C | 8-11 | | 8-11:9:8-12:7-12:3-12 | tc | 2 | | |
| 3 | B | 10-11 | U | 10-11U:9:8-12:7-12:3-12 | tb | 3 | | |
| 4 | A | 8-12 | | 8-12:7-12:3-12: | ta | 4 | ON | |

FIG. 53

| NO. | ID | TRANSPORT SOURCE | | TRANSPORT DESTINATION | | TRANSPORT ROUTE | TRANSPORT TIME | | | | PREDICTED SUPPLY TIME |
|---|---|---|---|---|---|---|---|---|---|---|---|
| | | REGION | | REGION | | | TRANSPORT TASK EXECUTION TIME | TRANSPORT TASK EXECUTION UNIT TIME | | | |
| | | | | | | | | 1 | 2 | 3 | |
| 1 | D | 3-11 | | 3-12 | | 3-11:7-11:8-11:9:8-12:7-12:3-12 | td | td1 | td2 | td3 | tp |

FIG. 54

| STOCKER | REGION | PROCESSOR | | | | | |
|---|---|---|---|---|---|---|---|
| | | 3-1 | 3-2 | 3-3 | 3-4 | | |
| 8-1 | | | | | | | |
| 8-2 | | 5-1 | 5-2 | 5-3 | 5-4 | 5-5 | 5-6 |
| 8-3 | | 4-1 | 4-2 | 4-3 | | | |
| 8-4 | | | | | | | |
| 8-5 | | | | | | | |
| 8-6 | | | | | | | |
| 10-1 | O | | | | | | |
| | U | | | | | | |

FIG. 55

| PROCESSOR | STOCKER | | | | | |
|---|---|---|---|---|---|---|
| | 1 (LAST) | | 2 | | 3 | |
| | REGION | | | REGION | | REGION |
| 3-1 | 8-1 | | 10-1 | O | 10-1 | U |
| 3-2 | 8-1 | | 10-1 | O | 10-1 | U |
| 3-3 | 8-1 | | 10-1 | O | 10-1 | U |
| 3-4 | 8-1 | | 10-1 | O | 10-1 | U |
| 5-1 | 8-2 | | 10-1 | O | 10-1 | U |
| 5-2 | 8-2 | | 10-1 | O | 10-1 | U |
| 5-3 | 8-2 | | 10-1 | O | 10-1 | U |
| 5-4 | 8-2 | | 10-1 | O | 10-1 | U |
| 5-5 | 8-2 | | 10-1 | O | 10-1 | U |
| 5-6 | 8-2 | | 10-1 | O | 10-1 | U |
| 4-1 | 8-3 | | 10-1 | O | 10-1 | U |
| 4-2 | 8-3 | | 10-1 | O | 10-1 | U |
| 4-3 | 8-3 | | 10-1 | O | 10-1 | U |

FIG. 56

PROCESSOR = 3 - 12

| No. | ID | IN-PROCESS SITE | PRIORITY |
|-----|----|-----------------|----------|
| 1   | C  | 8-11            | 2        |
| 2   | B  | 10-11           | 3        |
| 3   | A  | 8-12            | 4        |

FIG. 57

| No. | ID | TRANSPORT SOURCE | TRANSPORT DESTINATION |
|---|---|---|---|
| 1 | A | 8-12 | 3-12 |
| 2 | D | 3-11 | 8-11 |
| 3 | C | 8-11 | 8-12 |
| 4 | B | 10-11 | 8-12 |

METHOD AND APPARATUS FOR CONTROLLING SEMICONDUCTOR WAFER FABRICATION EQUIPMENT BASED ON A REMAINING PROCESS TIME APPLICABLE TO THE PROCESSORS

BACKGROUND OF THE INVENTION

1. Field of the Invention

The present invention relates to a method for controlling the transport of semiconductor wafer carriers used by equipment for fabricating semiconductor integrated circuits.

2. Background Art

FIGS. 1A and 1B are perspective views showing a cassette containing semiconductor wafers. In the figures, reference numeral 1 represents semiconductor wafers (simply called wafers hereunder) from which numerous semiconductor integrated circuits (not shown) are produced. Reference numeral 2 denotes a semiconductor wafer cassette (simply called the cassette hereunder) that serves as a transport unit carrying a plurality of wafers 1. FIG. 1A sketches a horizontally positioned cassette 2 in which the wafers 1 are positioned perpendicularly, with a wafer removal side 2a facing up. FIG. 1B portrays a vertically positioned cassette 2 wherein the wafers 1 are positioned horizontally, with the wafer removal side 2a facing sideways.

FIG. 2 is a perspective view of typical semiconductor fabrication equipment. As illustrated, this semiconductor fabrication equipment is deployed on three floors. In FIG. 2, reference numerals 3, 4 and 5 represent processors each receiving and processing wafers 1 in one cassette 2 at a time. The processors are divided in terms of structure into three types, (A), (B) and (C). The processor of each type will be described later in detail. A large number of processors 3, 4 and 5 are located on the third floor, and their attendant equipment 6 is located on the first floor. Reference numeral 7 denotes automated guided vehicles (called the AGVs hereunder) constituting transport means for transporting cassettes 2 between the processors 3, 4 and 5 on the one hand, and bay stockers 8 constituting storage means for accommodating the cassettes 2 on the other hand.

The setup of FIG. 2 includes six bay stockers 8-1 through 8-6. The bay stockers 8 and the processors 3, 4 and 5 are suitably grouped so that, for example, the processors 3-1 through 3-4 may use the bay stocker 8-1. Such groups each constitute a unit for performing necessary processes on semiconductor wafers. Each group made up of the processor 3, 4 or 5 and of the bay stocker 8 is called a process region or a bay. Reference numeral 9 represents an overhead stocker-to-stocker transport device (called the OHS hereunder) constituting transport means for moving the cassettes 2 between the bay stockers 8-1 through 8-6 on the one hand and an overflow stocker 10-1 on the other hand. Reference numeral 10 denotes an overflow stocker constituting storage means for receiving and storing excess cassettes 2 which cannot be accommodated by the bay stockers 8 fully stocked with the cassettes 2 (the overflow stocker and bay stocker may generically be called stockers hereunder where appropriate). The setup of FIG. 2 comprises a single overflow stocker 10-1.

Reference numeral 11 indicates partitions. Inside the partitions is a clean room under strict control as a dust-free space shielded from the external environment. The cassettes 2 are transported inside the clean room by AGVs 7 and along the OHS 9. As with the processors 3, 4 and 5, the AGVs 7, bay stockers 8 and OHS 9 are located on the third floor. The overflow stocker 10 is furnished on the second floor but is arranged structurally so as to exchange cassettes 2 with the OHS 9. What follows is a detailed and specific description of the processors 3, 4 and 5, the bay stockers 8, overflow stocker 10, AGVs 7 and OHS 9 with reference to the accompanying drawings. First to be described are the three types of processors.

FIG. 3 is a perspective view of the processor (A) 3. In FIG. 3, reference numeral 3a indicates stages on which cassettes 2 are placed by AGVs 7. The processor (A) 3 has two stages 3a-1 and 3a-2. Reference numeral 3b denotes a wafer transport robot that picks up wafers 1 from the cassette 2 on the stage 3a and carries them into a processing chamber 3c where the wafers are processed. The robot then moves the processed wafers 1 from the processing chamber 3c back to the original cassette 2 on the stage 3a. Reference numeral 3d represents an AGV communication unit that communicates with an AGV 7 to check the presence or absence of the cassette 2 on the stage 3a upon loading and unloading of the cassette 2 to and from the stage 3a by the AGV 7.

The processor (A) 3 is characterized by one feature: the cassette 2 unloaded onto the stage 3a by the AGV 7 remains on the stage until all wafers 1 in the cassette 2 have been processed and taken out by the AGV 7.

FIG. 4 is a perspective view of the processor (B) 4. In FIG. 4, reference numeral 4a indicates stages on which cassettes are placed by AGVs 7. The processor (B) 4 has two stages 4a-1 and 4a-2. Reference numerals 4b and 4c represent spaces where a plurality of cassettes 2 are stored. The spaces 4b and 4c flank a processing vessel 4f in which processing is carried out. Each of the spaces 4b and 4c has a front buffer installed on the AGV side and a back buffer on the opposite side. Reference numeral 4d denotes cassette transport robots that carry cassettes 2. Two cassette transport robots are provided, one 4d-1 located in the front buffer 4b and the other 4d-2 in the back buffer 4c. Reference numeral 4e indicates a shuttle that carries cassettes 2 between the front buffer 4b and the back buffer 4c. The processing vessel 4f comprises three component vessels 4f-1, 4f-2 and 4f-3 in which the wafers 1 are processed in that order. Reference numeral 4g points to an AGV communication unit that communicates with an AGV 7 to check the presence or absence of the cassette 2 on the stage 4a upon loading and unloading of the cassette 2 to and from the stage 4a by the AGV 7.

Briefly, a cassette 2 moves in the processor (B) 4 as follows: upon receipt of a cassette 2 from an AGV 7 onto the stage 4a, the processor (B) 4 gets the cassette transport robot 4d-1 to place the cassette 2 into the front buffer 4b. The cassette 2 is carried from the front buffer 4b to the shuttle 4e by the cassette transport robot 4d-1. Loaded with the cassette 2, the shuttle 4e proceeds to the back buffer 4c. Upon arrival at the back buffer 4c, the cassette 2 is moved by the cassette transport robot 4d-2 from the shuttle 4e into the back buffer 4c. Thereafter, the cassette 2 is sent into the processing vessel 4f also by the cassette transport robot 4d-2.

With the cassette 2 in the processing vessel 4f, the wafers 1 inside the cassette are moved through the component vessels 4f-1 to 4f-3, in that order, for processing therein. When the processing in the processing vessel 4f is completed, the cassette 2 is taken out by the cassette transport robot 4d-1 and placed into the front buffer 4b. From the front buffer 4b, the processed cassette 2 is forwarded to the stage 4a by the cassette transport robot 4d-1. From the stage 4a, the cassette 2 is loaded onto an AGV 7 which proceeds to the next destination. The processor (B) 4 is characterized by two features: that it has spaces with the front and back buffers 4b and 4c to store cassettes 2 inside, and that the wafers 1 in a plurality of cassettes 2 are processed concurrently and continuously.

FIG. 5 is a perspective view of the processor (C) 5. In FIG. 5, reference numeral 5a indicates stages on which cassettes are placed by AGVs 7. The processor (C) 5 has two stages 5a-1 and 5a-2. Reference numeral 5b is a buffer that accommodates a plurality of cassettes 2. Reference numeral 5c is a cassette transport robot that carries a cassette 2 from one stage 5a to the buffer 5b, from the buffer 5b to an internal stage 5e, from the internal stage 5e to the buffer 5b, and finally from the buffer 5b back to the stage 5a. Reference numeral 5d is a wafer transport robot that extracts wafers 1 from the cassette 2 on the internal stage 5e, carries the extracted wafers 1 to the processing chamber 5f for processing therein, and moves the processed wafers 1 from inside the processing chamber 5f back to the original cassette 2 on the internal stage 5e.

Reference numeral 5g represents an AGV communication unit that communicates with an AGV 7 to check the presence or absence of the cassette 2 on the stage 5a upon loading and unloading of the cassette 2 to and from the stage 5a by the AGV 7. The processor (C) 5 is characterized in that as with the processor (B) 4, it also has the buffer 5b to store cassettes 2 inside but possesses only one processing chamber 5f corresponding to the processing vessel 4f. It is thus impossible for the processor (C) 5 to process wafers 1 in a plurality of cassettes 2 on a concurrent and continuous basis. Whereas the different types of processors (A) 3, (B) 4 and (C) 5 have been described individually so far, references in the ensuing description to "processor" or "processors" with no specific type mentioned should be construed generically to designate all three types of processors. The transporting equipment consisting of the bay stockers 8, overflow stocker 10, AGVs 7 and OHS 9 will now be described.

FIG. 6 is a perspective view of a bay stocker 8. In FIG. 6, parts of the OHS 9 and of an AGV 7 are shown to clarify their positional relations to the bay stocker 8. Reference numeral 8a indicates a loader that receives a cassette 2 borne on a carriage 9a over the OHS 9, sets the received cassette 2 to an OHS port 8e, and loads onto the carriage 9a the cassette 2 sent up to the OHS port 8e. Reference numeral 8b is a stocker crane that moves cassettes 2 between AGV ports 8d on the one hand and stocker shelves 8c for cassette storage on the other hand. The AGV ports 8d are ports through which cassettes 2 are exchanged the AGV 7. The stocker shelves 8c are located on both sides of the stocker crane 8b and stacked vertically to constitute a place to store cassettes 2.

Two AGV ports are provided, one port 8d-1 intended for cassette exit and the other port 8d-2 for cassette entry. Reference numeral 8f denotes an AGV communication unit that communicates with an AGV 7 to check the presence or absence of the cassette 2 in the AGV port 8d upon loading and unloading of the cassette 2 to and from the AGV port 8d by the AGV 7. Briefly, the bay stocker 8 operates as follows: a cassette 2 is carried by the OHS 9 from a source stocker 8 or 10 to a destination bay stocker 8. The loader 8a unloads the cassette upon its arrival from the carriage 9a and loads it into the OHS port 8e.

The stocker crane 8b collects the cassette 2 from the OHS port 8e and places the collected cassette 2 into the stocker shelves 8c. As requested by the processor 3, 4 or 5, the cassette 2 is moved from the stocker shelves 8c to the AGV port 8d-1. From the AGV port 8d-1, the cassette 2 is carried by the AGV 7 to the processor 3, 4 or 5 having issued the request. After being processed by the processor 3, 4 or 5, the cassette 2 is forwarded to the AGV port 8d-2 by the AGV 7. From the AGV port 8d-2, the cassette 2 is moved by the stocker crane 8b to the stocker shelves 8c for storage. The cassette 2 is then moved by the stocker crane 8b to the OHS port 8e from which the cassette 2 is to be sent to the nearest bay stocker 8 of the processor 3, 4 or 5 expected to perform the next process of fabrication.

The nearest bay stocker 8 in this context signifies the bay stocker 8 located in the same process region as that of the processor 3, 4 or 5 in question. From the OHS port 8e, the cassette 2 is placed onto the carriage 9a by the loader 8a.

FIG. 7 is a perspective view of the overflow stocker 10. As in FIG. 6, part of the OHS 9 is also shown in FIG. 7. The overflow stocker 10 uses a lift 10a, one of the overflow stocker components, to exchange cassettes 2 with the OHS 9 installed on the second and third floors of the semiconductor fabrication equipment. Reference numeral 10b indicates a lift stage that carries a cassette 2 and is moved up and down by the lift 10a. Reference numeral 10c denotes a loader that loads the cassette 2 from the carriage 9a onto the lift stage 10b stopped on the third floor, and unloads the cassette 2 from the lift stage 10b onto the carriage 9a.

Reference numeral 10d is a feed mechanism which feeds the cassette 2 from the lift stage 10b stopped on the second floor to a delivery stage 10e where the cassette 2 is handled by a stocker crane 10f. The feed mechanism 10d further moves the cassette 2 from the delivery stage 10e onto the lift stage 10b. Reference numeral 10g represents stocker shelves for storing cassettes 2. The stocker crane 10f carries cassettes 2 from the delivery stage 10e into the stocker shelves 10g and moves cassettes 2 from the stocker shelves log to the delivery stage 10e. It can be seen from FIG. 7 that a storage site may also be provided easily on the third floor if stocker shelves 10g and a stoker crane 10f are installed there.

Briefly, the overflow stocker 10 operates as follows: a cassette 2 is carried by the OHS 9 from a source stocker 8 to the overflow stocker 10 for temporary storage because the cassette storage space of the destination bay stocker 8 is full. The loader 10c unloads the cassette 2 upon its arrival from the carriage 9a and places the cassette 2 onto the lift stage 10b. The lift 10a moves the lift stage 10b bearing the cassette 2 to the second floor. With the lift stage 10b having reached the second floor, the feed mechanism 10d moves the cassette 2 from the lift stage 10b to the delivery stage 10e. From the delivery stage 10e, the cassette 2 is transferred by the stocker crane 10f to the stocker shelves 10g for storage.

When the storage space of the destination bay stocker 8 has been vacated for additional storage, the cassette 2 held in the stocker shelves 10g is moved in the reverse direction; the cassette 2 is transported to the carriage 9a via the delivery stage 10e and lift stage 10b.

FIG. 8 is a perspective view of one AGV 7. In FIG. 8, reference numeral 7a is a carriage that runs along a guide tape 7d, and reference numeral 7b is an arm for loading and unloading of the cassette 2 to and from the stage 3a, 4a or 5a of the processor 3, 4 or 5, as well as to and from the AGV port 8d of the bay stocker 8. Reference numeral 7c represents stages on which to place cassettes 2 using the arm 8b. The carriage 7a has two stages 7c-1 and 7c-2. The presence of the two stages 7c-1 and 7c-2 offers the following advantage: a processed cassette 2 is extracted from the stage 3a, 4a or 5a of the processor 3, 4 or 5 and placed onto one free stage 7c, while an unprocessed cassette on the other stage 7c is fed to the stage 3a, 4a or 5a of the processor 3, 4 or 5 without moving the carriage 7a, whereby the transport time is shortened.

FIG. 9 is a perspective view of the OHS 9. FIG. 9 shows part of a transport rail 9b of the OHS 9 which in fact has a closed loop shape. Each carriage 9a travels unidirectionally on the transport rail 9b, carrying one cassette 2. The setup of FIG. 9 includes four carriages 9a-1 through 9a-4. Reference numeral 9c denotes suspension fixtures for suspending the transport rail 9b from the ceiling of the third floor. Briefly, the OHS 9 operates as follows: the OHS 9 moves an empty carriage 9a to a source stocker 8 or 10. Upon arrival at the source stocker 8 or 10, the carriage 9a has a cassette 2 loaded thereon by the loader 8a or 10c. The cassette-loaded carriage 9a is transported to a destination stocker 8 or 10. Arriving at the destination stocker 8 or 10, the carriage 9a has the cassette unloaded therefrom by the loader 8a or 10c. This completes the cassette delivery operation by the OHS 9.

The foregoing paragraphs have provided detailed and individualized descriptions of key components of the semiconductor fabrication equipment, i.e., the processors 3, 4 and 5, bay stockers 8, overflow stocker 10, AGVs 7 and OHS 9. Described below with reference to FIG. 10 is how these components are interconnected in terms of control.

FIG. 10 is a schematic control block diagram of the semiconductor fabrication equipment comprising the processors 3, 4 and 5, bay stockers 8, overflow stocker 10, AGVs 7, and OHS 9. In FIG. 10, reference numeral 12 is a host computer (simply called the host hereunder) that plays a pivotal role in controlling the semiconductor fabrication equipment. The host 12 comprises a computing body 12a that performs computations and input means 12b that receives externally supplied data such as manufacturing criteria with which to fabricate wafers 1. The host 12 is connected through communication cables 13 to a bay stocker controller Bx, an overflow stocker controller 10x, an OHS controller 9x, and the processors 3, 4 and 5.

An AGV controller 7x is controlled by the bay stocker controller 8x via a communication cable 13. The bay stocker controller 8x and overflow stocker controller 10x are connected to the OHS controller 9x via communication cables 13. The setup allows the OHS controller 9x to control the loaders 8a and 10c upon loading and unloading of cassettes 2 to and from the carriage 9a, and to control the stocker cranes 8b and 10f upon cassette storage into the stocker shelves 8c and 10g. The bay stocker controller 8x, overflow stocker controller 10x, OHS controller 9x, and AGV controller 7x are respectively parts of the bay stockers 8, overflow stocker 10, OHS 9, and AGVs 7 while acting as their controllers at the same time.

The constitution of the semiconductor fabrication equipment has been described above. What follows is a description of how the semiconductor fabrication equipment is conventionally controlled in terms of product transport. The ensuing description of conventional transport controls will be preceded hereunder by an additional description about a minimal model of the semiconductor fabrication equipment (in FIG. 2) handling cassettes 2 as shown in FIG. 11, which will help provide an outline of how cassette transport is controlled.

FIG. 11 is a schematic view of a minimal model of the semiconductor fabrication equipment as it handles cassettes. In FIG. 11, a bay stocker 8-11, an AGV 7-11 and a processor (A) 3-11 constitute a unit that performs necessary processing on semiconductor wafers. The processor 3, 4 or 5 and the bay stocker 8 are grouped together and called a process region. It is assumed here for purpose of explanation that the processor (A) 3-11 is a source processor from which a cassette is transported. That is, the processor (A) 3-11 originates a processed cassette 2. A bay stocker 8-12, an AGV 7-12 and a processor (A) 3-12 constitute a bay which, for purpose of explanation, assumes the role of the destination of cassette transport. That is, the processor (A) 3-12 asks for a cassette 2 that needs to be processed further.

It is evident that in the subsequent description, the processor (A) 3-11 may be taken over alternatively by another processor (B) 4-11 or (C) 5-11 and that the same applies to the processor (A) 3-12. The OHS 9 links the bay stockers 8-11 and 8-12, carries cassettes 2 therebetween, and transports overflown cassettes to an overflow stocker 10-11. In FIG. 11, reference characters A, B, C and D represent a cassette 2 each. The A cassette 2 is handled, i.e., stored, by the bay stocker 8-12. The B cassette 2 is on the second floor and handled by the overflow stocker 10-11. The C cassette 2 is handled by the bay stocker 8-11. The D cassette 2 is located in the processor 3-11. The A cassette 2 is withdrawn from the bay stocker 8-12 and, carried by the AGV 7-12, is expected to arrive at the processor (A) 3-12.

The B cassette 2 is withdrawn from the overflow stocker 10-11 and transported by the OHS 9 to the bay stocker 8-12. From the bay stocker 8-12, the B cassette 2 is expected to arrive at the processor (A) 3-12 in the same manner as the A cassette 2. The C cassette 2 is withdrawn from the bay stocker 8-11 and carried by the OHS 9 to the bay stocker 8-12. From there, the C cassette 2 is expected to arrive at the processor (A) 3-12 in the same manner as the A cassette 2. If the destination bay stocker 8-12 is full and has no room for more cassettes, the C cassette 2 may be housed temporarily by the overflow stocker 10-11. In that case, the C cassette is expected to arrive at the processor (A) 3-12 in the same manner as the B cassette 2. The D cassette 2 is transported to the bay stocker 8-11 by the AGV 7-11 and is expected to reach the processor (A) 3-12 in the same manner as the C cassette 2.

A conventional method for transport control throughout the semiconductor fabrication equipment will now be described. The ensuing description will center on four kinds of control programs: (1) automatic control programs for controlling the processors (A), (B) and (C); (2) a host program for controlling semiconductor wafer supply (known as "pull"); (3) a transport device control program; and (4) a host program for controlling semiconductor wafer output (known as "push").

FIG. 37 is a flowchart of steps describing a conventional automatic control program residing in each of the processors 3, 4 and 5. The flowchart does not cover detailed control differentials between different types of processors. In FIG. 37, the processors 3, 4 and 5 are started first (step 37-1). All processor components are initialized and their performance is verified (step 37-2). If capable of accepting cassettes for processing, the processors send cassette requests to the host 12 (step 37-3), and wait for process start instructions from the host 12 (step 37-4). In the requests sent in step 37-3 to the host 12, the processor (A) 3 requests two cassettes for the stages 3a-1 and 3a-2, the processor (B) 4 requests as many cassettes as may be accommodated by the front and back buffers 4b and 4c, and the processor (C) 5 requests as many cassettes as may be held in the buffer 5b. Given process start instructions from the host 12, the processor (A) 3 confirms that a cassette 2 is found on the stage 3a, the processor (B) 4 verifies that a cassette 2 is located on the stage 4a, and the processor (C) 5 ascertains that a cassette 2 is on the stage 5a. If there exist cassettes 2 already in processing, the progress status of processing is verified (step 37-5). Processing is then started (step 37-6). With the processing started, a check is made to see if any interruption has occurred (step 37-7). If no interruption is detected, step 37-4 is reached again in which process start instructions from the host 12 are awaited. If an interruption is detected in step 37-7, the automatic control program is terminated (step 37-8). FIG. 38 is a flowchart of steps describing a processing task control program started in step 37-6 above. After the processing task control program, residing in each of the processors 3, 4 and 5, is activated in step 37-6 of the automatic control program (step 38-1 in FIG. 38), a process start report is sent to the host 12 (step 38-2). The actual processing of wafers 1 is carried out by use of relevant components (step 38-3). The contents of step 38-3 vary from one processor type to another.

Specifically with the processor (A) 3, the wafer transport robot 3b extracts wafers 1 from the cassette 2 that stays put on the stage 3a and sends the extracted wafers 1 consecutively into the processing chamber 3c for processing. With the processor (B) 4, the cassette transport robot 4d-1 moves the cassette 2 from the stage 4a to the front buffer 4b and, in line with the status of the processing vessel 4f, transfers the cassette 2 to the back buffer 4c for consecutive processing. With the processor (C) 5, the cassette transport robot 5c moves the cassette 2 from the stage 5a to the buffer 5b and, verifying that the internal stage 5e is not occupied, transfers the cassette 2 from the buffer 5b to the stage 5e. The wafer transport robot 5d takes out wafers 1 from the cassette 2 and sends the wafers consecutively into the processing chamber 5f for processing.

With the above series of processes completed, each processor sends a process complete report to the host 12 (step 38-4). At this point, the processed cassettes 2 are located on the stages 3a, 4a and 5a of the processors 3, 4 and 5 respectively. The host 12 causes the AGVs 7 to remove the processed cassettes 2 from the stages. The removal of the cassettes is detected by cassette sensors (not shown) attached to the stages 3a, 4a and 5a. A check is thus made to see if the next cassette 2 may be accepted by each processor (step 38-5). If it is possible to accept the next cassette 2, each processor sends a cassette request to the host 12 (step 38-6). Then the respective processing task control programs are terminated (step 38-7).

Because the processor (A) 3 has up to two cassettes 2 placed on its stages 3a-1 and 3a-2, the processor may get two processing task control programs started parallelly to deal with the situation. The processors (B) 4 and (C) 5 may each have a plurality of processing task control programs activated in parallel to address as many cassettes 2 as may be housed in the front buffer 4b, back buffer 4c and buffer 5b.

The above description has dealt with the typical conventional automatic control programs residing in the processors 3, 4 and 5 as well as the related processing task control programs. What follows is a description of a conventional host program which, paired with these programs, controls semiconductor wafer supply (known as "pull") whereby the host 12 supplies unprocessed cassettes 2 to the processors 3, 4 and 5 in preparation for processing. The moniker "pull" signifies that unprocessed cassettes 2 are "pulled" in for processing as requested by the processors 3, 4 and 5.

FIG. 39 is a flowchart of steps describing a conventional semiconductor wafer supply control (pull) program. In FIG. 39, the host 12 is first started (step 39-1). The program then starts carrying out a process of preparing a process queuing lot table for each of the processors 3, 4 and 5, i.e., a list of cassettes 2 to be processed next (step 39-2). Depending on the status of the processors 3, 4 and 5, the program performs a process of selecting cassettes from the process queuing lot table and of setting up the selected cassettes ready for transport (step 39-3). The selected cassettes are then transported (step 39-4). Finally, the program performs a process of causing the processors 3, 4 and 5 actually to process the cassettes 2 (step 39-5). The semiconductor wafer supply control (pull) program is then terminated (step 39-6).

FIG. 40 is a flowchart of steps describing a conventional process queuing lot table preparation program. The process queuing lot table preparation program, held in the host 12, is started in step 39-2 of the above-described pull program (step 40-1 in FIG. 40). Each cassette 2 whose processing has been terminated is transported to the nearest stocker 8 or 10 of the processor in question. A check is made to see if the transport and storage of the cassette are completed (step 40-2). With the cassette 2 found to be placed into the stocker 8 or 10, the host 12 gets from the input means 12b the manufacturing criteria regarding the input cassette 2 and the wafers 1 therein, and determines the processor 3, 4 or 5 that will proceed to the next process. The host 12 prepares data by which to write to the process queuing lot table the cassette 2 to be processed by the processor 3, 4 or 5 (step 40-3), and writes the prepared data to the process queuing lot table (step 40-4). The process queuing lot table is a table that records cassettes 2 to be processed in a queue by the processors 3, 4 and 5. More specifically, the table comprises IDs of the recorded cassettes, their current locations (in-process sites), and a prioritized order in which the recorded cassettes are to be processed.

After the write operation above, a check is made to see if any interruption has occurred (step 40-5). If there is no interruption, step 40-2 is reached again in which completion of cassette transport to the stocker 8 or 10 is awaited. If an interruption is detected, the process queuing lot table preparation program is brought to an end (step 40-6). FIG. 56 is a view of a conventional process queuing lot table.

As illustrated, the table of FIG. 56 comprises the IDs of the recorded cassettes 2, in-process site data indicating where each cassette 2 is currently located (in processor 3, 4 or 5; stocker 8 or 10, etc.), and the priority for each cassette to be processed. The table of FIG. 56 is prepared based on the example of FIG. 11. Because the D cassette 2 is not located in the stocker 8 or 10, it is not recorded in the process queuing lot table.

FIG. 41 is a flowchart of steps describing a conventional transport task preparation program. The transport task preparation program residing in the host 12 is started in step 39-3 of the above-mentioned pull program (step 41-1 in FIG. 41). The program checks to see if time is up repeatedly on a timer provided in the host 12 for each of the processors 3, 4 and 5. If time-up has yet to be detected, the program receives a cassette request sent either from step 37-3 of the automatic control program of the processor 3, 4 or 5 in FIG. 37, or from step 38-5 of the corresponding processing task control program in FIG. 38 (step 41-3). If no cassette request is received yet, a check is made to see if a process complete report is received from step 38-4 of the processing task control program in FIG. 38 (step 41-4). Following any one of these steps, a check is made to see if there is no preceding in-process cassette 2 moving towards the stage 3a, 4a or 5a of the processor 3, 4 or 5 in question (step 41-5).

If there exists a preceding cassette 2 being transported, step 41-2 is reached again because the process of transporting a new cassette 2 cannot be started. If no preceding cassette 2 is detected in step 41-5, the process queuing lot table of FIG. 56 is read in (step 41-6). The contents of the process queuing lot table are rearranged so that the cassette entries therein will occur in order of decreasing precedence (step 41-7). A search is made through the table for the cassette 2 located in the nearest bay stocker 8 of the processor 3, 4 or 5 in question (step 41-8). Through the search, a check is made to see if the applicable cassette 2 exists in the table (step 41-9). If the applicable cassette 2 is judged to be absent, step 41-2 is reached again. If the applicable cassette 2 is detected in the table, reserve flags are turned on so that no other cassette 2 will be headed towards the stage 3*a*, 4*a* or 5*a* of the processor 3, 4 or 5 (step 41-10). Thereafter, transport task data about the cassette 2 is prepared (step 41-11), and the data is written to a transport task queuing table (step 41-12).

With the data write operation completed, a check is made to see if any interruption has occurred (step 41-13). If no interruption is detected, step 41-2 is reached again. If an interruption has occurred, the transport task preparation program is terminated (step 41-14). In the typical process queuing lot table of FIG. 56, the rearrangement of cassettes 2 in terms of priority, performed in step 41-7, is shown being completed. The search through the process queuing lot table is made for the cassette 2 in the nearest bay stocker 8-12 of the processor 3-12 (step 41-8). The A cassette 2 is selected as the applicable cassette and the transport task data is prepared accordingly (step 41-11). The prepared data is written to the transport task queuing table (step 41-12). FIG. 57 is a view of a conventional transport task queuing table into which such an entry has been made.

As shown in FIG. 57, the transport task queuing table typically comprises ID data about cassettes 2, transport source data indicating in-process sites where the cassettes 2 are currently located, and transport destination data denoting locations to which the cassettes 2 are transported. Generally, unprocessed cassettes 2 are stored temporarily in the nearest bay stocker 8 of the processor 3, 4 or 5 in question. In step 41-8 above, the cassette 2 to be processed next is selected from the nearest stocker 8 because of consideration for the time of transport from the stocker to the processor 3, 4 or 5. A prolonged transport time signifies an increased idle time that elapses from the time the processor 3, 4 or 5 completed its processing and has sent out the cassette 2 containing the processed semiconductor wafers, until the cassette 2 to be processed next is accepted. The growing idle time lowers the availability of the processors correspondingly.

The processor (A) 3 will now be described as an example. The processor (A) 3 has two stages on which cassettes 2 transported by AGVs 7 are placed temporarily. The two cassettes 2 on the stages are processed one at a time. When processing of the first of the two cassettes is completed, the processed cassette 2 is placed back onto the initial stage and the next cassette 2 starts to be transported. At the same time, the other cassette 2 on the other stage starts to be processed. As described earlier, to eliminate the idle time of the processor requires that cassettes 2 to be processed arrive at the processor 3, 4 or 5 before processing of the second cassette is completed. That is, since the time required to transport a cassette 2 to the processor 3, 4 or 5 is limited, the cassette 2 is selected from the nearest bay stocker 8 before it is transported to the processor in question.

FIG. 42 is a flowchart of steps describing a conventional transport task execution control program. The transport task execution control program of FIG. 42 is started in step 39-4 of the semiconductor wafer supply control (pull) program (step 42-1 in FIG. 42). After being started, the program reads the transport task queuing table shown in FIG. 57 (step 42-2). A check is made to see if transport tasks are written in the table (step 42-3). If no transport task is found in the table, step 42-2 is reached again. If transport tasks are found written in the transport task queuing table, a process of performing the first transport task in the table is started by use of the transport devices (step 42-4).

When the process started in step 42-4 has ended, the data about the cassette 2 in question is deleted from the process queuing lot table. The transport task that has been started is then erased from the transport task queuing table (step 42-5). A check is made to see if any interruption has occurred (step 42-6). If no interruption is detected, step 42-2 is reached again. If an interruption is found to have occurred, the transport task execution control program is terminated (step 42-7). In the case of the transport task that heads the transport task queuing table in FIG. 57, the host 12 issues in step 42-4 instructions to the bay stocker 8-12 over the communication cable 13 specifying that the A cassette 2 held in the bay stocker 8-12 be transported to the processor (A) 3-12.

FIG. 43 is a flowchart of steps describing a conventional process control program. The process control program residing in the host 12 is started in step 39-5 of the above-described semiconductor wafer supply control (pull) program (step 43-1). When the task of transporting the cassette 2 to the stage 3*a*, 4*a* or 5*a* of the processor 3, 4 or 5 is completed, a check is made to see if a transport task complete report sent by a transport device controller is received (step 43-2). With the transport task complete report received, a check is made to see if conditions for the processor 3, 4 or 5 to start its processing are met (step 43-3). If such conditions are found to be met, the processor in question starts its processing (step 43-4). Finally, a check is made to see if any interruption has occurred (step 43-5). If no interruption has occurred, step 43-2 is reached again. If an interruption is detected, the process control program is terminated (step 43-6). Step 43-4 causes the wafers 1 in the cassette 2 having arrived to be processed by use of the automatic control program for the processor 3, 4 or 5 in FIG. 37 as well as of the corresponding processing task control program in FIG. 38.

The conventional semiconductor wafer supply control (pull) program for the host 12 has been described above. What follows is a description of a conventional transport control program residing in such transport devices as the bay stocker controller 8*x*, overflow stocker controller 10*x*, OHS controller 9*x* and AGV controller 7*x* which perform the actual transport work when activated by transport task instructions from the host 12 in step 42-4 of the transport task execution control program in FIG. 42. Also described is a typical manner in which the transport devices are controlled.

FIG. 44 is a flowchart of steps describing a conventional transport control program used by transport device controllers. In FIG. 44, the transport device controllers are first started (step 44-1). All transport device controllers are initialized and their performance is verified (step 44-2). Each controller waits for transport task instructions coming from an upstream controller (step 44-3). When such transport task instructions are received, a check is made to see if the transport device is ready and if the status of the preceding transport task is conducive to the upcoming transport work (step 44-4). After the check, a process of causing the transport device to transport the cassette is started (step 44-5). A check is then made to see if any interruption has occurred (step 44-6). If no interruption is detected, step 44-3 is reached again. If an interruption is found to have occurred, the transport task execution control program is terminated (step 44-7).

FIG. 45 is a flowchart of steps describing a conventional transport device control program residing in transport device controllers. In FIG. 45, the transport device control program is started in step 44-5 of the above-described transport control program (step 45-1). Each controller then sends a transport start report to the upstream controller that issued instructions to start transport work (step 45-2). The controller causes the corresponding transport device actually to transport the cassette (step 45-3). With the transport work completed, a transport complete report is sent to the upstream controller to which the transport start report was transmitted earlier (step 45-4). This completes the series of transport device control processes (step 45-5). The contents of the process in step 45-3 vary from one transport device controller to another as follows:

In step 45-3, the bay stocker controller 8x moves the cassette 2 from the stocker shelves 8c to the AGV port 8d using the stocker crane 8b, as instructed by the host 12. Over the communication cable 13, the bay stocker controller 8x then instructs the AGV controller 7x to transport the cassette 2 from the AGV port 8d to the stage 3a, 4a or 5a of the processor 3, 4 or 5 by use of the AGV 7. In reverse transport, as in the forward direction, the bay stocker 8x causes the cassette 2 on the stage 3a, 4a or 5a of the processor 3, 4 or 5 to be stored into the stocker shelves 8c as instructed by the host 12.

In step 45-3, as instructed by the host 12, the OHS controller 9x tells the bay stocker controller 8x or overflow stocker controller 10x over the communication cable 13 to transport the cassette 2 from the stocker shelves 8c or 10g of the stocker 8 or 10 to the OHS port 8e or to the position where the lift stage 10b is stopped on the third floor. An empty carriage 9a is then moved to the stocker 8 or 10 that acts as the source stocker. Again over the communication cable 13, the OHS controller 9x instructs the bay stocker controller 8x or overflow stocker controller 10x to load the cassette 2 from the OHS port 8e or lift stage 10b onto the carriage 9a.

The cassette-loaded carriage 9a is transported to the destination stocker 8 or 10. Upon arrival at the destination, the OHS controller 9x tells the bay stocker controller 8x or overflow stocker controller 10x over the communication cable 13 to move the cassette 2 from the carriage 9a into the stocker shelves 8c or 10g for storage. The AGV controller 7x, as described above, is instructed in step 45-3 by the bay stocker controller 8x to move cassettes 2 between the AGV port 8d of the bay stocker 8 on the one hand and the stage 3a, 4a or 5a of the processor 3, 4 or 5 on the other hand. In step 45-3, the bay stocker controller 8x performs three tasks: (1) moving the cassette 2 from the stocker shelves 8c to the OHS port 8e using the stocker crane 8b as instructed by the OHS controller 9x (as described above), (2) loading the cassette 2 from the OHS port 8e onto the carriage 8a using the loader 8a, and (3) moving the cassette 2 from the carriage 9a through the OHS port 8e into the stocker shelves 8c by use of the loader 8a and stocker crane 8b.

Also in step 45-3, the overflow stocker controller 10x acts, as with the bay stocker controller 8x, on a plurality of separate transport task instructions from the OHS controller 9x to move cassettes 2 between the stocker shelves 10g and the carriage 9a through the use of the lift 10a, feed mechanism 10d and a stocker crane 10f.

The conventional semiconductor wafer output control (push) program residing in the host 12 will now be described. Each cassette 2 that has been processed under the automatic control program for the processor 3, 4 or 5 in FIG. 37 and under the related processing task control program in FIG. 38 is transported from the processor in question to the nearest bay stocker 8 in accordance with the semiconductor wafer output control (push) program in the host 12 as well as the related programs. From the bay stocker 8, the cassette 2 is carried to the nearest stocker of the processor 3, 4 or 5 that will perform the next process of fabrication. The moniker "push" signifies that each processor 3, 4 or 5 sends out the cassette 2, not pulls it in.

FIG. 46 is a flowchart of steps describing a conventional semiconductor wafer output control (push) program for use by the host 12. In FIG. 46, the host 12 is first started (step 46-1). The program causes the host 12 to start a process of preparing a cassette withdrawal task whereby the cassette 2 whose processing by the processor 3, 4 or 5 has been completed is moved to the nearest bay stocker 8 (step 46-2). Started next is a process of preparing a cassette feed task whereby the cassette is sent to the nearest bay stocker 8 of the processor 3, 4 or 5 that will perform the next process of fabrication (step 46-3). The processes started in steps 46-2 and 46-3 cause the respective tasks to be written to the transport task queuing table. A process is then started actually to execute transport work according to the transport task queuing table thus prepared (step 46-4). This completes the series of the processes making up the program (step 46-5).

FIG. 47 is a flowchart of steps describing a conventional cassette withdrawal task preparation program. FIG. 48 is a flowchart of steps describing a conventional cassette feed task preparation program. The transport task execution control program started in step 46-4 was described above with reference to FIG. 42 and will not be described further below. In FIG. 47, the conventional cassette withdrawal task preparation program residing in the host 12 is started in step 46-2 of the semiconductor wafer output control (push) program (step 47-1). A check is made to see if a process complete report is detected regarding the cassette 2 sent from the processor 3, 4 or 5 in step 38-4 of FIG. 38 (step 47-2). With the process complete report detected, transport task data for cassette transport to the nearest bay stocker 8 of the processor 3, 4 or 5 in question is prepared (step 47-3). The data thus prepared is written to the same transport task queuing table described in connection with FIG. 41 (step 47-4). A check is then made to see if any interruption has occurred (step 47-5). If no interruption is detected, step 47-2 is reached again. If an interruption is found to have occurred, the cassette withdrawal task preparation program is terminated (step 47-6).

The transport task queuing table is shown in FIG. 57. In the example of FIG. 11, the nearest bay stocker 8 for the D cassette 2 is the stocker 8-11. When a process complete report on the D cassette 2 is received from the processor (A) 3-11, the transport source data and the transport destination data are set with "3-11" and "8-11" respectively and are written as such to the transport task queuing table.

In FIG. 48, the conventional cassette feed task preparation program residing in the host 12 is started in step 46-3 of the automatic control program (step 48-1). A check is made to see if the cassette 2 has arrived at the stocker 8 or 10 (step 48-2). With the cassette 2 found to have arrived, a check is made to see if the nearest bay stocker 8 of the processor 3, 4 or 5 that will perform the next process of fabrication on the cassette is the same as the stocker 8 or 10 at which the cassette has just arrived (step 48-3). If the cassette 2 is found to have arrived at the nearest bay stocker 8, nothing occurs and step 48-2 is reached again. If the cassette 2 has not arrived at the nearest bay stocker 8, the destination stocker 8 or 10 that serves as the nearest stocker is determined (step 48-4). Transport task data necessary for transport to the destination is prepared (step 48-5). The data thus prepared is written to the same transport task queuing table described with reference to FIG. 41 (step 48-6).

A check is then made to see if any interruption has occurred (step 48-7). If no interruption is detected, step 48-2 is reached again. If an interruption is found to have occurred, the cassette feed task preparation program is terminated (step 48-8). The transport task queuing table is shown in FIG. 57. In the example of FIG. 11, the bay stocker 8-12 turns out to be the nearest bay stocker 8 for the processor (A) 3-12 that will perform the next process of fabrication on the C cassette 2 that has arrived at the bay stocker 8-11. In that case, the bay stocker 8-12 is determined as the destination bay stocker 8 for the C cassette 2 in step 48-4. In steps 48-5 and 48-6, the transport destination data is set with "8-12" and written as such to the transport task queuing table.

If, in step 48-4, the bay stocker 8-12 is judged to be full of cassettes and have no spare room to accommodate the cassette 2, the overflow stocker 10-11 is determined as a substitute destination in place of the bay stocker 8-12. Thus in step 48-3, the B cassette 2 arrives at the overflow stocker 10-11 and not at the bay stocker 8-12. In that case, step 48-3 is followed by step 48-4 in which the bay stocker 8-12 is determined as the destination of transport. As long as the bay stocker 8-12 is full and has no room, the B cassette 2 stays put in the overflow stocker 10-11 and waits for the destination bay stocker 8-12 to become available.

FIG. 49 is a timing chart for transport tasks under a conventional transport control method used by semiconductor fabrication equipment exemplified by the processor (A) 3. At the outset, an X cassette 2 and a Y cassette 2, both unprocessed, are placed on the stages 3a-1 and 3a-2 respectively. Then the X cassette 2 starts to be processed (step 49-1). When all wafers 1 underwent the processing in the processing chamber 3c and have been returned to the original X cassette 2, the processor (A) 3 sends a process complete report to the host 12 (step 49-2). In response, the host 12 selects an appropriate Z cassette 2 stored in the bay stocker 8 and withdraws that cassette from the bay stocker 8 (step 49-8). The Z cassette 2 thus withdrawn is transported by use of the AGV 7 (step 49-9).

Having arrived at the processor (A) 3, the AGV 7 has the X cassette 2 loaded onto its empty stage 7c (step 49-13). The Z cassette 2 held during this time on the other stage 7c of the AGV 7 (step 49-10) is unloaded onto the stage 3a-1 of the processor (A) 3 (step 49-11). Informed of the arrival of the Z cassette 2 at the stag 3a-1 of the processor (A) 3 (step 49-12), the host 12 instructs the processor (A) 3 to start processing the Z cassette 2. In response, the processor (A) 3 may postpone the processing of the Z cassette 2 depending on the processing status of the Y cassette 2 (step 49-4). Thereafter the processor (A) 3 starts processing the Z cassette 2 (step 49-5).

The X cassette 2 placed on the stage 7c of the AGV 7 is transported to the bay stocker 8 (step 49-15) after the unloading of the Z cassette 2 to the processor (A) 3 has been finished (step 49-14). The X cassette 2 transported to the bay stocker 8 is stored therein, which completes the series of transport work (step 49-16). As described, with the processing of the X cassette 2 on the stage 3a-2 completed, the transport of the Z cassette 2 to the stage 3a-1 must be finished well before the processing of the Y cassette 3a-2 is complete. If the Z cassette 2 has arrived after the Y cassette 2 was processed, the processor (A) 3 remains idle for some time because it has no wafers 1 to process for the moment. The same also applies to the processors (B) 4 and (C) 3.

As described, processors may stay idle from the time the processing of one cassette is finished until the next cassette arrives under the conventional method for controlling semiconductor fabrication equipment. Such idle time is minimized traditionally by the specialized cassette transport arrangements: of the cassettes stored in the nearest stocker of a given processor, from which any cassette is transported to the processor with the shortest possible time, the cassette of the highest priority of processing is selected and forwarded to that processor for processing. Any cassette which, stored somewhere other than the nearest stocker, needs to be processed by a given processor must be first transported to the nearest stocker of the processor before being forwarded from that stocker to the processor in question. The proceedings tend to over load the transport means and to prevent any cassette to be processed urgently from getting processed immediately.

Illustratively, cassettes to be transported to a given processor for specific processing may be selected not only from the nearest stocker but also from all stockers furnished in the semiconductor wafer fabrication equipment. This arrangement should allow specifically desired cassettes to be processed in order of decreasing precedence. However, to select one at a time those cassettes stored in all stockers still requires solving the problem of how to minimize the idle time of the processors in connection with the transport task scheduling described above.

In order to minimize the idle time of the processors for higher processor availability, it is necessary to transport cassettes efficiently to each processor so that all processors will have cassettes engaged continuously therein. More specifically, by the time a given processor completes its processing of one cassette, the next cassette to be processed by that processor must have arrived there. This requires three steps: to compute the remaining process time of each processor in the semiconductor wafer fabrication equipment; to select, from among the cassettes stored in the stockers of the equipment, one cassette that may be transported to the processor in question within an expected supply time based on the computed remaining process time; and actually to transport the selected cassette to the processor. To select the cassette that may be transported within the expected supply time requires obtaining beforehand the time it will take to transport a cassette from a given stocker of the semiconductor wafer fabrication equipment to a given processor therein. Each processed cassette is placed temporarily in the nearest stocker of the processor in question before being forwarded to the nearest stocker of the immediately downstream processor that will perform the next process of fabrication on the cassette. If the nearest stocker of the downstream processor has no room to accommodate any more cassette, the cassette is stored temporarily in an overflow stocker and waits for the nearest stocker for the next process to become available. Whenever the stocker of the downstream processor becomes available and offers free space, that space is filled one by one by the cassettes queued in the overflow stocker. Thus all cassettes sent from any source stocker pass through the overflow stocker before reaching their destination. The procedure tends to overload the transport means. Furthermore, because the cassettes held in the overflow stocker are always given priority when processed, the processing of those cassettes desired to be processed urgently tends be delayed.

SUMMARY OF THE INVENTION

It is therefore an object of the present invention to provide semiconductor wafer fabrication equipment and a method for controlling the same, wherein cassettes to be transported to a given processor for specific processing are selected not from the nearest stocker of the processor in question but from all stockers furnished in the equipment, whereby processor availability is improved through reductions in the idle time of the configured processors, and whereby desired cassettes are transported efficiently and processed in order of decreasing priority.

According to one aspect of the present invention, a method for controlling semiconductor wafer fabrication equipment is provided which comprises processing means for processing semiconductor wafers; storage means for storing semiconductor wafers, the storage means being furnished corresponding to the processing means; first transport means for transporting semiconductor wafers between the processing means and the storage means; and second transport means for transporting semiconductor wafers between process regions each made up of the processing means, of the storage means and of the first transport means, the process regions being furnished as many as needed. The method comprising a semiconductor wafer supplying step and a semiconductor wafer output step.

The semiconductor wafer supplying step includes the steps of selecting semiconductor wafers to be transported to processing means on the basis of a remaining process time applicable to the processing means included in the semiconductor wafer fabrication equipment; and transporting and supplying the semiconductor wafers selected by the semiconductor wafer selecting step to the processing means.

The semiconductor wafer output step includes the steps of selecting a transport destination constituted by either processing means or storage means to which to transport the semiconductor wafers having been processed by processing means; and outputting and transporting the processed semiconductor wafers from a transport source constituted by processing means to either the processing means or the storage means selected by the transport destination selecting step in accordance with a transport control changeover code read from the processing means and the storage means furnished in the semiconductor wafer fabrication equipment.

In another aspect of the present invention, in the method for controlling semiconductor wafer fabrication equipment, the semiconductor wafer supplying step further comprises the steps of computing a remaining process time of any processing means included in the semiconductor wafer fabrication equipment; computing a predicted supply time within which to supply semiconductor wafers to the processing means in accordance with the remaining process time of the processing means; selecting semiconductor wafers that may be transported to the processing means within the predicted supply time; and transporting and supplying the semiconductor wafers selected by the semiconductor wafer selecting step to the transport destination constituted by processing means.

In another aspect of the present invention, in the method for controlling semiconductor wafer fabrication equipment, the semiconductor wafer output step includes the steps of selecting a transport destination constituted by any one of a plurality of storage means located in each of the process regions to which to transport the semiconductor wafers having been processed by processing means constituting a transport source, the destination storage means being selected in accordance with priorities assigned to the plurality of storage means each capable of accommodating the processed semiconductor wafers; and outputting and transporting the semiconductor wafers from the source processing means to the destination storage means selected by the transport destination selecting step.

According to another aspect of the present invention, the semiconductor wafer fabrication equipment comprises processing means for processing semiconductor wafers; storage means for storing semiconductor wafers, the storage means being furnished corresponding to the processing means; first transport means for transporting semiconductor wafers between the processing means and the storage means; and second transport means for transporting semiconductor wafers between process regions each made up of the processing means, of the storage means and of the first transport means, the process regions being furnished as many as needed.

The semiconductor wafer fabrication equipment further comprises a semiconductor wafer supply device and a semiconductor wafer output device.

The semiconductor wafer supply devices includes semiconductor wafer selecting means for selecting semiconductor wafers to be processed by processing means on the basis of a remaining process time applicable to the processing means included in the semiconductor wafer fabrication equipment; and transporting means for transporting the semiconductor wafers selected by the semiconductor wafer selecting means to the processing means.

The semiconductor wafer output device includes transport destination selecting means for selecting a transport destination constituted by either processing means or storage means to which to transport the semiconductor wafers having been processed by the processing means; and transporting means for transporting the processed semiconductor wafers to either the processing means or the storage means selected by the transport destination selecting means in accordance with a transport control changeover code read from the processing means and the storage means furnished in the semiconductor wafer fabrication equipment.

In another aspect of the present invention, in the semiconductor wafer fabrication equipment, the semiconductor wafer supply device further comprises remaining process time computing means for computing a remaining process time of any processing means included in the semiconductor wafer fabrication equipment; predicted supply time computing means for computing a predicted supply time within which to supply semiconductor wafers to the processing means in accordance with the remaining process time of the processing means; semiconductor wafer selecting means for selecting semiconductor wafers that may be transported to the processing means within the predicted supply time; and transporting means for transporting the semiconductor wafers selected by the semiconductor wafer selecting means.

In another aspect of the present invention, in the semiconductor wafer fabrication equipment, the semiconductor wafer output device further comprises transport destination selecting means for selecting a transport destination constituted by any one of a plurality of storage means located in each of the process regions to which to transport the semiconductor wafers having been processed by processing means constituting a transport source, the destination storage means being selected in accordance with priorities assigned to the plurality of storage means each capable of accommodating the processed semiconductor wafers; and transporting means for transporting the semiconductor wafers to the destination storage means selected by the transport destination selecting means.

Other and further objects, features and advantages of the invention will appear more fully from the following description.

BRIEF DESCRIPTION OF THE DRAWINGS

FIG. 2 is a perspective view of typical semiconductor fabrication equipment;

FIG. 52 is a view of a process queuing lot table according to the invention;

FIG. 53 is a view of a transport task queuing table according to the invention;

FIG. 54 is a view of a cassette withdrawal stocker table according to the invention;

FIG. 55 is a view of a cassette feed stocker table according to the invention;

FIG. 56 is a view of a conventional process queuing lot table; and

FIG. 57 is a view of a conventional transport task queuing table.

BEST MODE OF CARRYING OUT THE INVENTION

This invention will be described in further detail by way of examples with reference to the accompanying drawings.

First Embodiment

Figure 1A:
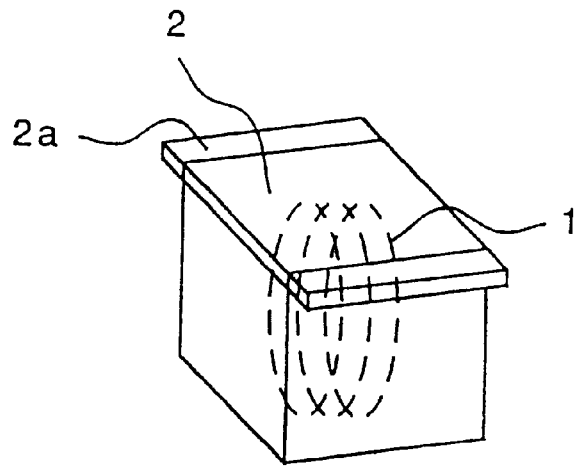
FIGS. 1A and 1B are perspective views of a cassette and semiconductor wafers contained therein.
Figure 1B:
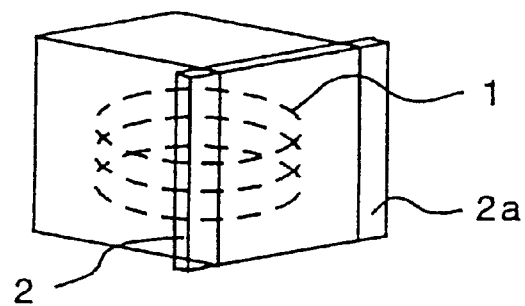
Figure 3:
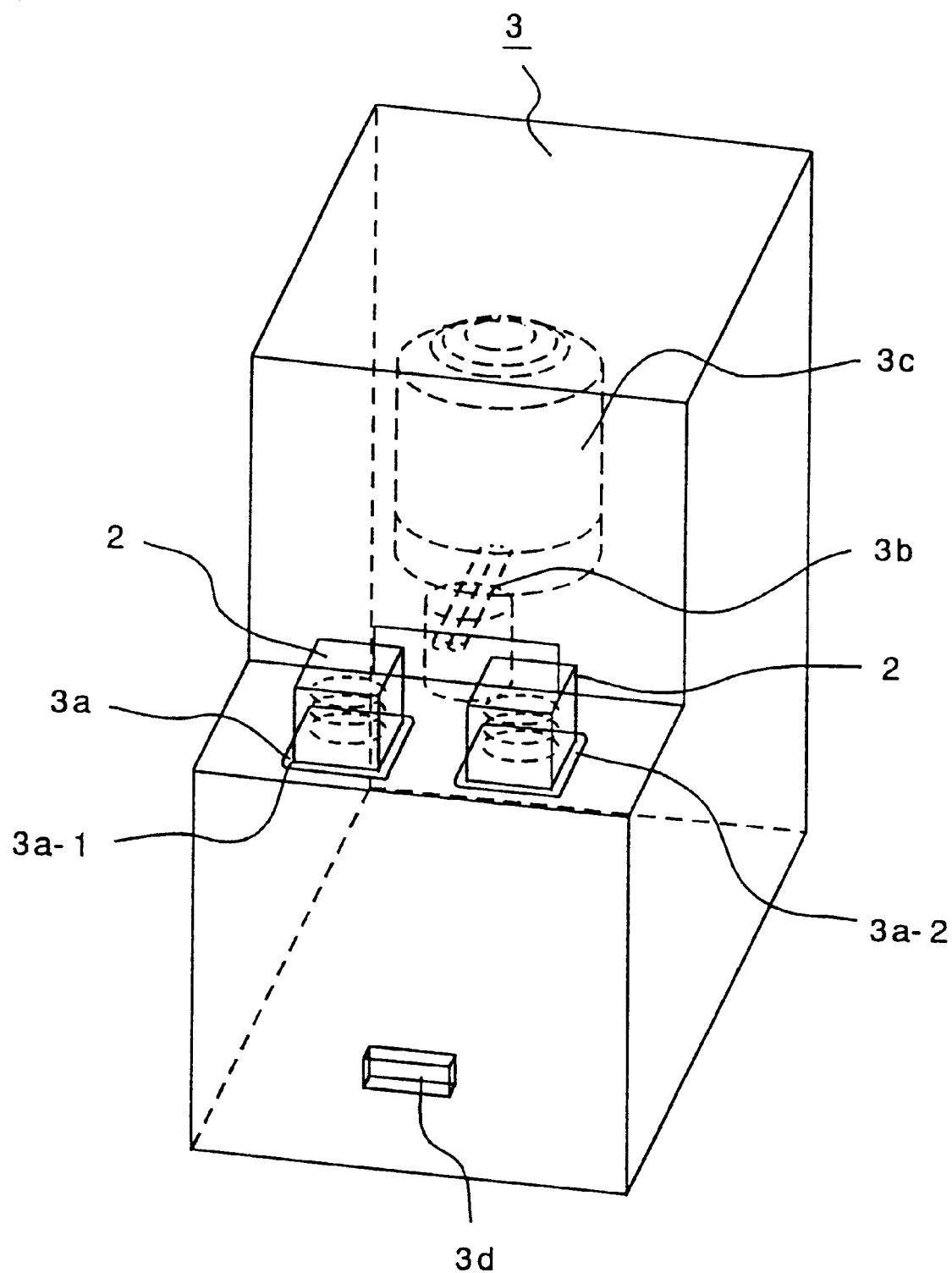
FIG. 3 is a perspective view of a processor (A), one type of processor included in the semiconductor fabrication equipment.
Figure 4:
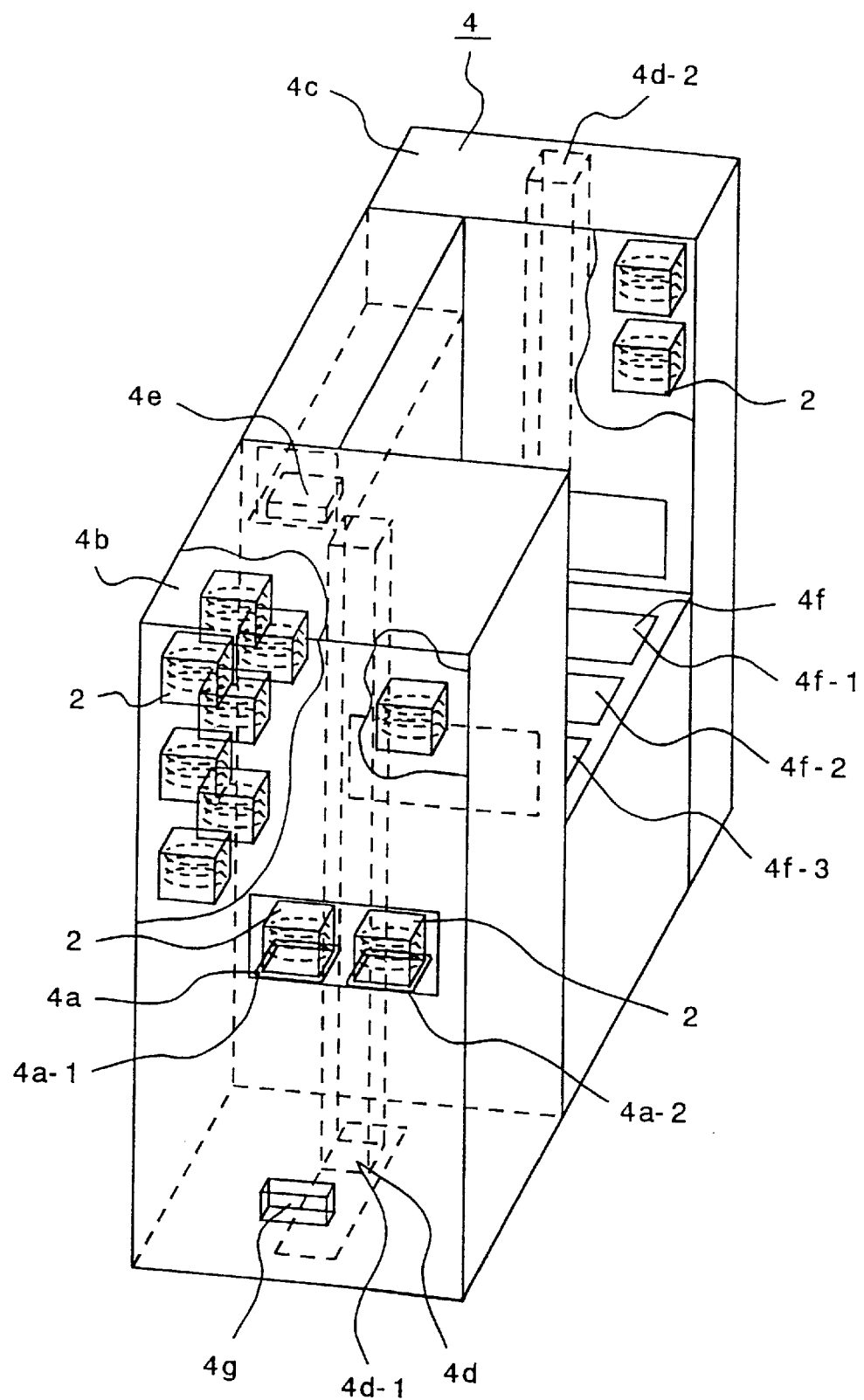
FIG. 4 is a perspective view of a processor (B), another type of processor included in the semiconductor fabrication equipment.
Figure 5:
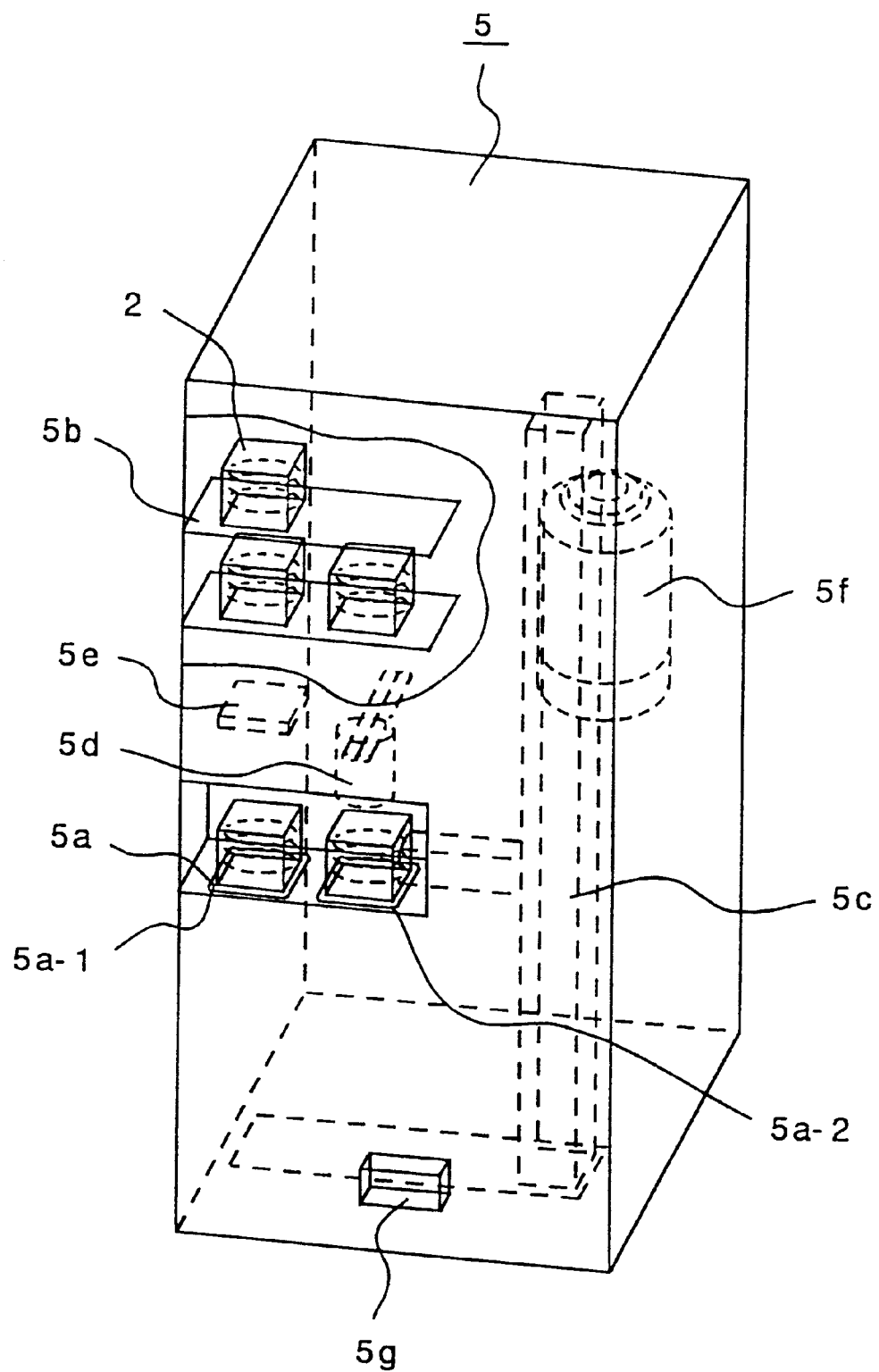
FIG. 5 is a perspective view of a processor (C), another type of processor included in the semiconductor fabrication equipment.
Figure 6:
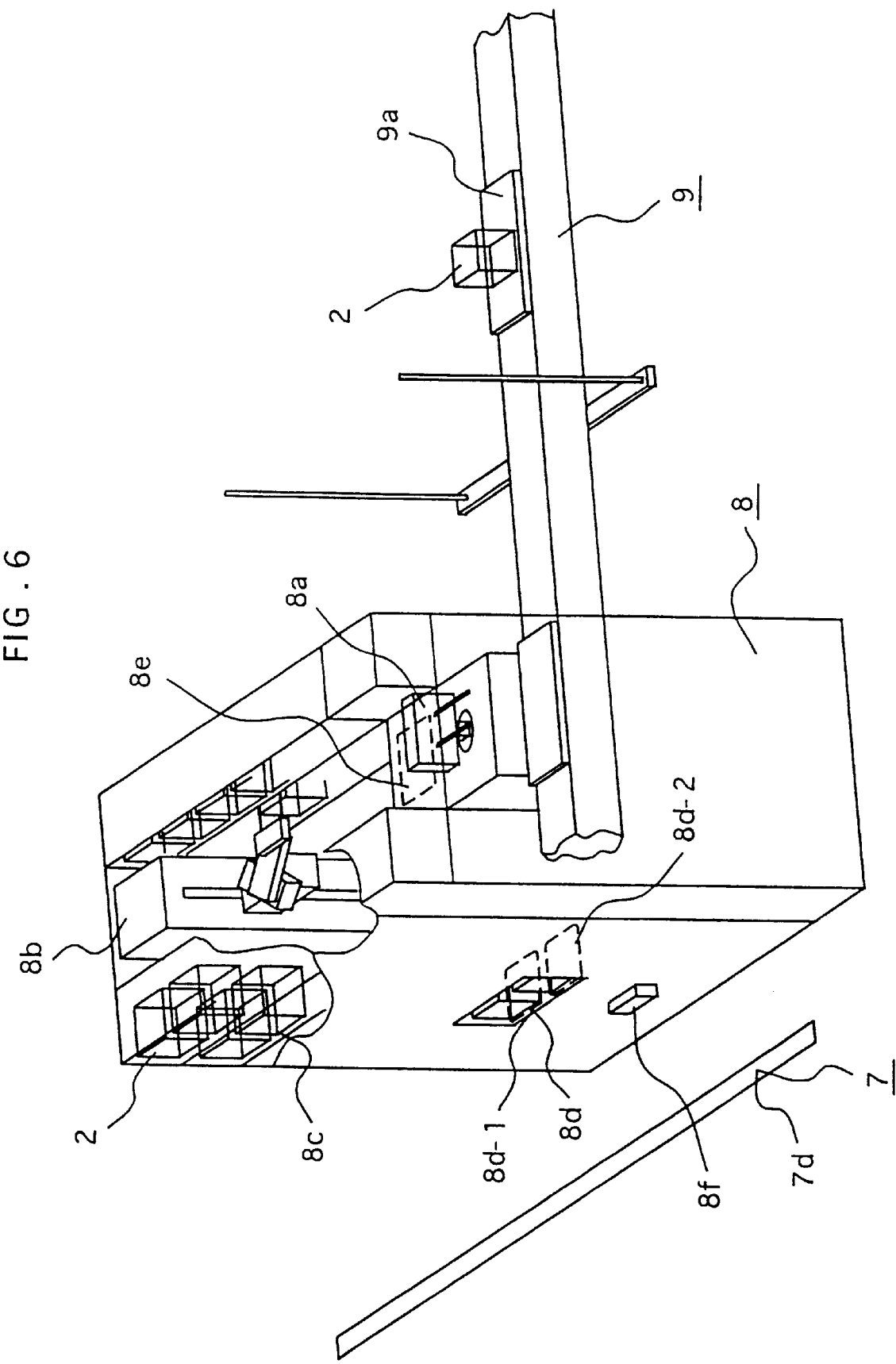
FIG. 6 is a perspective view of a bay stocker for storing semiconductor wafer cassettes in the semiconductor fabrication equipment.
Figure 7:
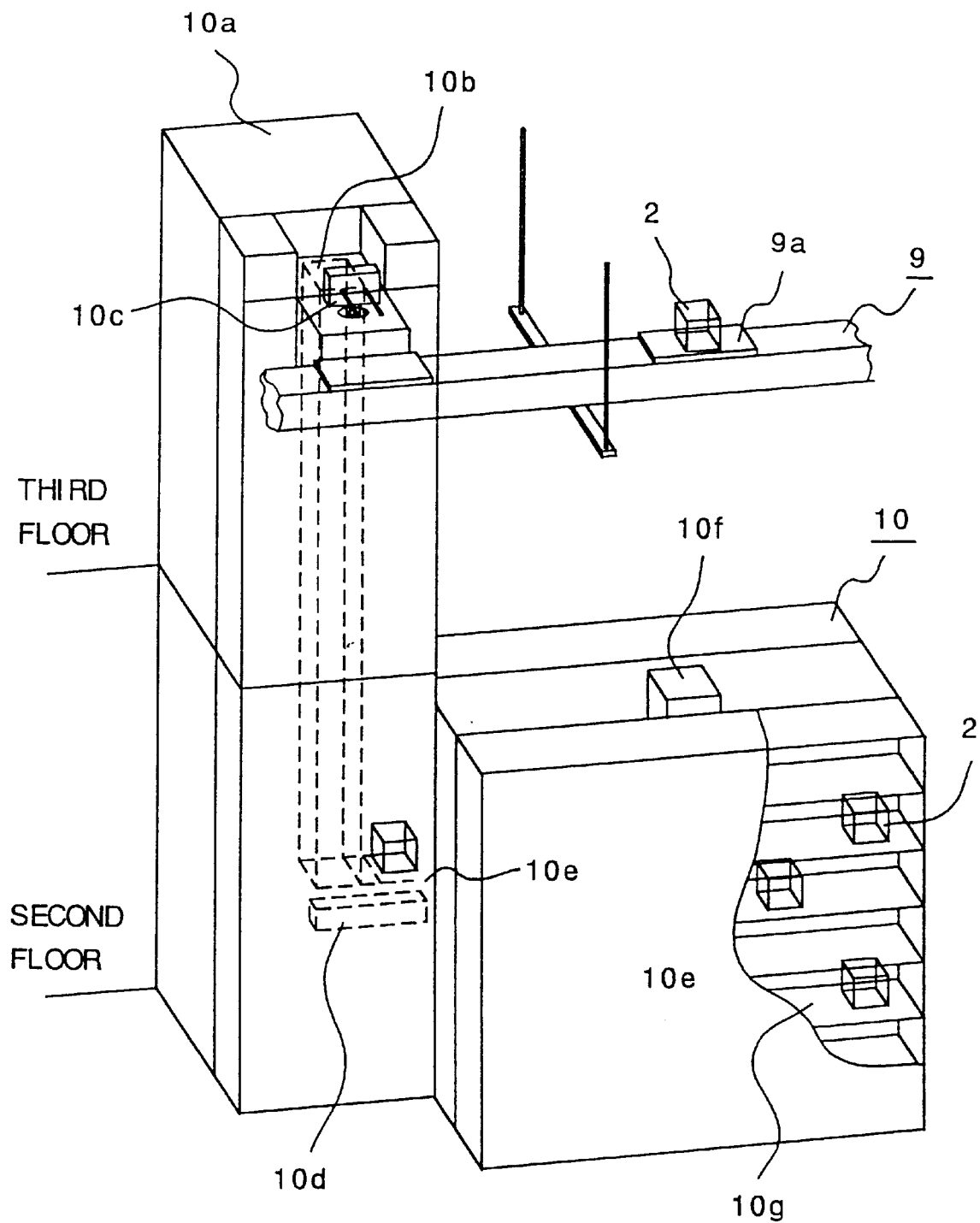
FIG. 7 is a perspective view of an overflow stocker included in the semiconductor fabrication equipment.
Figure 8:
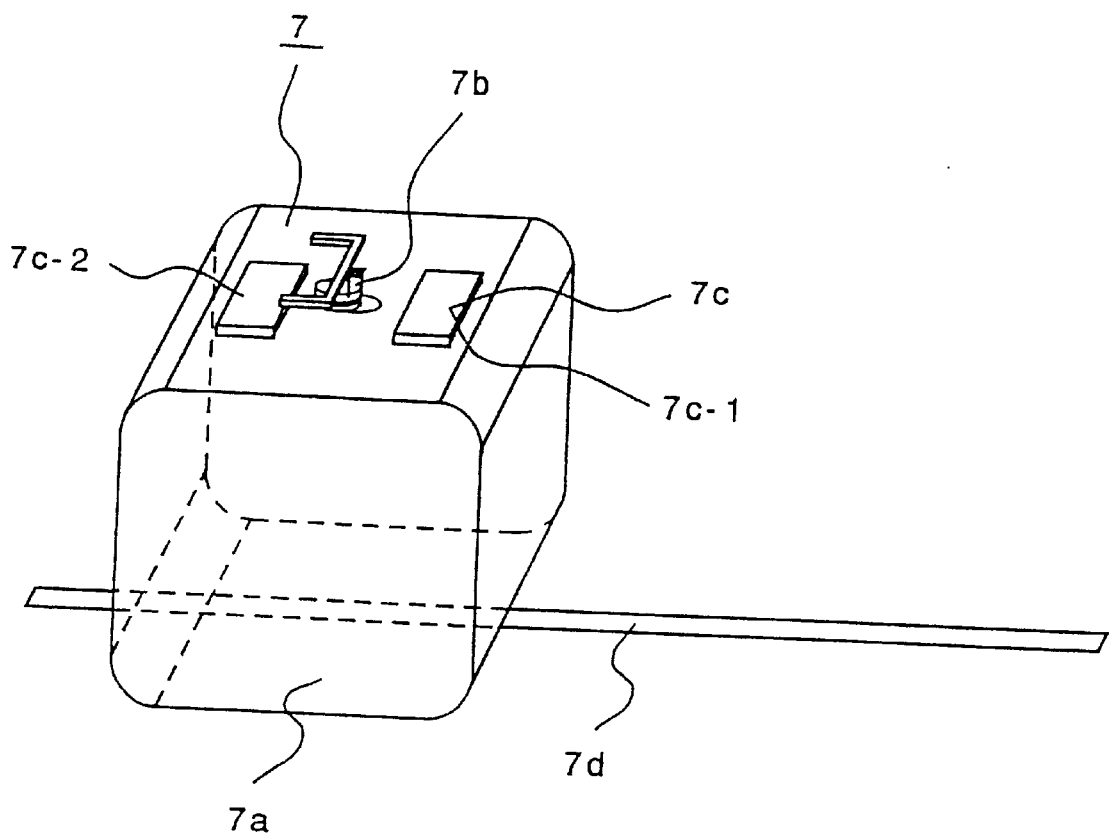
FIG. 8 is a perspective view of an automated guided vehicle (AGV) for transporting semiconductor wafers between a processor and a bay stocker.
Figure 9:
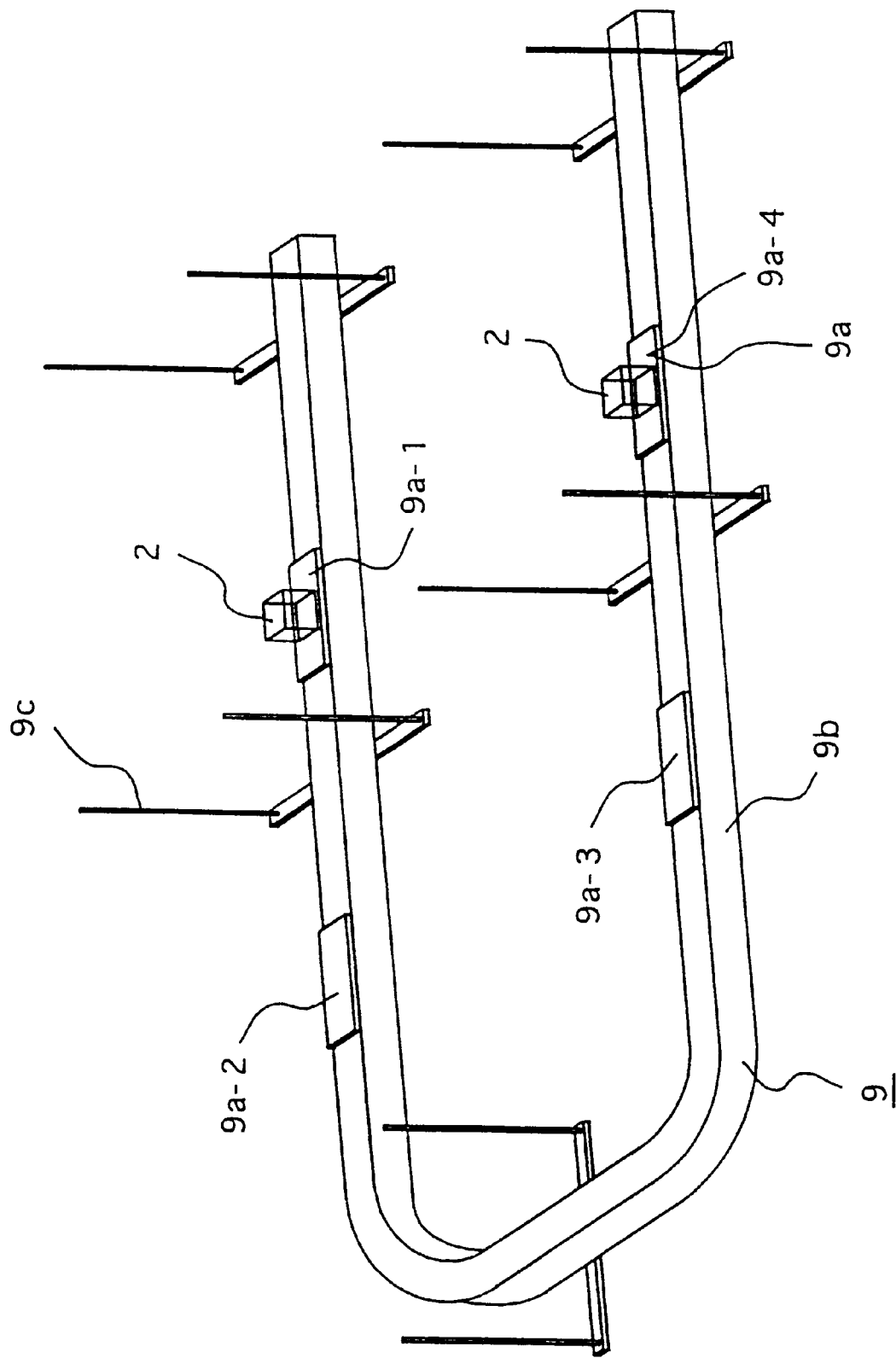
FIG. 9 is a schematic view of an overhead stocker-to-stocker transport device (OHS) for transporting semiconductor wafers between bay stockers.
Figure 10:
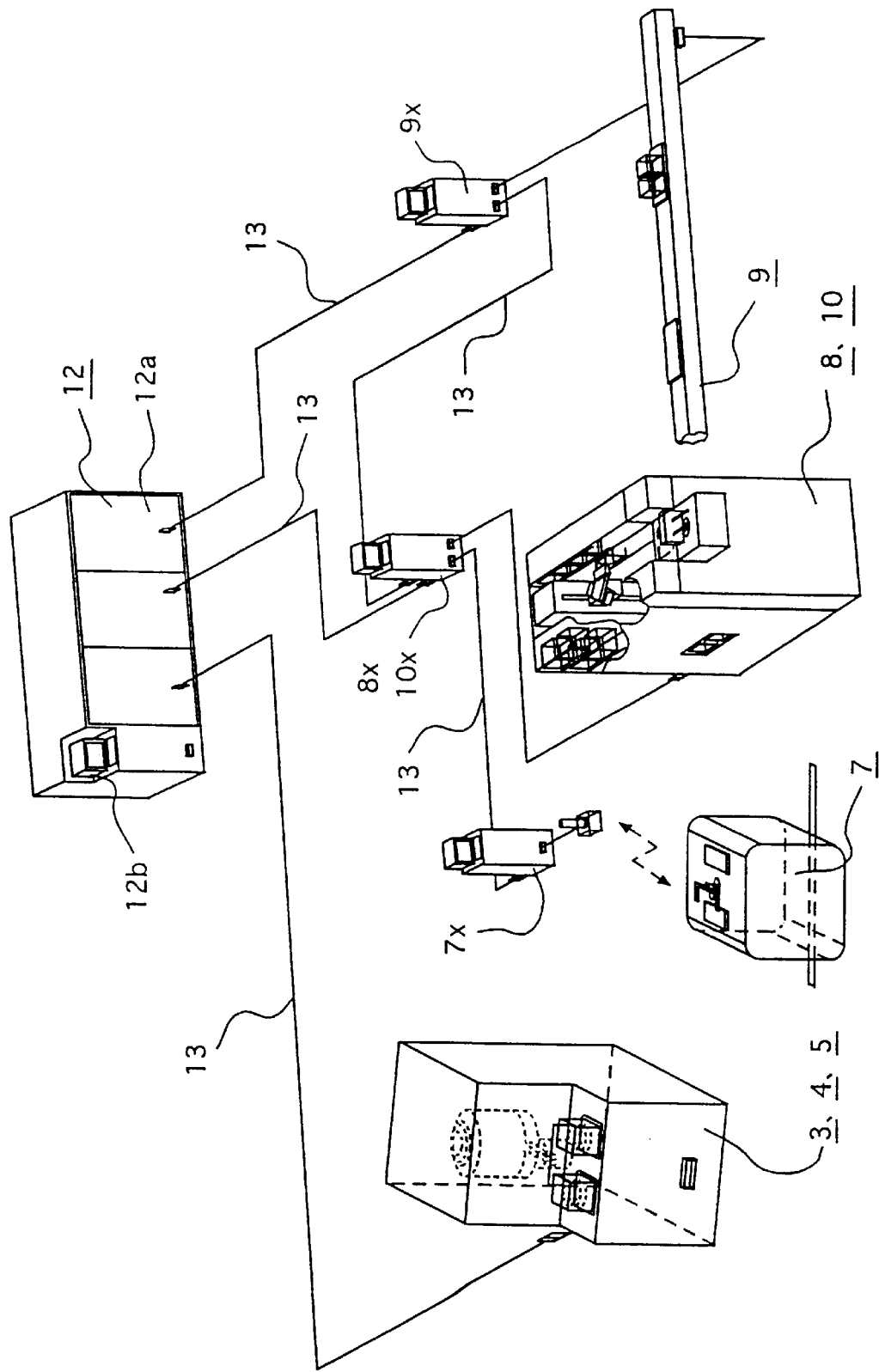
FIG. 10 is a schematic control block diagram of the semiconductor fabrication equipment.

In a first embodiment of the present invention, semiconductor wafers 1, cassettes 2, and semiconductor fabrication equipment are basically the same in structure as their conventional counterparts described earlier with reference to FIGS. 1 through 10. One difference that characterizes the first embodiment concerns the bay stocker 8 whose operation was described above in connection with FIG. 6. In the conventional example, there is no direct transport of cassettes 2 between the OHS port 8e and the AGV port 8d by the stocker crane 8b. Each cassette 2 coming from either of these ports is always stored into the stocker shelves 8c. With the first embodiment, by contrast, cassettes are transported directly between the OHS port 8e and the AGV port 8d.

The transport control method of the inventive semiconductor fabrication equipment will now be described in detail. Five major subjects will be discussed: (1) an automatic control program for the processor (A), (2) an automatic control program for the processors (B) and (C), (3) a semiconductor wafer supply control (pull) program, (4) a transport control program for transport device controllers, and (5) a semiconductor wafer output control (push) program. The description of the above subjects will proceed in the order indicated. The example of FIG. 11, intended to explain transport control aspects of the conventional semiconductor fabrication equipment in its minimal model handling in-process cassettes 2, will be used unmodified in describing the first embodiment.

Figure 12:
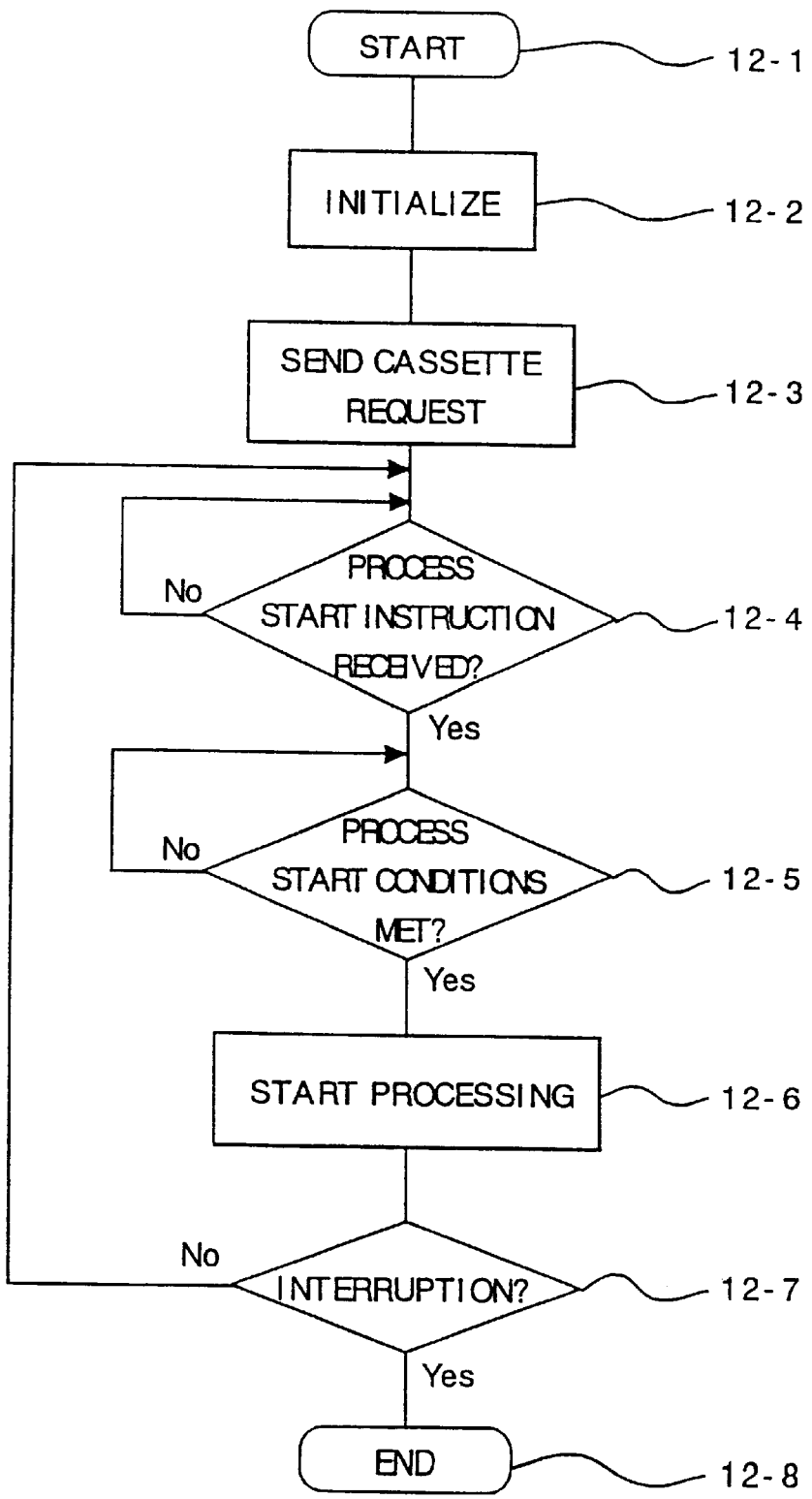
FIG. 12 is a flowchart of steps describing an automatic control program for controlling the processor (A) according to the invention.

FIG. 12 is a flowchart of steps describing an automatic control program residing in the processor (A) 3 according to the invention. In FIG. 12, the processor (A) 3 is started first (step 12-1). All processor components are initialized and their performance is verified (step 12-2). When ready for processing, the processor (A) 3 sends a cassette request to the host 12 (step 12-3) and waits for a process start instruction coming from the host 12 (step 12-4). With a process start instruction received from the host 12, a check is made to see if a cassette 2 is found on the stage 3a and, where another cassette is already in processing, if the status of the preceding process is conducive to the upcoming process (step 12-5). With the starting conditions found to be met, the processor (A) 3 starts its processing (step 12-6).

Figure 37:
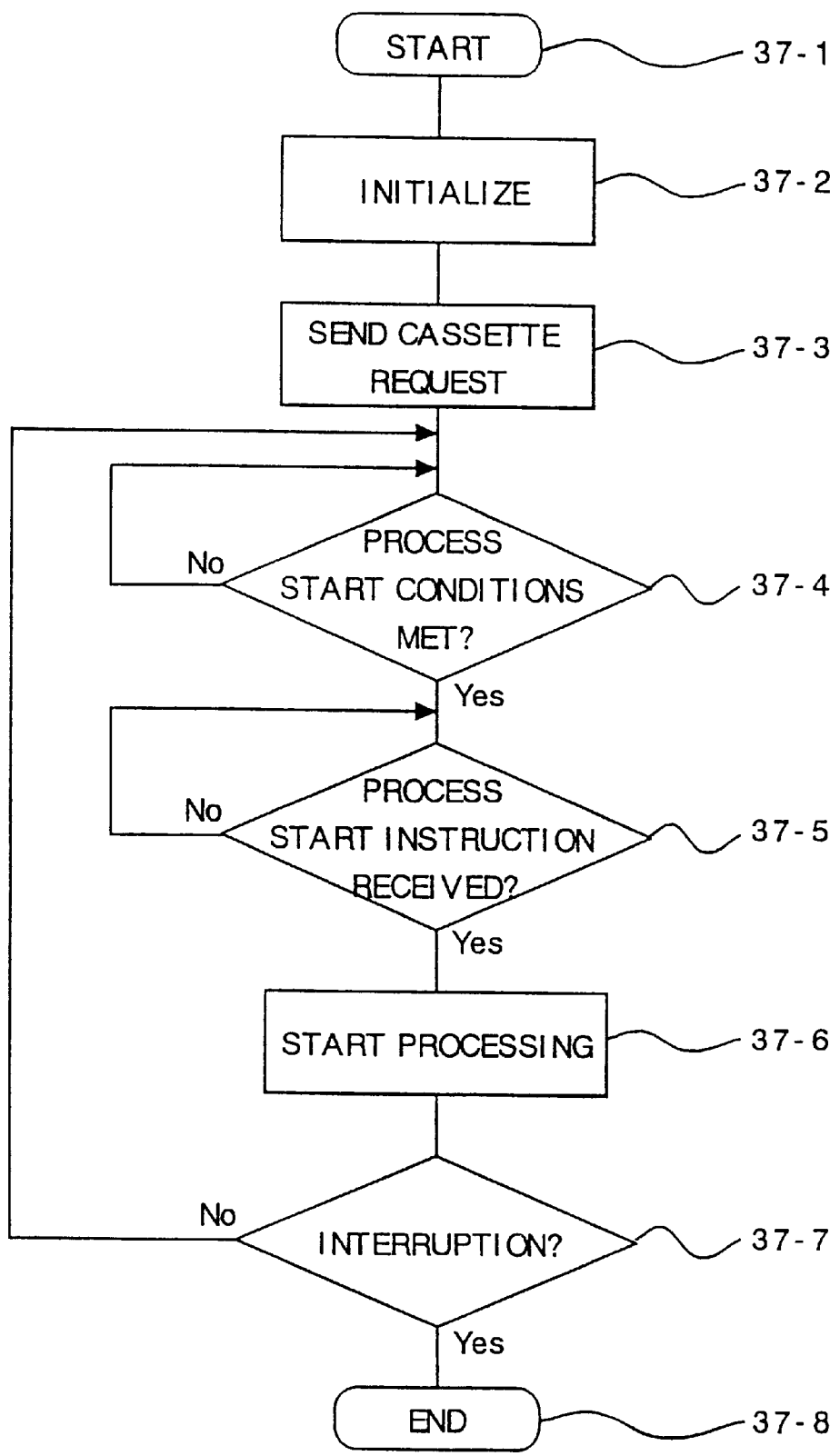
FIG. 37 is a flowchart of steps describing a conventional automatic control program for the processors (A), (B) and (C)

After the processing is started, a check is made to see if any interruption has occurred (step 12-7). If no interruption is detected, step 12-4 is reached again in which a process start instruction from the host 12 is awaited. If an interruption is found to have occurred, this automatic control program is terminated (step 12-8). The steps so far are the same as those of the conventional automatic control program for the processors (A), (B) and (C) described with reference to FIG. 37, except for the contents of a processing task control program activated in step 12-6.

Figure 13:
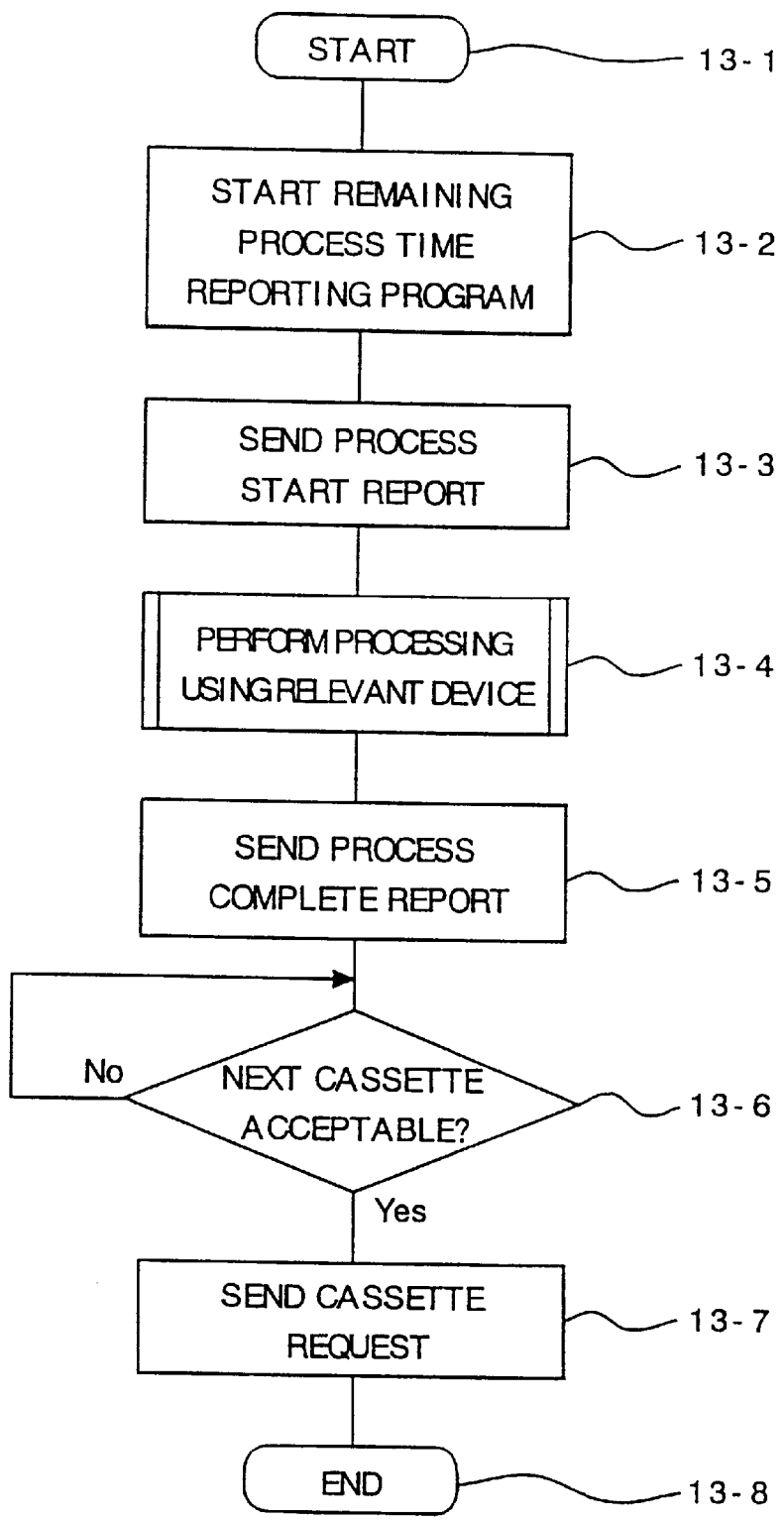
FIG. 13 is a flowchart of steps describing a processing task control program according to the invention.

FIG. 13 is a flowchart of steps describing the inventive processing task control program started in step 12-6. The processing task control program residing in the processor (A) 3, when made active in step 12-6 (step 13-1), initiates a remaining process time reporting program (step 13-2). A process start report is sent to the host 12 (step 13-3). The wafers 1 are then actually processed by the processor components (step 13-4). More specifically, step 13-4 involves using the wafer transport robot 3b to extract the wafers 1 from the cassette 2 that stays put on the stage 3a, the extracted wafers being transferred consecutively into the processing chamber 3c for processing. When the above series of steps is complete, a process complete report is sent to the host 12 (step 13-5).

Figure 38:
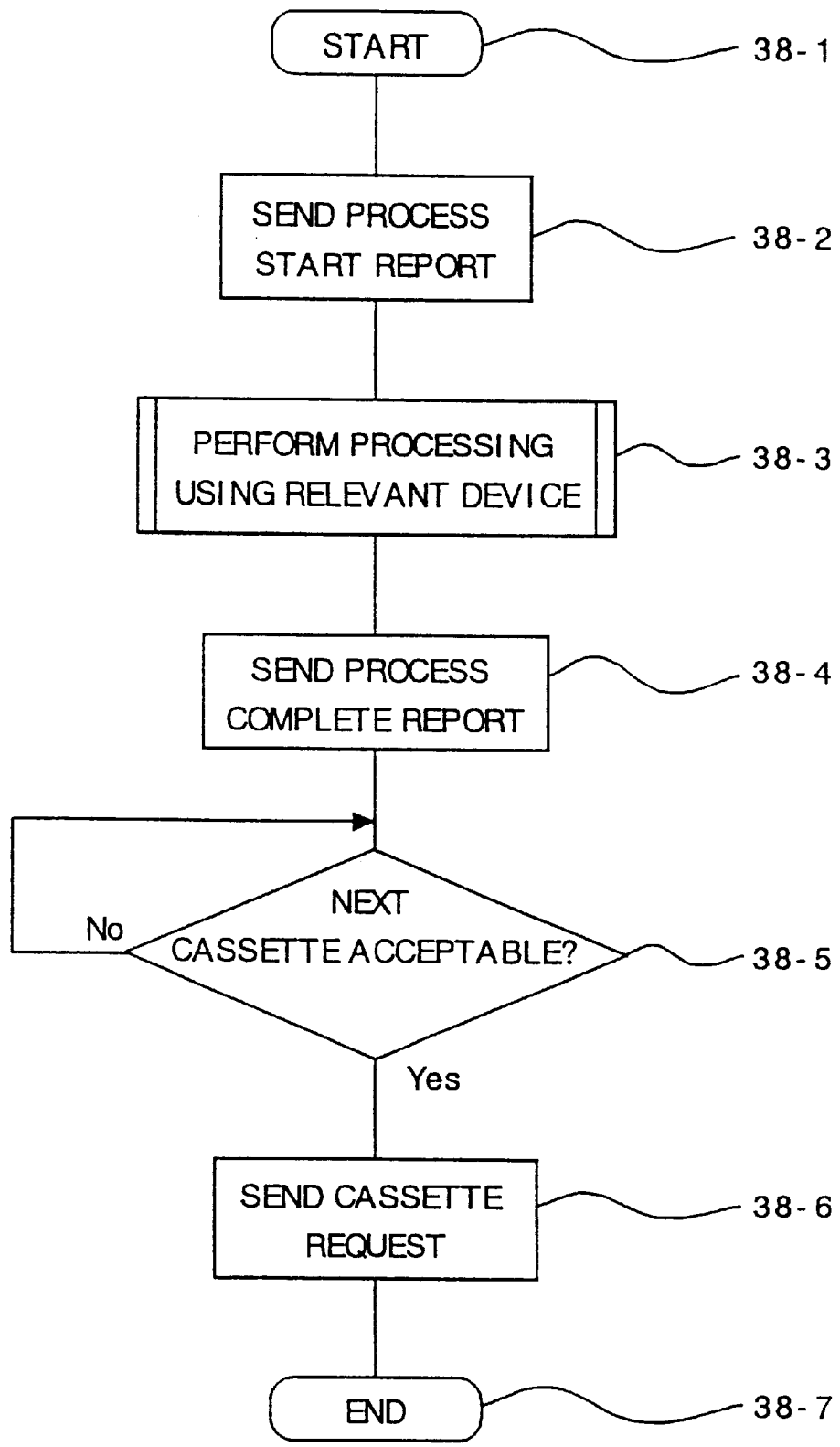
FIG. 38 is a flowchart of steps describing a conventional processing task control program.
Figure 39:
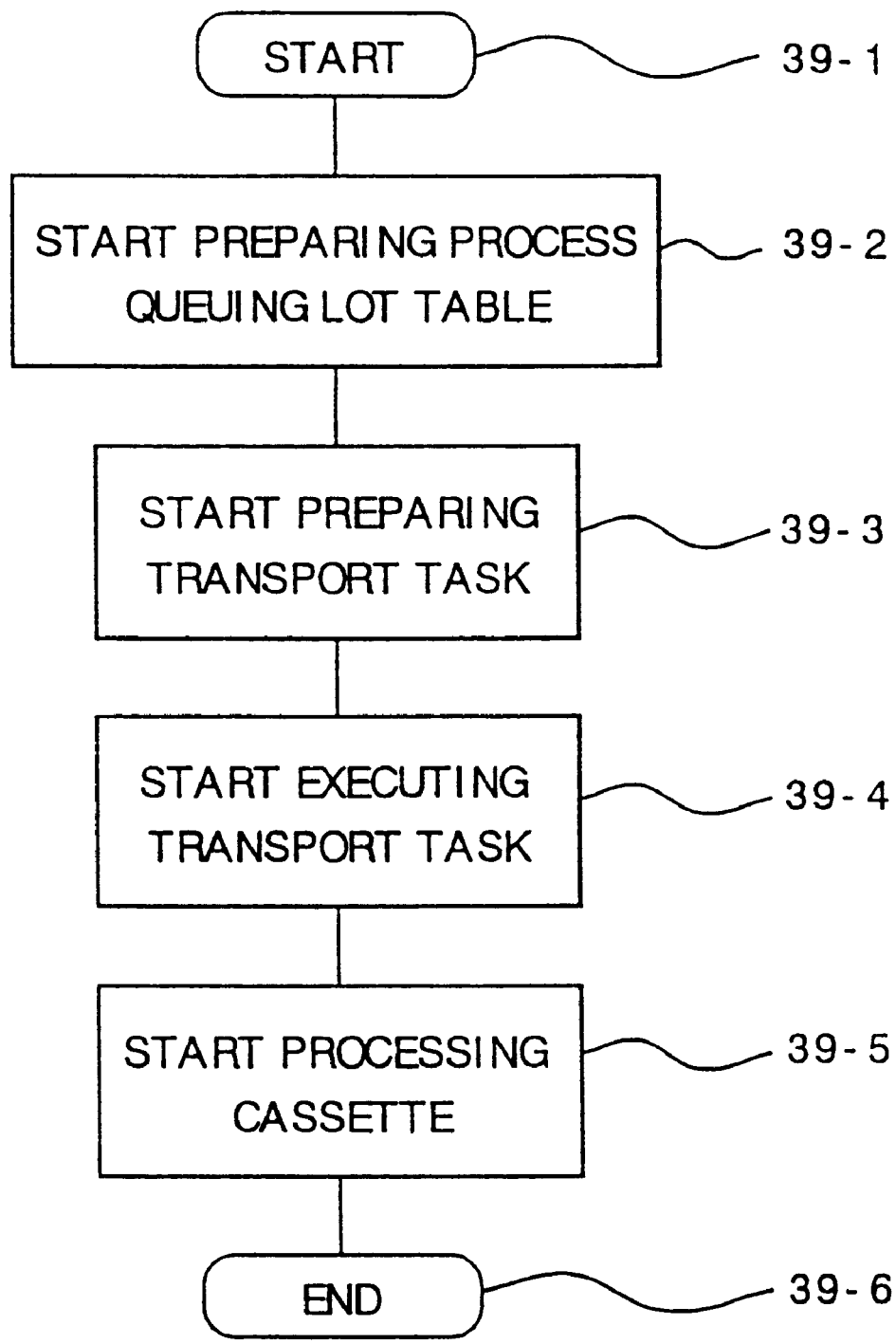
FIG. 39 is a flowchart of steps describing a conventional semiconductor wafer supply control (pull) program.
Figure 40:
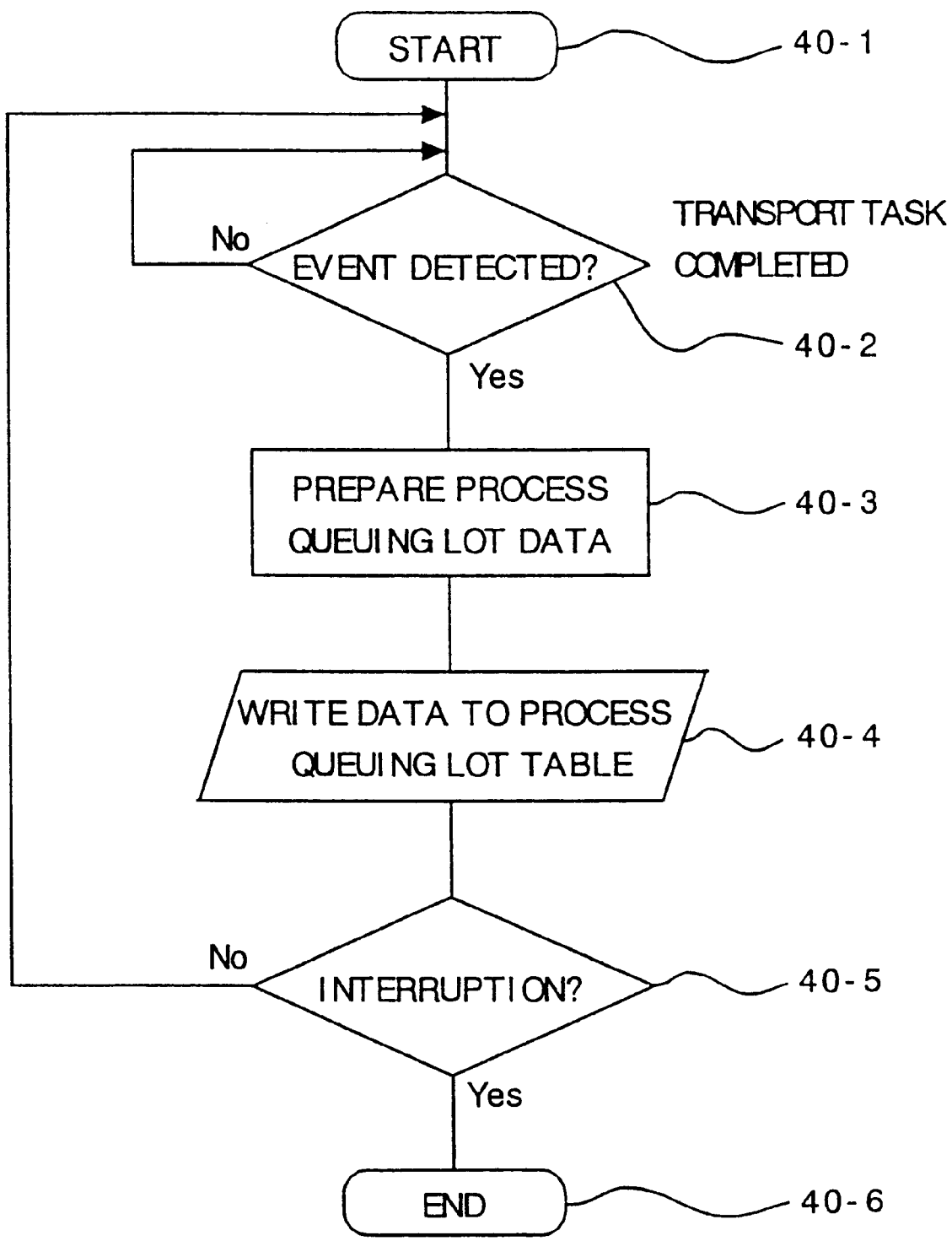
FIG. 40 is a flowchart of steps describing a conventional process queuing lot table preparation program.
Figure 41:
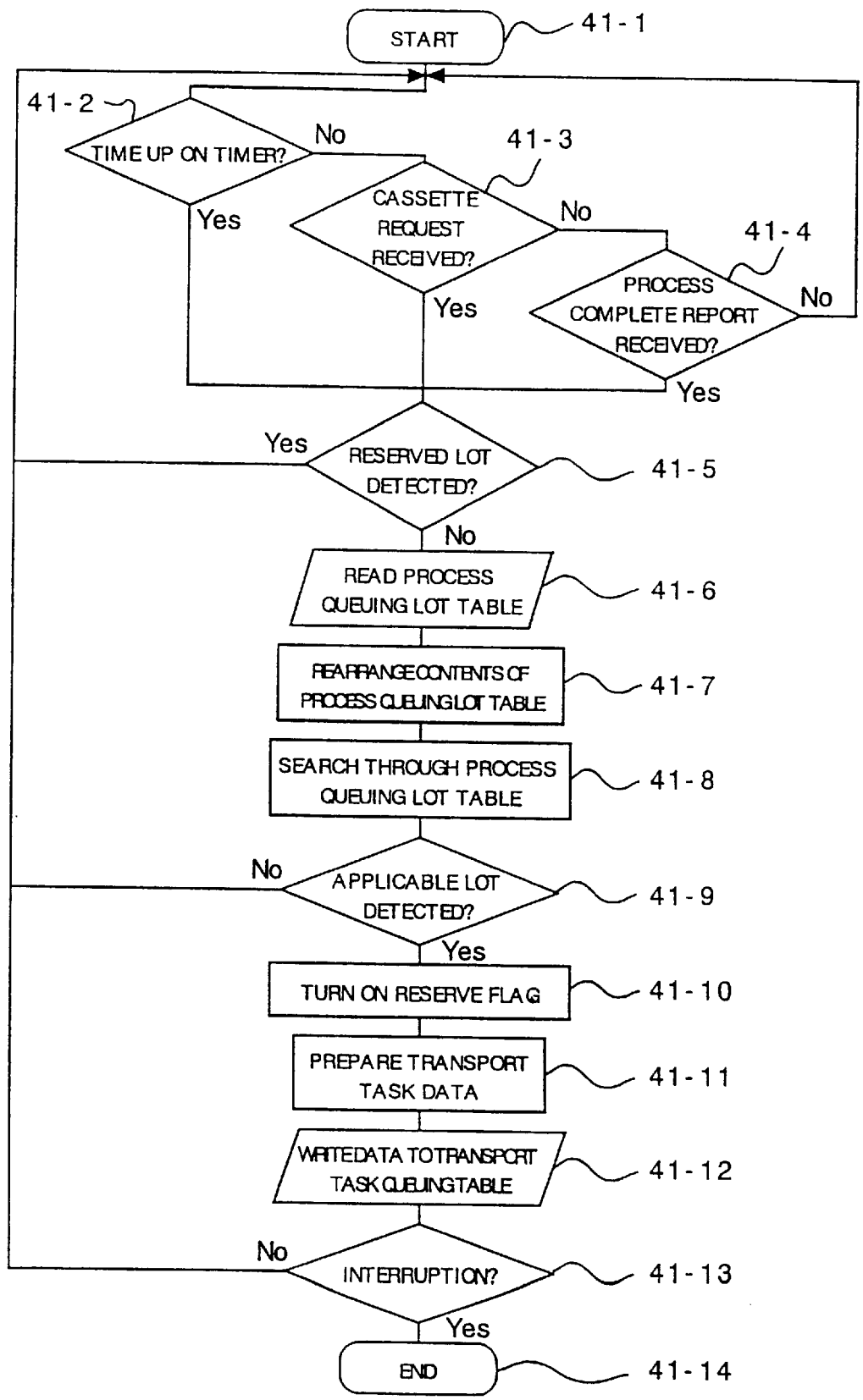
FIG. 41 is a flowchart of steps describing a conventional transport task preparation program.
Figure 42:
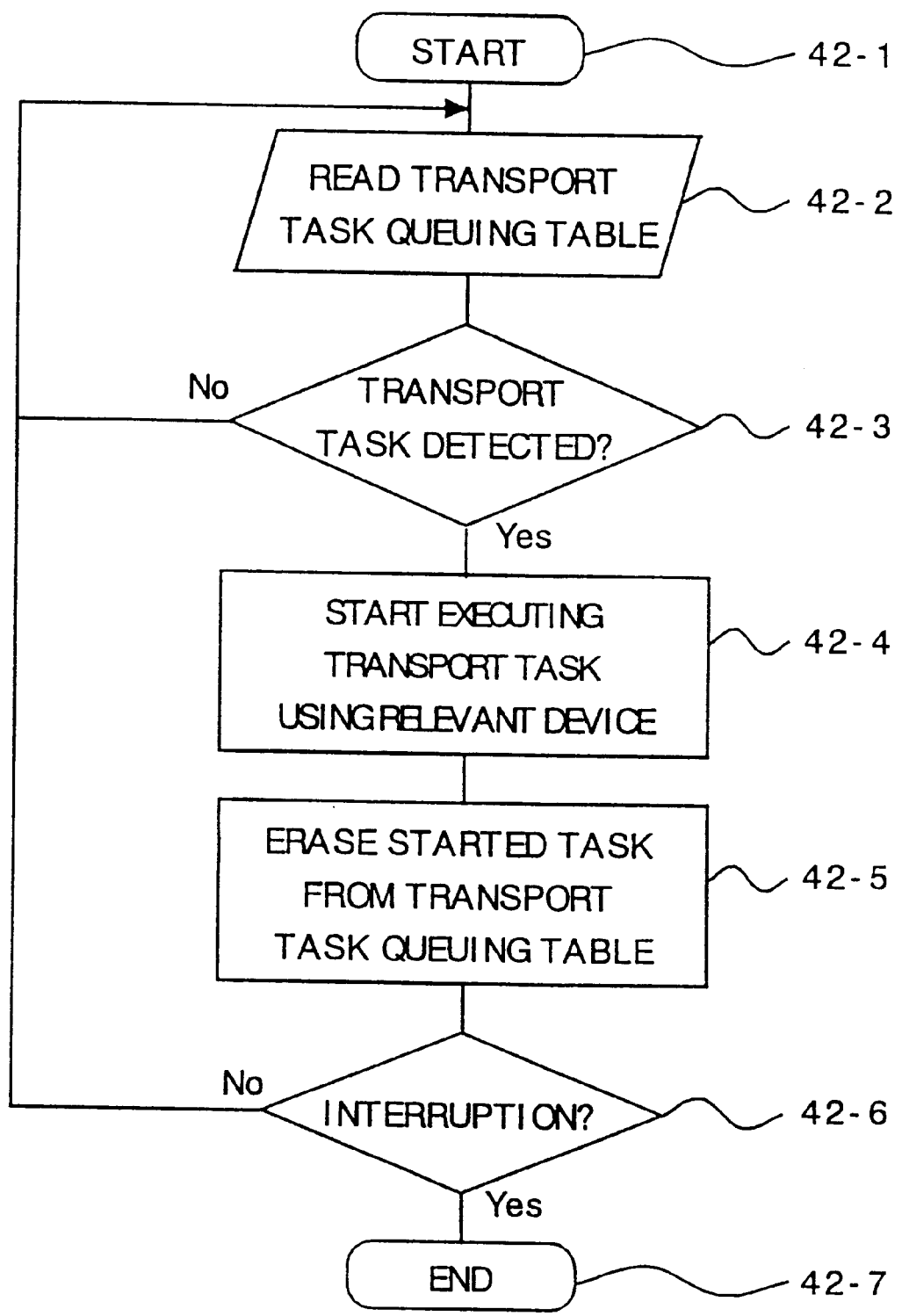
FIG. 42 is a flowchart of steps describing a conventional transport task control program.
Figure 43:
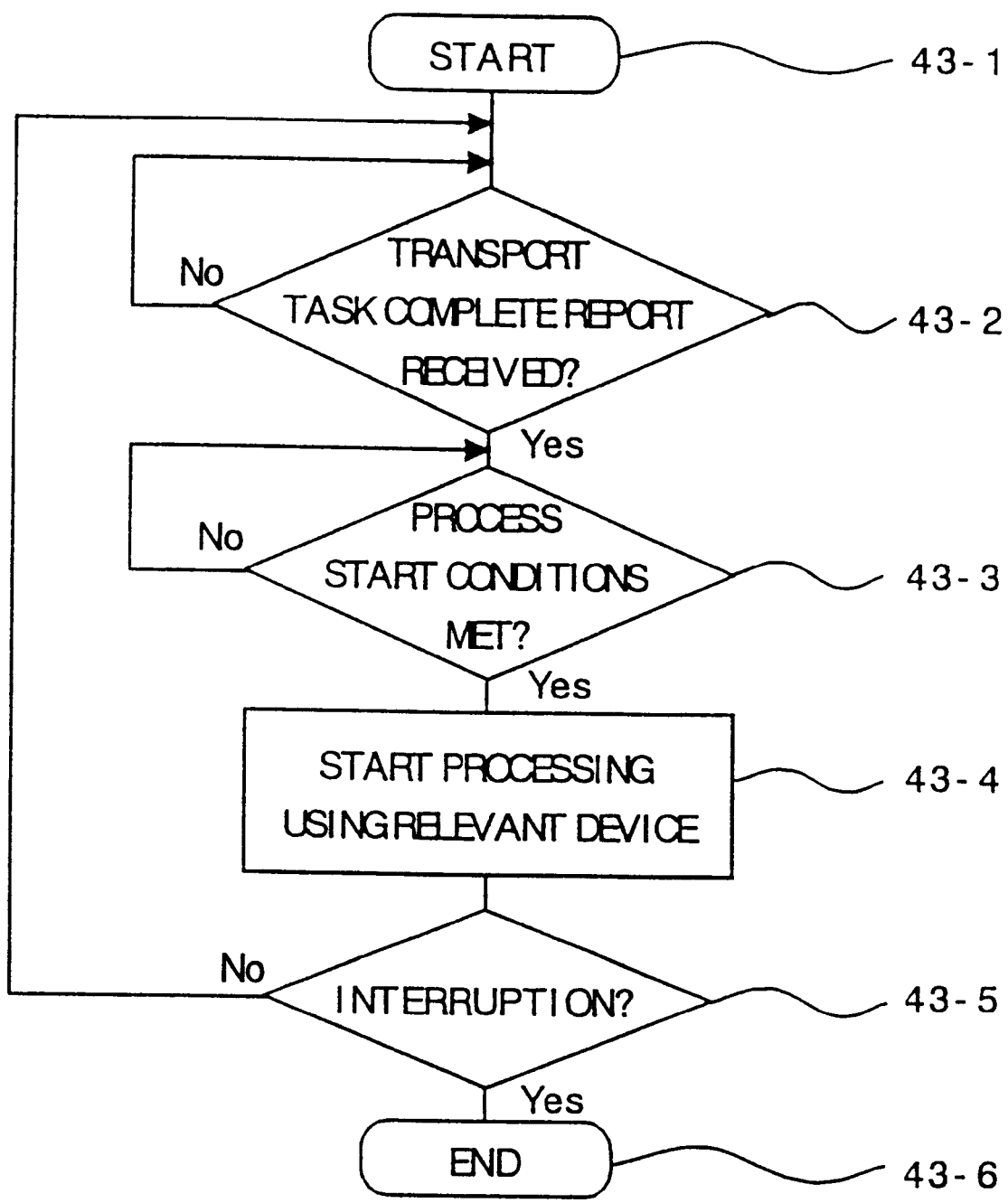
FIG. 43 is a flowchart of steps describing a conventional process control program.
Figure 44:
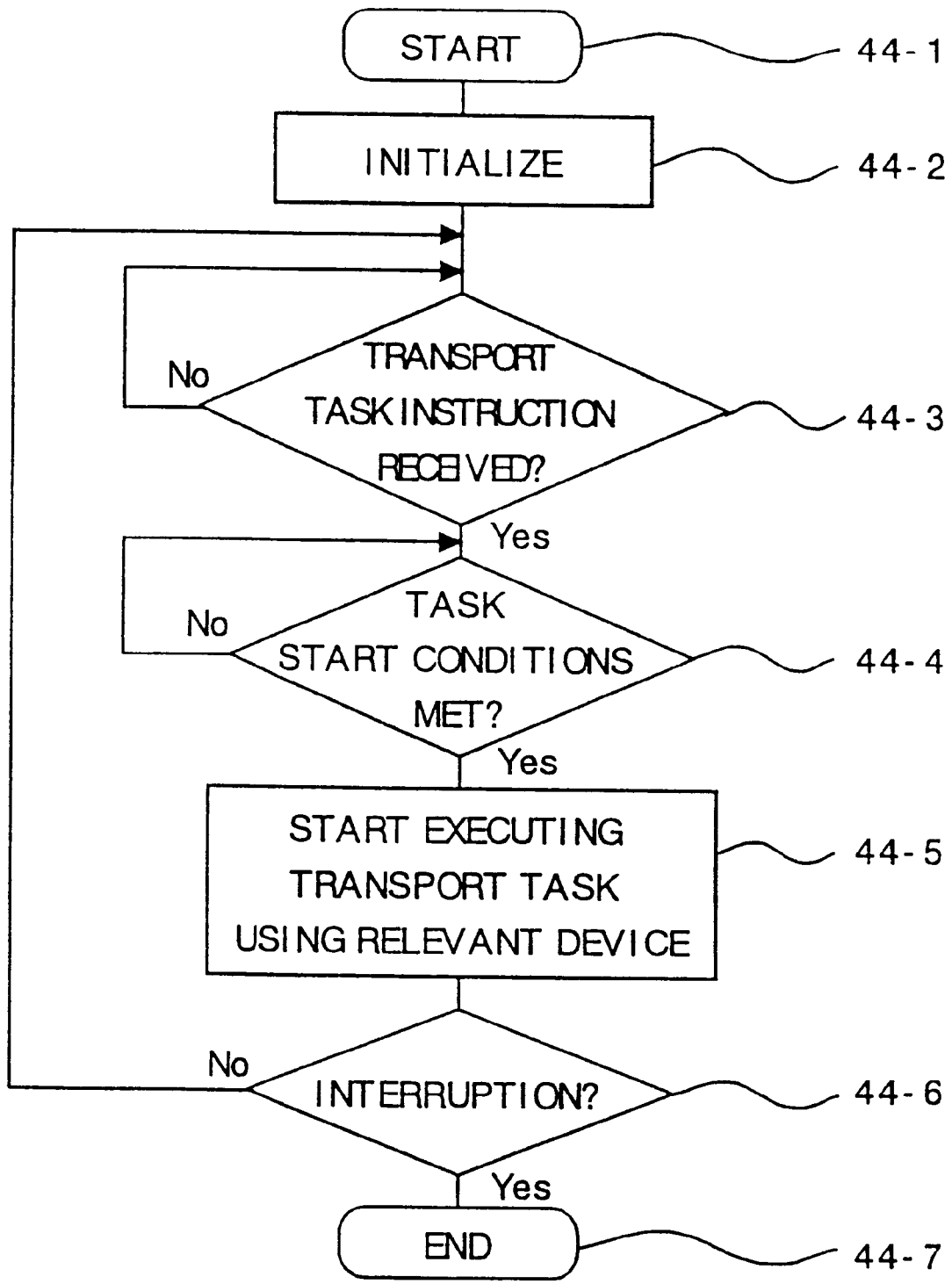
FIG. 44 is a flowchart of steps describing a conventional transport control program for transport device controllers.

The cassette 2 whose processing was completed is removed from the stage 3a by the host 12 using the AGV 7. At this point, the removal of the cassette is verified by use of a cassette sensor (not shown) attached to the stage 3a so as to determine whether the next cassette 2 may be accepted (step 13-6). If it is found possible to accept the next cassette 2, a cassette request is sent to the host 12 (step 13-7), which terminates the processing task control program (step 13-8). Because the processor (A) 3 may have up to two cassettes 2 placed on the stages 3a-1 and 3a-2, two processing task control programs may be run in parallel. What makes the inventive processing task control program different from its conventional counterpart in FIG. 38 is the presence of step 13-2, i.e., a step in which the remaining process time reporting program is started. The other steps are the same for the conventional and the inventive programs.

Figure 14:
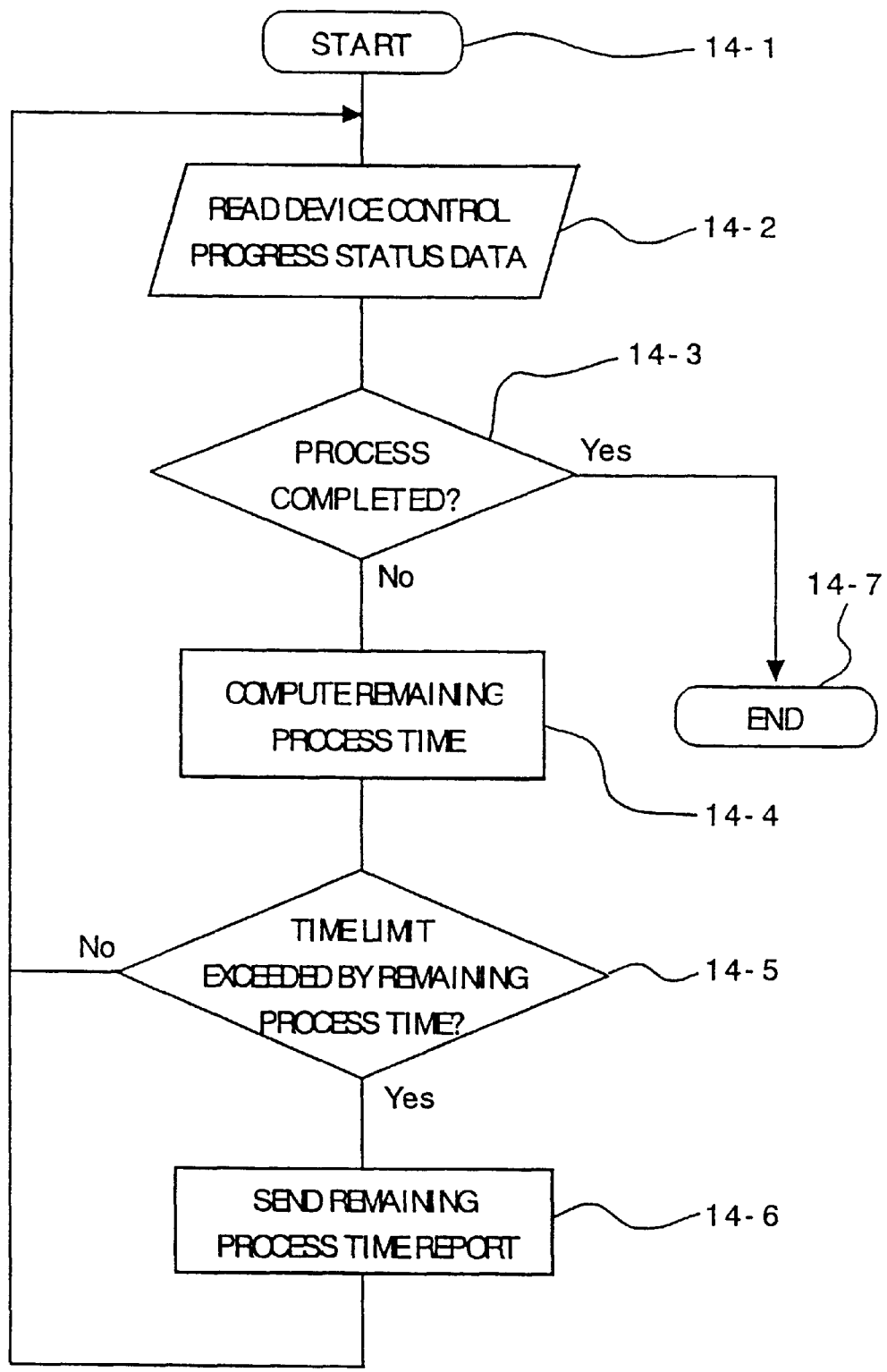
FIG. 14 is a flowchart of steps describing a remaining process time reporting program according to the invention.

FIG. 14 is a flowchart of steps describing one remaining process time reporting program according to the invention. This remaining process time reporting program residing in the processor (A) 3 is activated in step 13-2 of the processing task control program discussed above (step 14-1). The program first reads device control progress status data prepared in the device control process of step 13-4 in the processing task control program, the data indicating the progress status of the current process (step 14-2). A check is made to see if the process is complete based on the read data (step 14-3). If the process has yet to be completed, the remaining process time is predicted in accordance with the data obtained in step 14-2 (step 14-4).

A check is then made to see if the difference between the remaining process time computed in step 14-4 and the most-recently reported remaining process time exceeds a predetermined time period (step 14-5). If the difference in time is below the predetermined time period, no report needs to be sent to the host 12 and step 14-2 is reached again. If the predetermined time period is exceeded, the remaining process time computed in step 14-4 is reported to the host 12 (step 14-6). If the check in step 14-3 ascertains the end of the process, this remaining process time reporting program is terminated (step 14-7).

Figure 15:
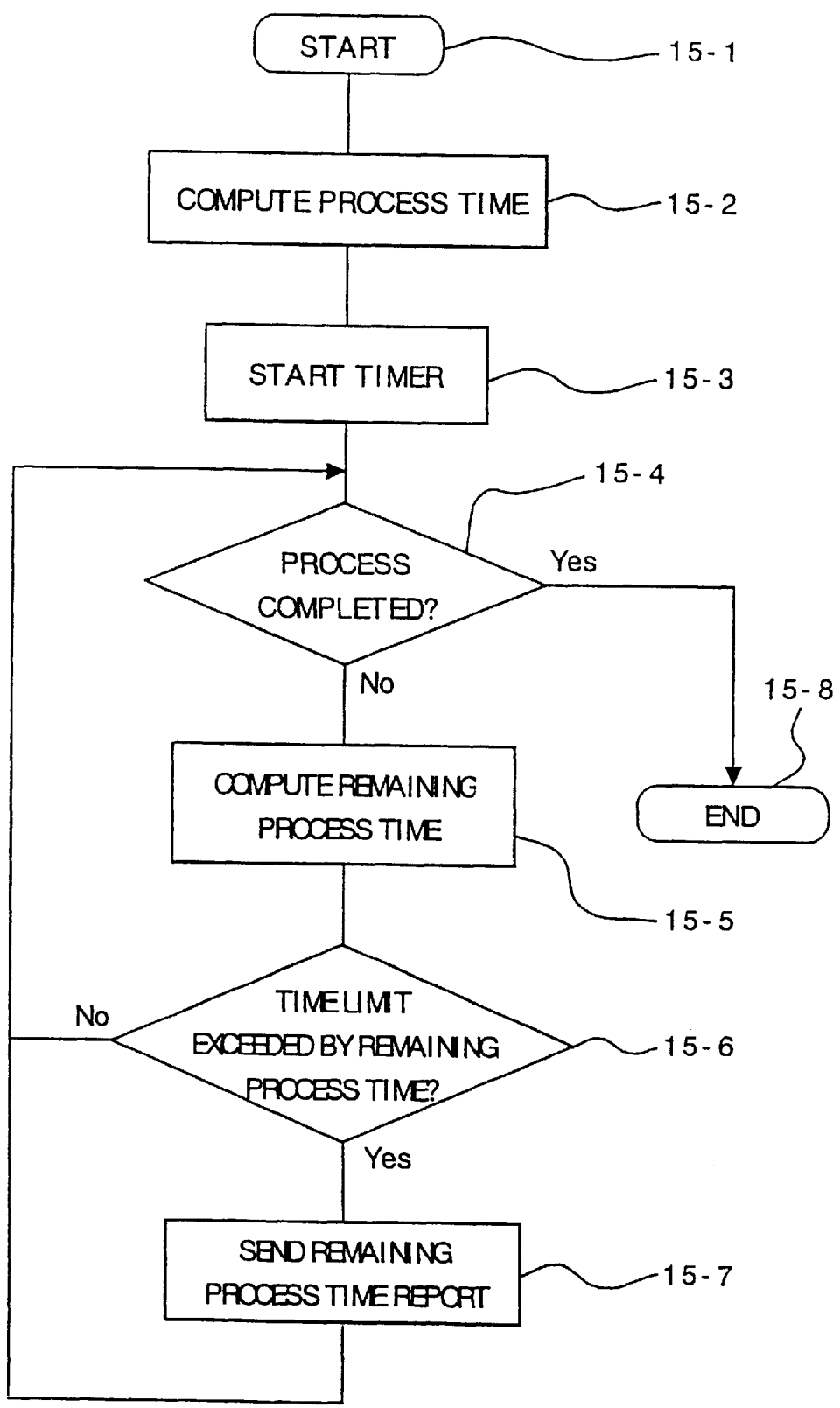
FIG. 15 is a flowchart of steps describing another remaining process time reporting program according to the invention.

FIG. 15 is a flowchart of steps describing another remaining process time reporting program according to the invention. This remaining process time reporting program, residing in the processor (A) 3, is activated in step 13-2 of the processing task control program discussed above (step 15-1). The program first computes the time required to complete the current process based on the process start instruction from the host 12 (step 15-2). A timer is then started (step 15-3). A check is made to see if the current process has yet to be complete (step 15-4). With the current process found to be still in progress, the remaining process time is computed by subtracting the count of the timer started in step 15-3 from the process time computed in step 15-2 (step 15-5).

A check is made to see if the difference between the remaining process time computed in step 15-5 and the most-recently reported remaining process time exceeds a predetermined time period (step 15-6). If the difference in time is below the predetermined time period, no report needs to be sent to the host 12 and step 15-4 is reached again. If the predetermined time period is exceeded, the remaining process time computed in step 15-5 is reported to the host 12 (step 15-7). If the check in step 15-4 confirms the end of the process, this remaining process time reporting program is terminated (step 15-8). With the first embodiment, as described, the automatic control program for the processor (A) 3 and the related programs allow the remaining process time to be reported to the host 12 at predetermined intervals.

Figure 16:
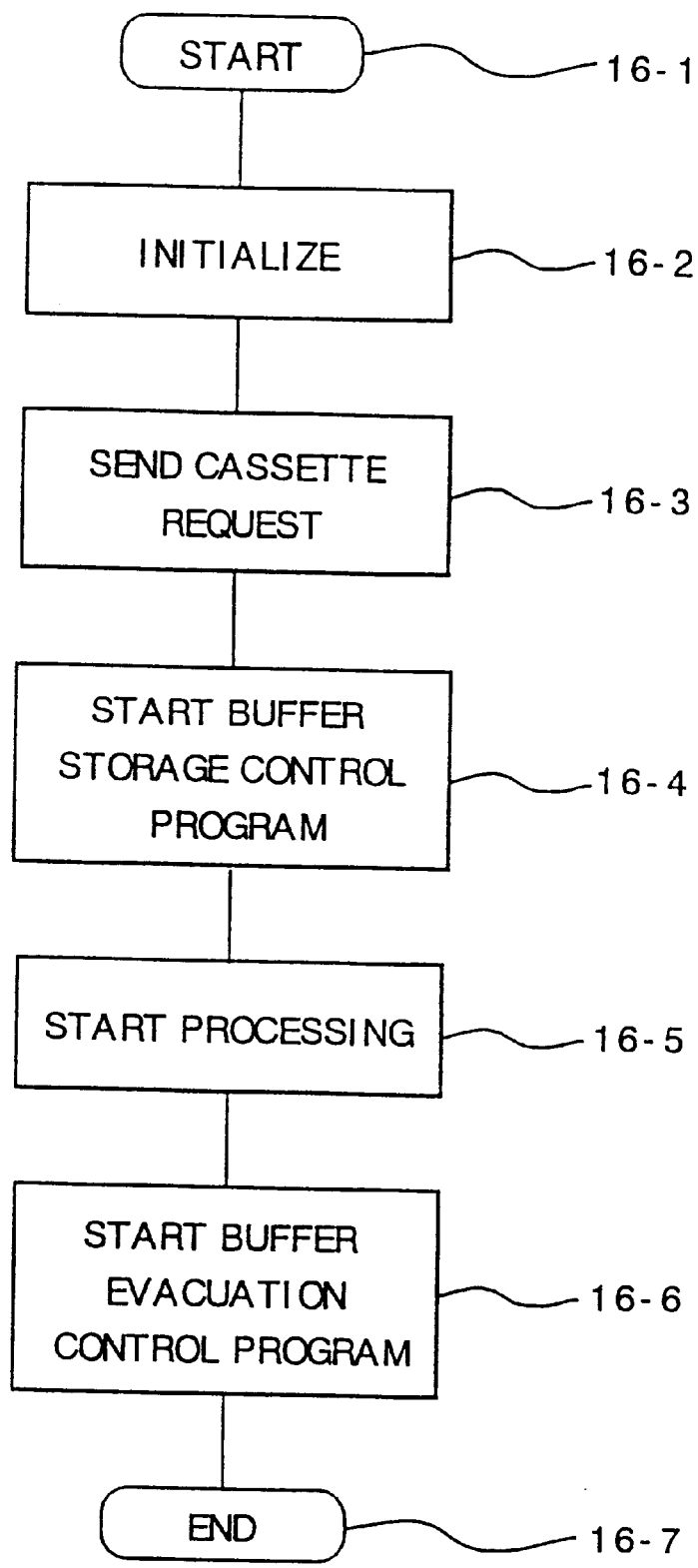
FIG. 16 is a flowchart of steps describing an automatic control program for the processors (B) and (C) according to the invention.

FIG. 16 is a flowchart of steps describing an automatic control program residing in each of the processors (B) and (C) according to the invention. In FIG. 16, the processors (B) 4 and (C) 5 are first started (step 16-1). All processor components are initialized and their performance is verified (step 16-2). When ready for processing, the processors (B) 4 and (C) 5 each send a cassette request to the host 12 (step 16-3). The processor (B) 4 starts its buffer storage control program to move the cassette 2 from the stage 4*a* into the front buffer 4*b*, and the processor (C) 5 starts its own buffer storage control program to move the cassette 2 from the stage 5*a* into the buffer 5*b* (step 16-4). The processor (B) 4 then starts actually to process the cassette 2 housed in the front buffer 4*b*, and the processor (C) 5 also starts actually to process the cassette 2 held in the buffer 5*b* (step 16-5).

The processor (B) 4 starts its buffer evacuation control program to move the processed cassette 2 from the front buffer 4*b* to the stage 4*a*, and the processor (C) 5 starts its own buffer evacuation control program to move the cassette 2 from the buffer 5*b* to the stage 5*a* (step 16-6). All automatic control programs are then terminated (step 16-7). Unlike the conventional program shown in FIG. 37, the automatic control program for the processor (B) 5 or (C) 5 allows three processes to be designated independently by the host 12. These processes are: buffer storage (storing the cassette into the front buffer 4*b* or buffer 5*b* inside), buffer evacuation (extracting the cassette from the buffer), and actual processing.

Figure 17:
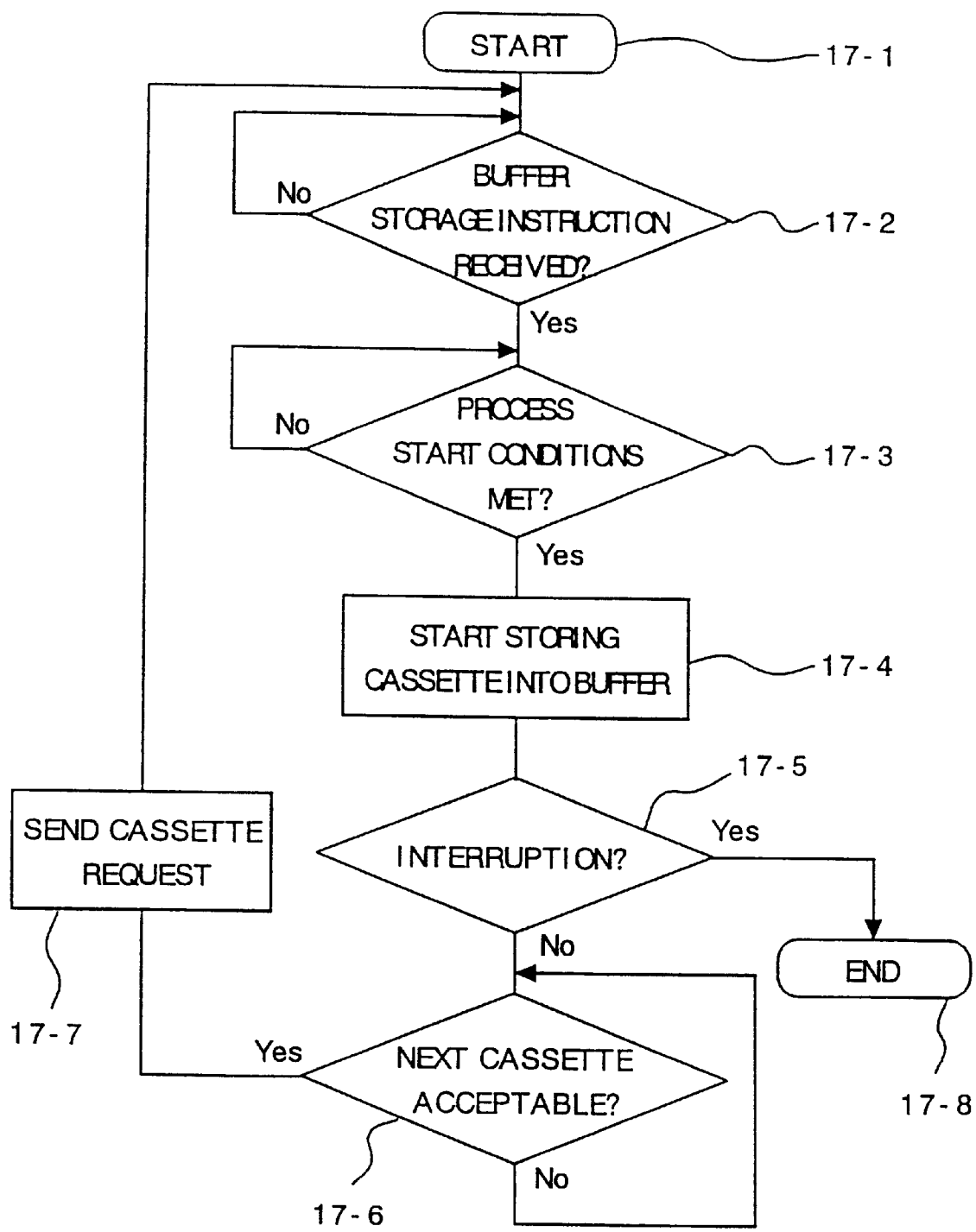
FIG. 17 is a flowchart of steps describing a buffer storage control program according to the invention.

FIG. 17 is a flowchart of steps describing the buffer storage control program according to the invention. The buffer storage control program residing in each of the processors (B) 4 and (C) 5 is started in step 16-4 of the above-described automatic control program (step 17-1). A buffer storage instruction for cassette storage into the front buffer 4*b* or buffer 5*b* is awaited from the host 12 (step 17-2). With the buffer storage instruction received, a check is made to see if the progress status of any preceding cassette 2 headed toward the buffer for storage is conducive to the upcoming storage task (step 17-3). With the starting conditions found to be met in step 17-3, the cassette 2 starts to be moved from the stage 4*a* or 5*a* to the front buffer 4*b* or buffer 5*b* (step 17-4).

Following step 17-4, a check is made to see if any interruption has occurred. If no interruption is detected, a check is made to see if there is no cassette 2 on the stage 4*a* or 5*a* and if the front buffer 4*b* or buffer 5*b* has room to accommodate the next cassette 2 (step 17-6). If the buffer is found ready to accept the next cassette 2, a cassette request is sent to the host 12 (step 17-7). Step 17-7 is followed by step 17-2 in which a buffer storage instruction from the host 12 is awaited. If an interruption is found to have occurred in step 17-5, this buffer storage control program is terminated (step 17-8).

Figure 18:
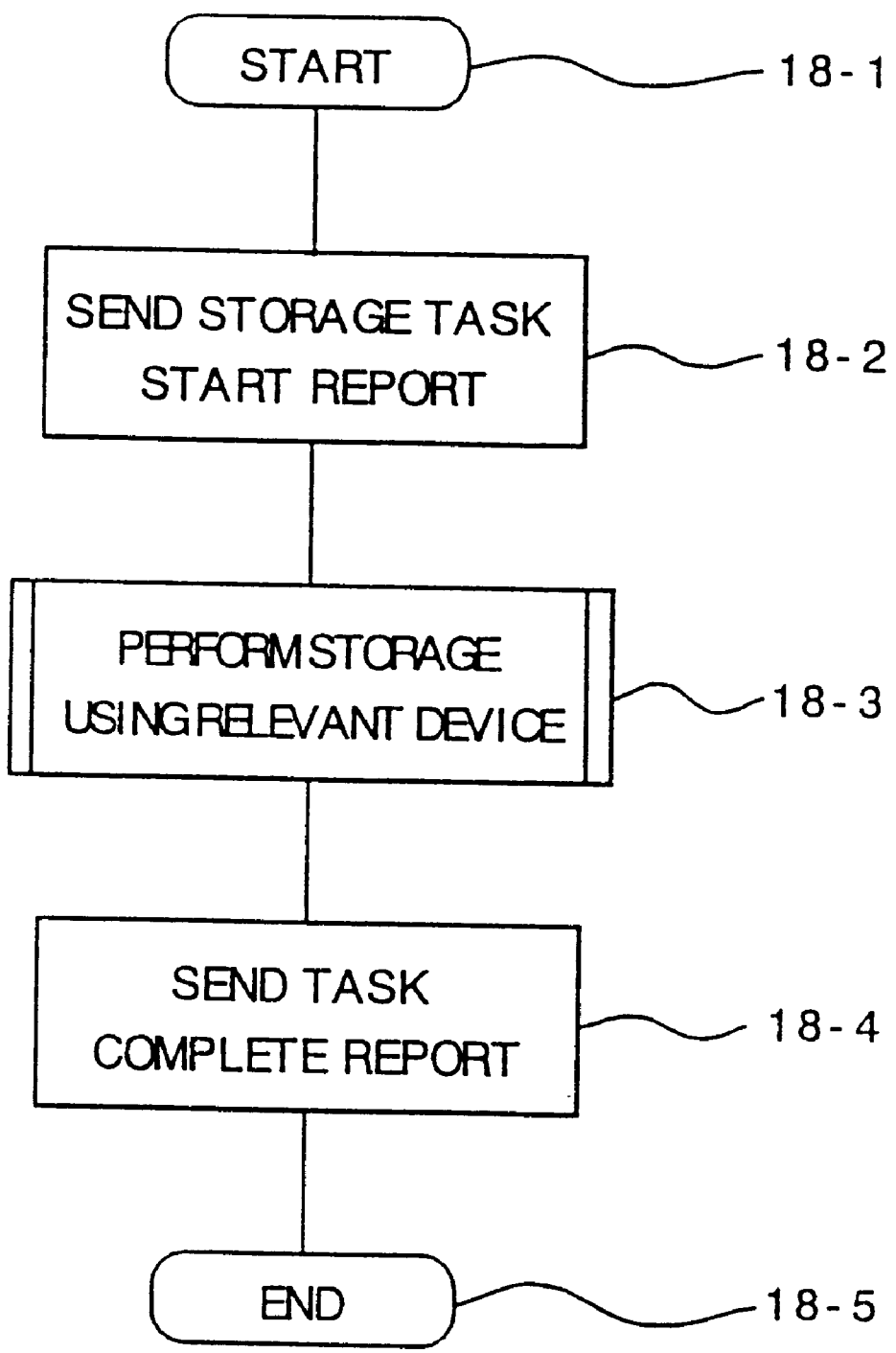
FIG. 18 is a flowchart of steps describing a buffer storage task control program according to the invention.

FIG. 18 is a flowchart of steps describing a buffer storage task control program according to the invention. The buffer storage task control program residing in each of the processors (B) 4 and (C) 5 is started in step 17-4 of the above-described buffer storage control program (step 18-1). A storage task start report is sent to the host 12 (step 18-2). The actual storage task is carried out by use of the components (step 18-3). When the task is completed, the host 12 is notified thereof (step 18-4). The buffer storage task control program is then terminated (step 18-5). In step 18-3, the processor (B) 4 uses the cassette transport robot 4*d*-1 to carry the cassette 2 from the stage 4*a* into the front buffer 4*b* for storage therein, and the processor (C) 5 employs the cassette transport robot 5*c* to transport the cassette 2 from the stage 5*a* into the buffer 5*b*.

Figure 19:
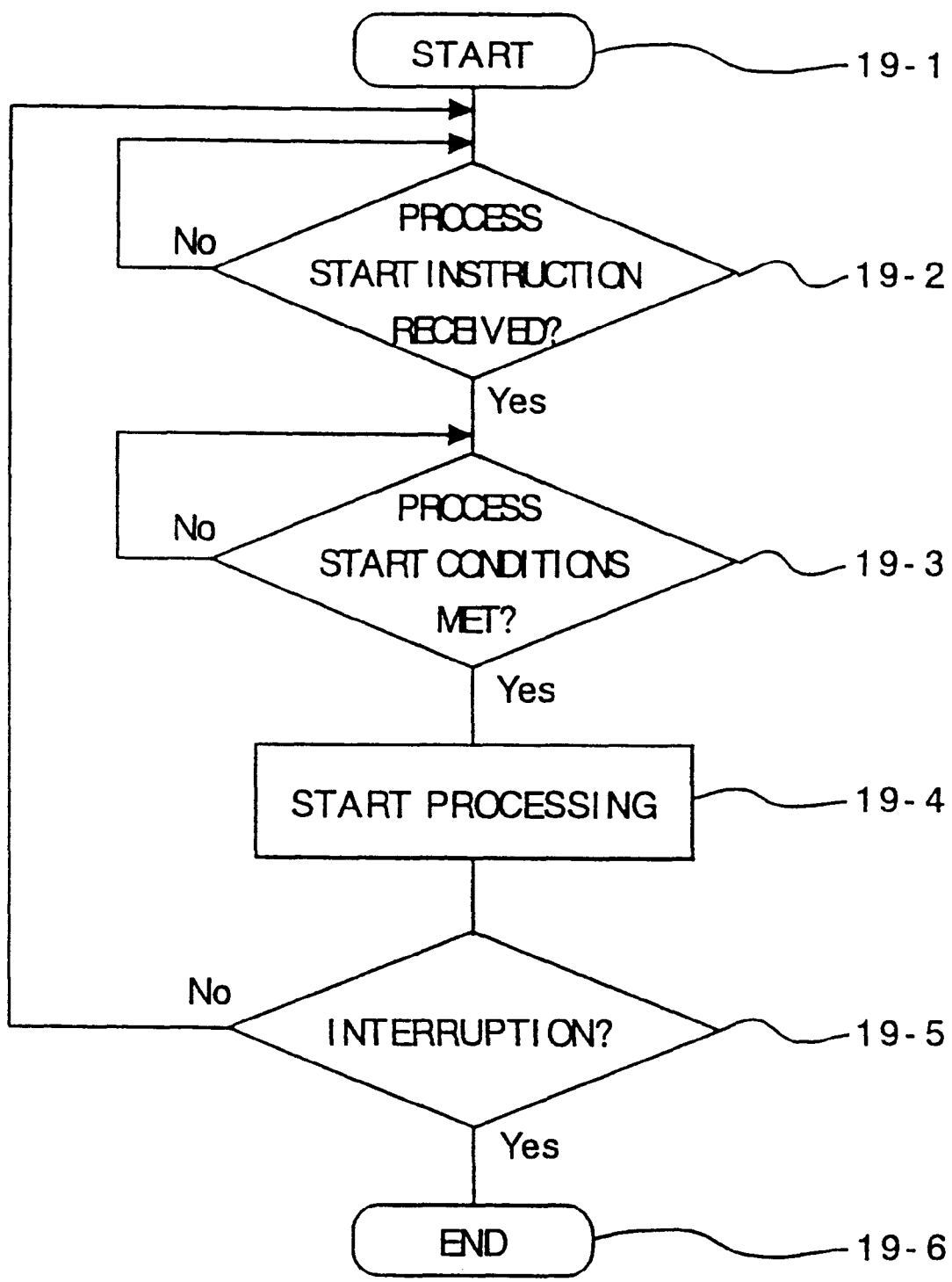
FIG. 19 is a flowchart of steps describing a processing program according to the invention.

FIG. 19 is a flowchart of steps describing a processing program according to the invention. This processing program residing in each of the processors (B) 4 and (C) 5 is started in step 16-5 of the above-described automatic control program (step 19-1). A process start instruction from the host 12 is awaited (step 19-2). With the process start instruction received, a check is made to see if the progress status of any preceding cassette 2 being processed is conducive to the upcoming process (step 19-3). With the starting conditions found to be met in step 19-3, the cassette 2 in the front buffer 4*b* or buffer 5*b* starts to be processed in the processing vessel 4*f* or processing chamber 5*f* (step 19-4). Following step 19-4, a check is made to see if any interruption has occurred (step 19-5). If no interruption is detected, step 19-2 is reached again and a process start instruction from the host 12 is awaited. If an interruption is found to have occurred in step 19-5, this processing program is terminated (step 19-6).

Figure 20:
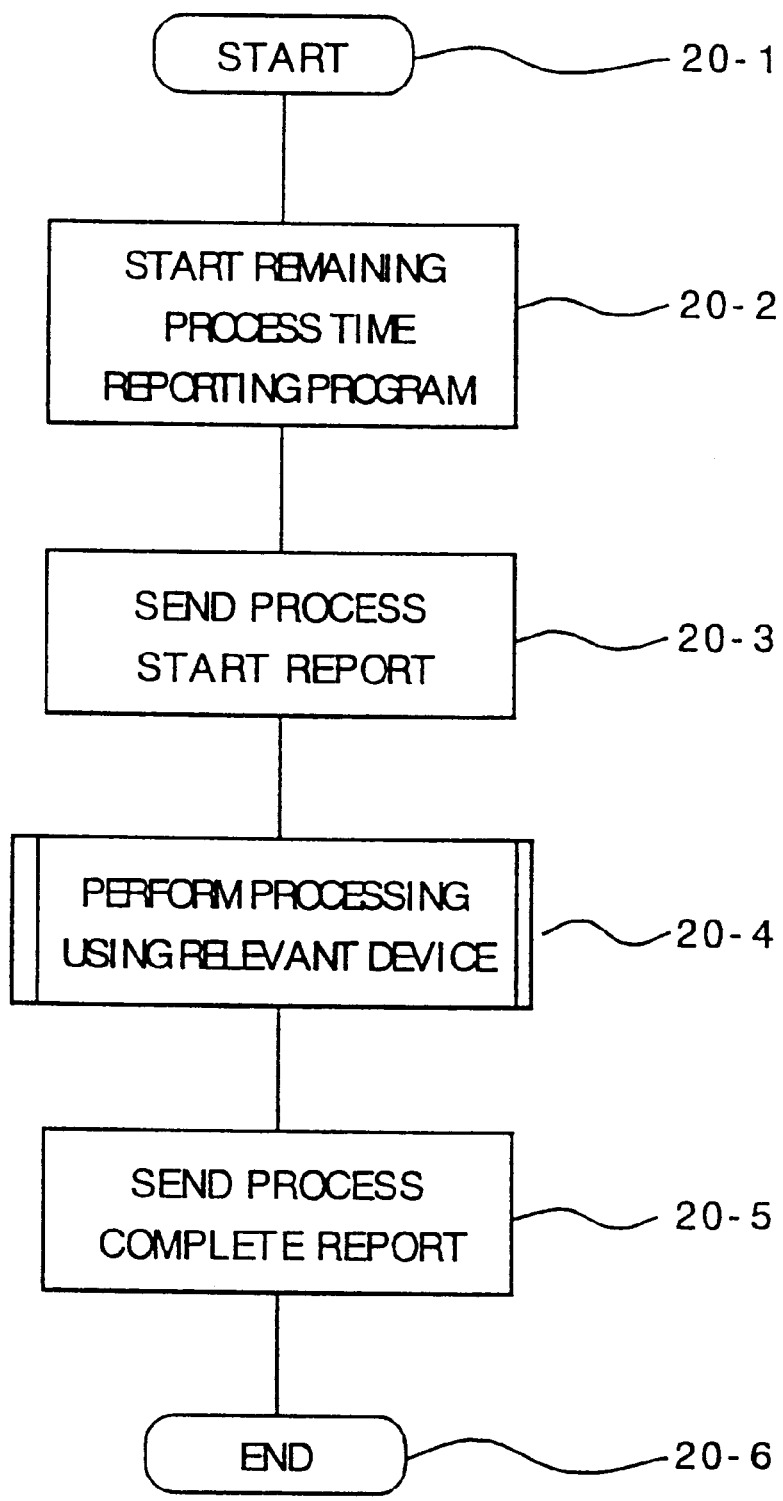
FIG. 20 is a flowchart of steps describing another processing task control program according to the invention.

FIG. 20 is a flowchart of steps describing another processing task control program according to the invention. This processing task control program residing in each of the processors (B) 4 and (C) 5 is started in step 19-4 of the above-described processing program (step 20-1). Thus started, the program in turn activates the remaining process time reporting program for reporting the remaining time of the designated process to the host 12 (step 20-2). A process start report is then sent to the host 12 (step 20-3). The actual processing of wafers 1 is carried out by use of the components (step 20-4). Specifically in step 20-4, the processor (B) 4 uses the cassette transport robot 4*d*-1, shuttle 4*e* and cassette transport robot 4*d*-2 to move the cassette 2 from the front buffer 4*b* through the back buffer 4*c* into the processing vessel 4*f* for consecutive processing.

The processor (C) 5, for its part, utilizes the cassette transport robot 5*c* to move the cassette 2 onto the internal stage 5*e*. The wafer transport robot 5*d* extracts the wafers 1 from the cassette 2 placed on the stage 5*e* and feeds the extracted wafers into the processing chamber 5*f* for successive processing. When these processes are completed, a process complete report is sent to the host 12 (step 20-5). The processing task control program is then terminated (step 20-6). The remaining process time reporting program started in step 20-2 above is the same as that in FIGS. 14 and 15 discussed in connection with the automatic control program for the processor (A) 3 and with the related programs. As such, the remaining process time reporting program will not be described further. It should be noted that the device control progress status data read earlier in step 14-2 of FIG. 14 is prepared in this example in step 20-4.

Figure 21:
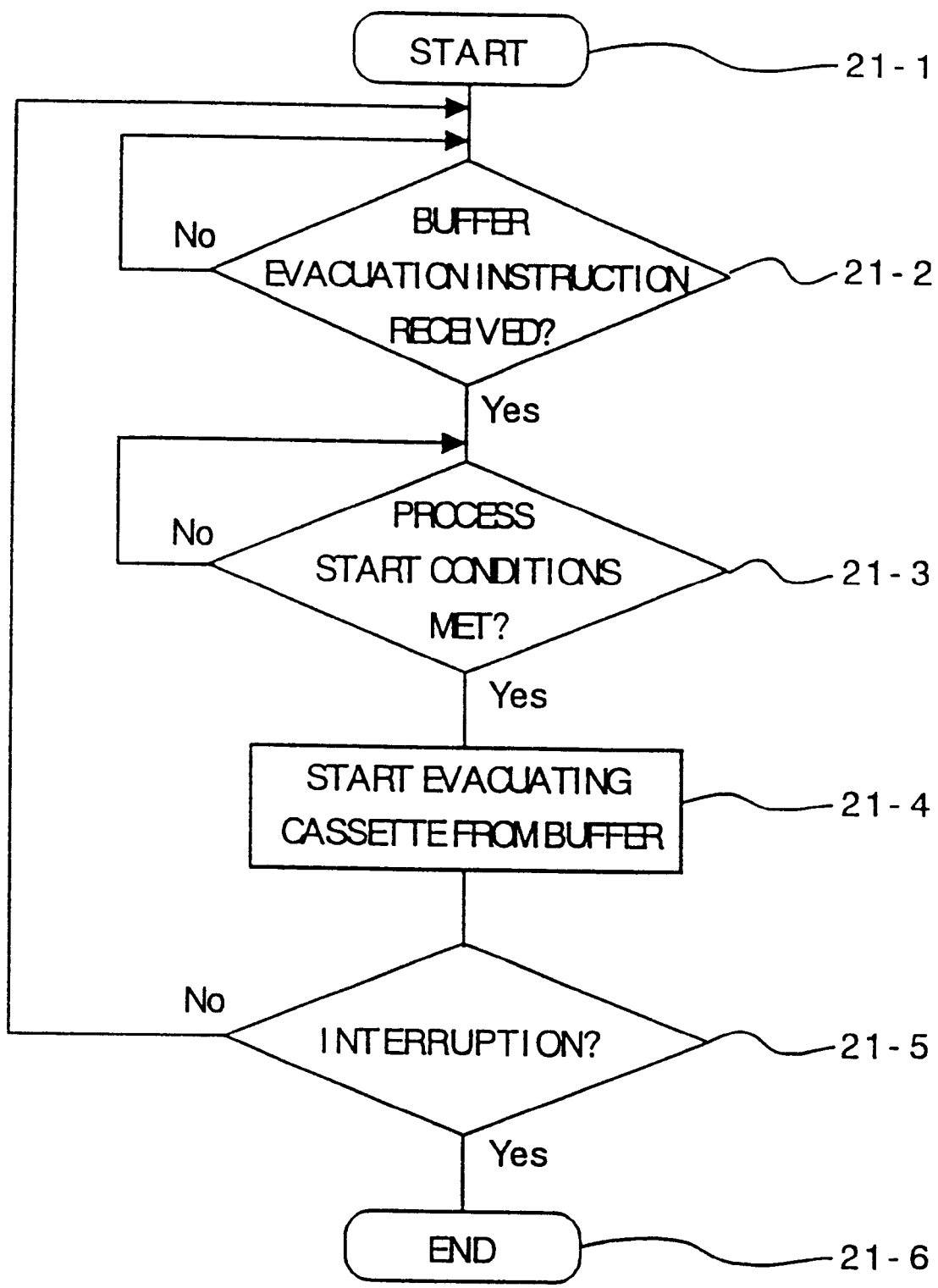
FIG. 21 is a flowchart of steps describing a buffer evacuation control program according to the invention.

FIG. 21 is a flowchart of steps describing a buffer evacuation control program according to the invention. The buffer evacuation control program residing in each of the processors (B) 4 and (C) 5 is started in step 16-6 of the above-described automatic control program (step 21-1). With the program started, the processor (B) 4 waits for a buffer evacuation instruction from the host 12 designating cassette transport from the front buffer 4b to the stage 4a, whereas the processor (C) 5 awaits a buffer evacuation instruction from the host 12 specifying cassette transport from the buffer 5b to the stage 5a (step 21-2). When the evacuation instruction is received, a check is made to see if the progress status of any preceding cassette 2 being evacuated is conducive to the upcoming evacuation of each processor (step 21-3). With the starting conditions found to be met in step 21-3, the cassette 2 starts to be evacuated from the front buffer 4b to the stage 4a or from the buffer 5b to the stage 5a (step 21-4). After step 21-4, a check is made to see if any interruption has occurred (step 21-5). If no interruption is detected, step 21-2 is reached again and a buffer evacuation instruction from the host 12 is awaited. If an interruption is found to have occurred in step 21-5, this buffer evacuation control program is terminated (step 21-6).

Figure 22:
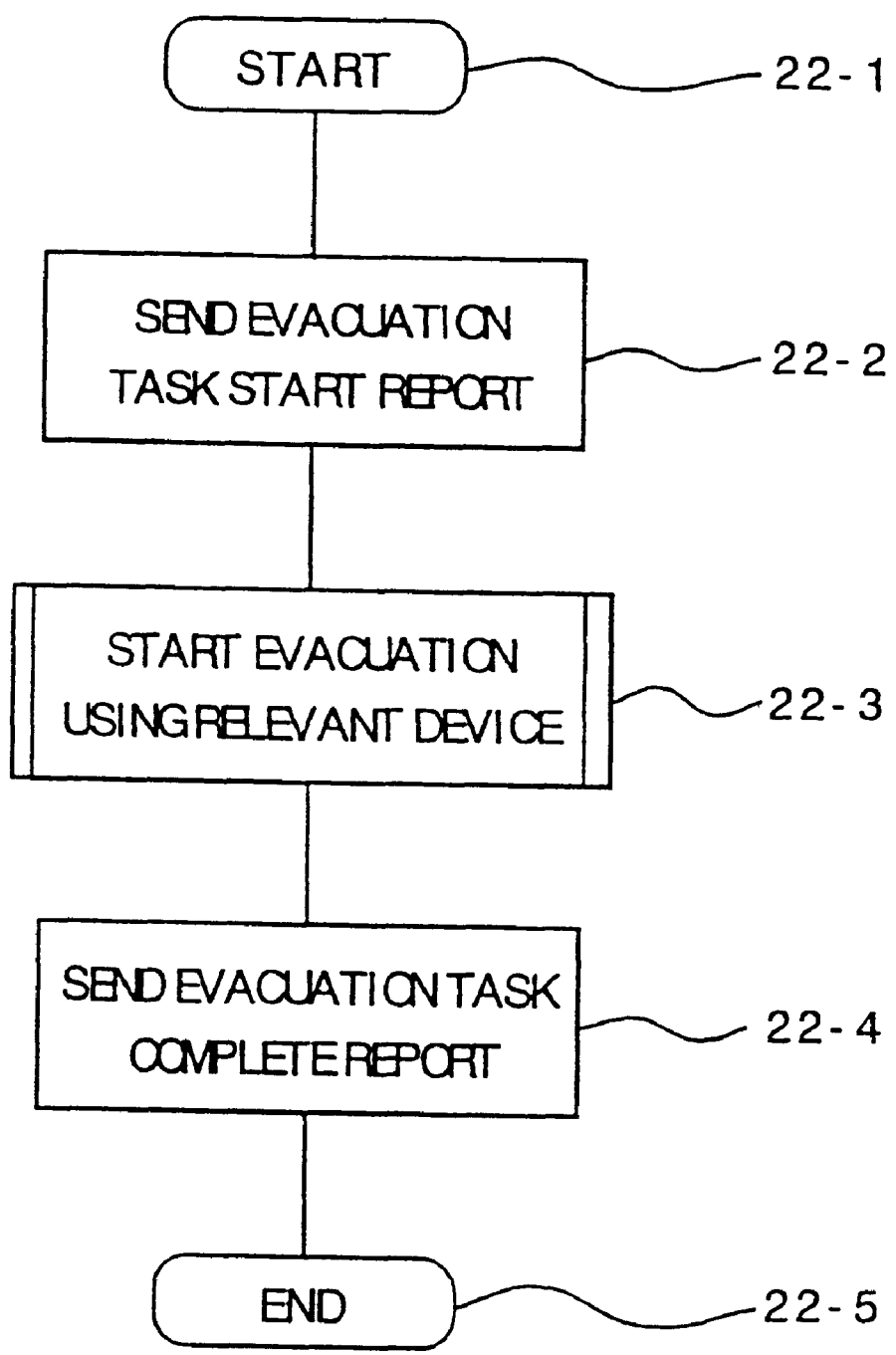
FIG. 22 is a flowchart of steps describing a buffer evacuation task control program according to the invention.

FIG. 22 is a flowchart of steps describing a buffer evacuation task control program according to the invention. This buffer evacuation task control program residing in each of the processors (B) 4 and (C) 5 is started in step 21-4 of the above-described buffer evacuation control program (step 22-1). With the program started, an evacuation task start report is sent to the host 12 (step 22-2). The actual evacuation of cassettes is carried out by use of the components (step 22-3). With the evacuation task completed, an evacuation task complete report is sent to the host 12 (step 22-4), which terminates the buffer evacuation task control program (step 22-5). Specifically in step 22-3, the processor (B) 4 uses the cassette transport robot 4d-1 to evacuate the cassette 2 from the front buffer 4b onto the stage 4a.

The processor (C) 5, on the other hand, employs the cassette transport robot 5c to evacuate the cassette 2 from the buffer 5b onto the stage 5a. As described, the automatic control programs residing in the processors (B) 5 and (C) 5 of the first embodiment and the related programs allow the host 12 independently to designate storage of cassettes 2 where appropriate in the processors, evacuation of cassettes 2 from inside the processors, and actual processing of cassettes 2. Under the programs, the host 12 is also informed of the remaining times of the currently executed processes at predetermined intervals.

The foregoing description has covered the automatic control programs residing in the processors 3, 4 and 5 and the related processing task control programs. What follows is a description of another related program, i.e., the semiconductor wafer supply control (pull) program for the first embodiment whereby unprocessed cassettes 2 are fed to the processors 3, 4 and 5 in preparation for processing. As mentioned earlier in connection with the conventional setup, the moniker "pull" signifies that unprocessed cassettes 2 are "pulled" in for processing as requested by the processors 3, 4 and 5.

Figure 23:
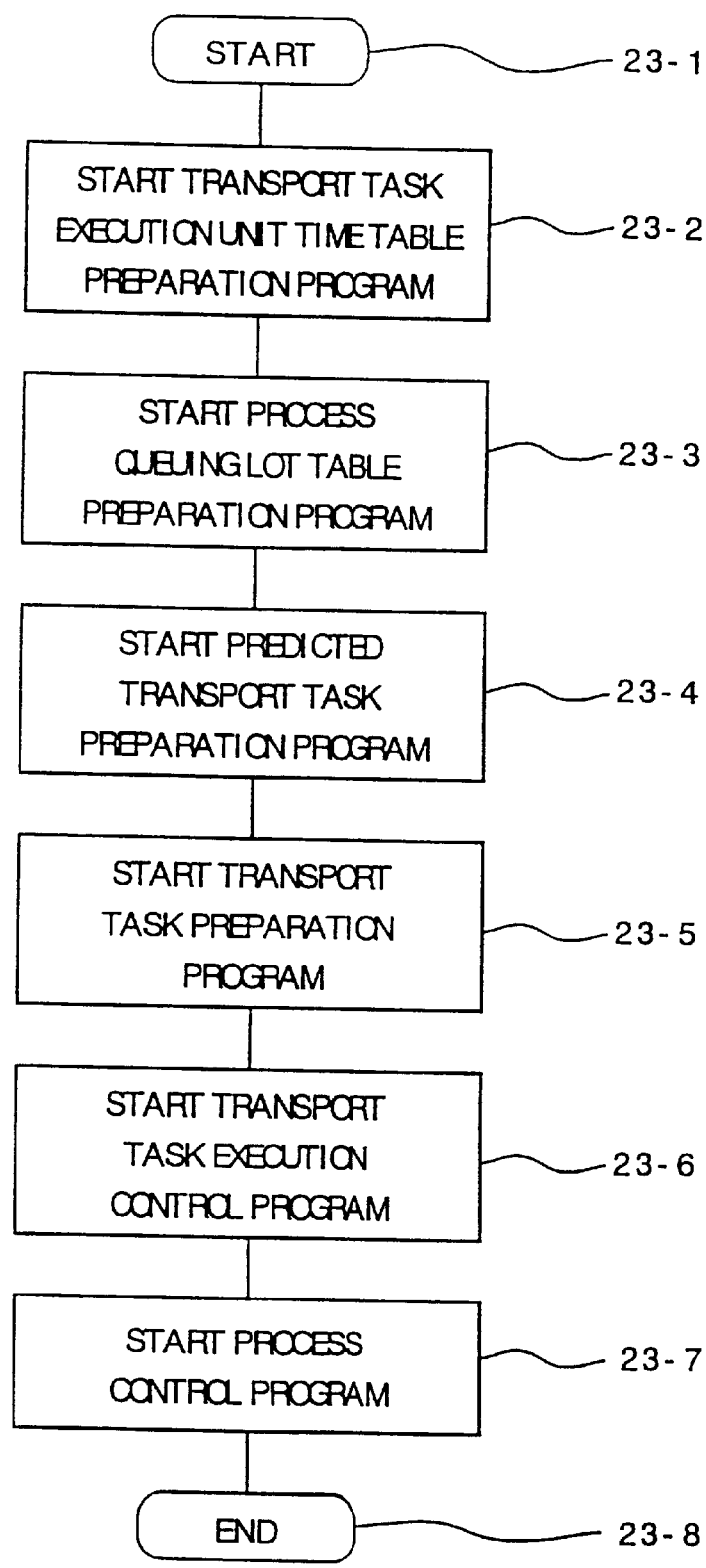
FIG. 23 is a flowchart of steps describing a semiconductor wafer supply control (pull) program according to the invention.

FIG. 23 is a flowchart of steps describing the semiconductor wafer supply control (pull) program according to the invention. In FIG. 23, the host 12 is first started (step 23-1). A transport task execution unit time table preparation program is then started to compute and tabulate the times required for transport between the processors 3, 4 and 5 on the one hand and their nearest bay stockers 8 on the other hand as well as for transport between the stockers 8 and 10 (step 23-2). Thereafter, a process queuing lot table preparation program is started to tabulate queuing cassettes 2 to be processed by each of the processors 3, 4 and 5 (step 23-3). Given the above-mentioned remaining process times from the processors 3, 4 and 5, a predicted transport task preparation program is started so as to select one cassette 2 from the process queuing lot table for setting a task of transport to each processor (step 23-4). As with the conventional setup, a transport task preparation program is started to select one cassette for each processor from the process queuing lot table using a cassette request, a process complete report or a timer count from each of the processors as a trigger, whereby transport tasks are set up (step 23-5). Then a transport task execution control program is started to execute the transport tasks set up in steps 23-4 and 23-5 (step 23-6). Finally, a process control program is started to get the cassettes 2 actually processed by the processors 3, 4 and 5 (step 23-7), and the semiconductor wafer supply control program is terminated (step 23-8).

Figure 24:
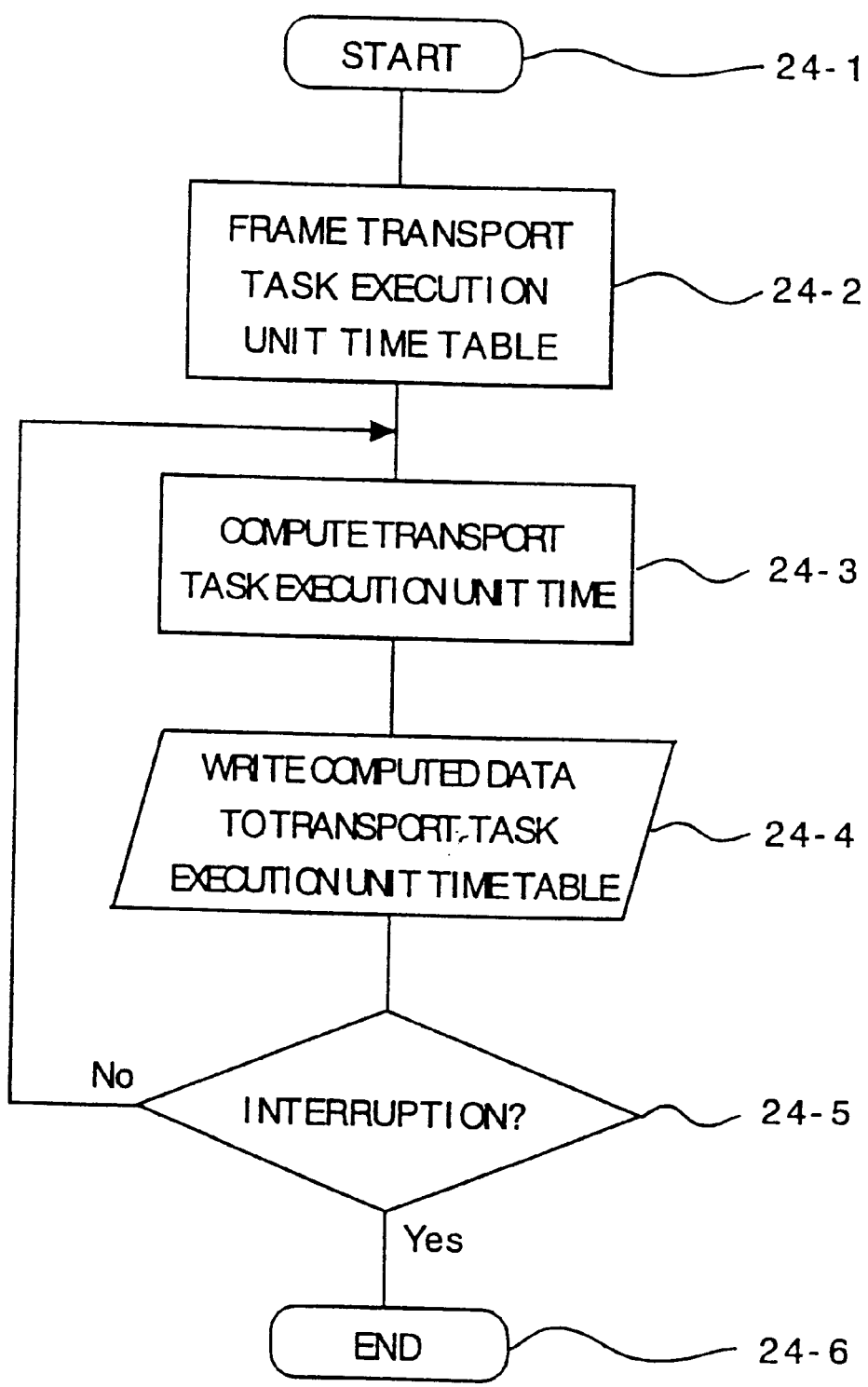
FIG. 24 is a flowchart of steps describing a transport task execution unit time table preparation program according to the invention.
Figure 50:
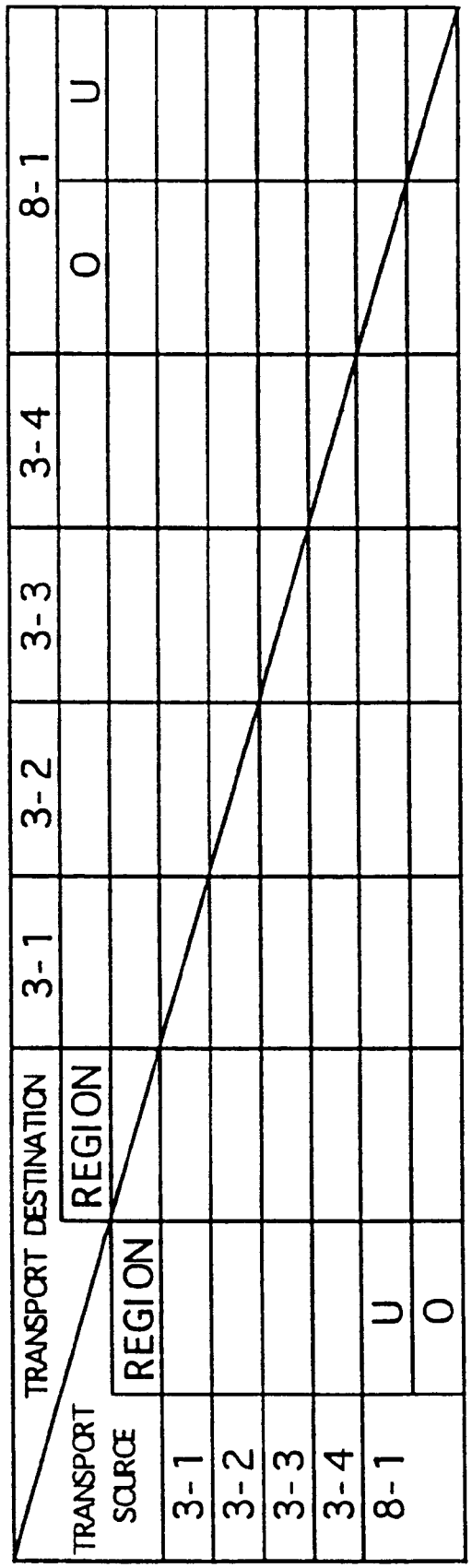
FIG. 50 is a view of a bay-to-bay transport task execution unit time table according to the invention.

FIG. 24 is a flowchart of steps describing the transport task execution unit time table preparation program according to the invention. The transport task execution unit time table preparation program, residing in the host 12, is started instep 23-2 of the above-described automatic control program (step 24-1). When started, the program frames either a transport task execution unit time table wherein a plurality of process regions (i.e., bays) each made up of processors 3, 4 and 5 and of their nearest bay stocker 8 are divided into transport sources (in rows) and transport destinations (in columns), or another transport task execution unit time table in which groups made of stockers 8 and 10 are also divided likewise (step 24-2). FIG. 50 shows an example of the former table, i.e., a transport task execution unit time table containing transport tasks performed inside the process regions (bays).

Figure 51:
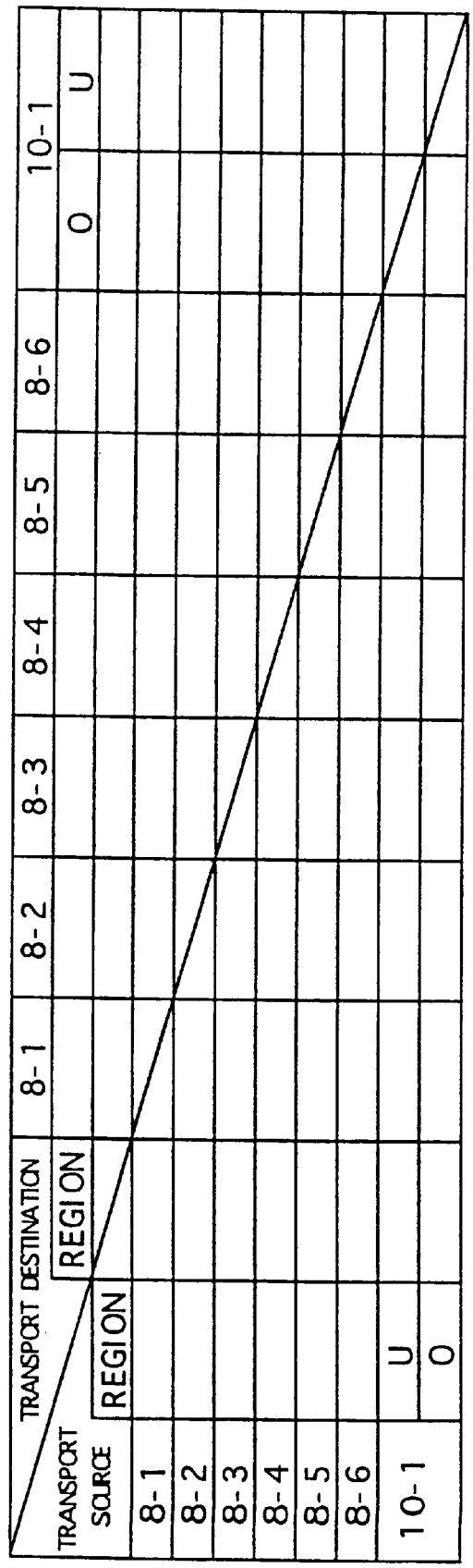
FIG. 51 is a view of an intra-bay transport task execution unit time table according to the invention.

The table in FIG. 50 is created on the basis of the semiconductor fabrication equipment illustrated in FIG. 2. The table concerns a bay (process region) that includes the bay stocker 8-1. Similar tables may also be prepared for the other bays. If the bay stocker 8-1 is extended illustratively to the second floor to offer a sufficient capacity to store cassettes 2, the time it takes to transport a cassette 2 from its storage location to the AGV port 8d or to the OHS port 8e will vary significantly depending on the cassette 2 being stored on the second or the third floor. The bay-related data in the table is intended to allow for such transport time differences. In the table, reference character "O" stands for the third floor and "U" for the second floor. FIG. 51 shows an example of the latter transport task execution unit time table mentioned above, i.e., a transport task execution unit time table containing transport tasks to be carried out between the bays.

In the table of FIG. 51, the overflow stocker 10 is divided into two regions "O" and "U." Referring again to FIG. 24, step 24-2 in which the transport task execution unit time table was framed is followed by a process of computing, according to the framed table, the time required for cassette transport from each transport source (processors 3, 4 and 5 and stocker 8 or 10) in a row to each destination (also processors 3, 4 and 5 and stocker 8 or 10) in a column (step 24-3). The computing may illustratively be carried out in one of four ways: (1) the data given beforehand through the input means 12b is used unmodified; (2) the performance parameters of the transport devices involved in the transport tasks, such as running speeds and handling times, are used as the basis for computing the transport times; (3) the results of simulated transport tasks reported from the bay stocker controller 8x, OHS controller 9x, AGV controller 7x and overflow stocker controller 10x are totaled by the host 12, the sum being used as the basis for computing the transport times; or (4) the time it actually took for each of the bay stocker controller 8x, OHS controller 9x, AGV controller 7x and overflow stocker controller 10x to accomplish their transport tasks was processed statistically to compute the transport times.

The time for each of the transport tasks computed in step 24-3 is written to the transport task execution unit time table (step 24-4). A check is made to see if any interruption has occurred (step 24-5). If no interruption is detected, step 24-3 is reached again so that the transport task execution unit time table will be updated. If an interruption is found to have occurred, this transport task execution unit time table preparation program is terminated (step 24-6).

Figure 25:
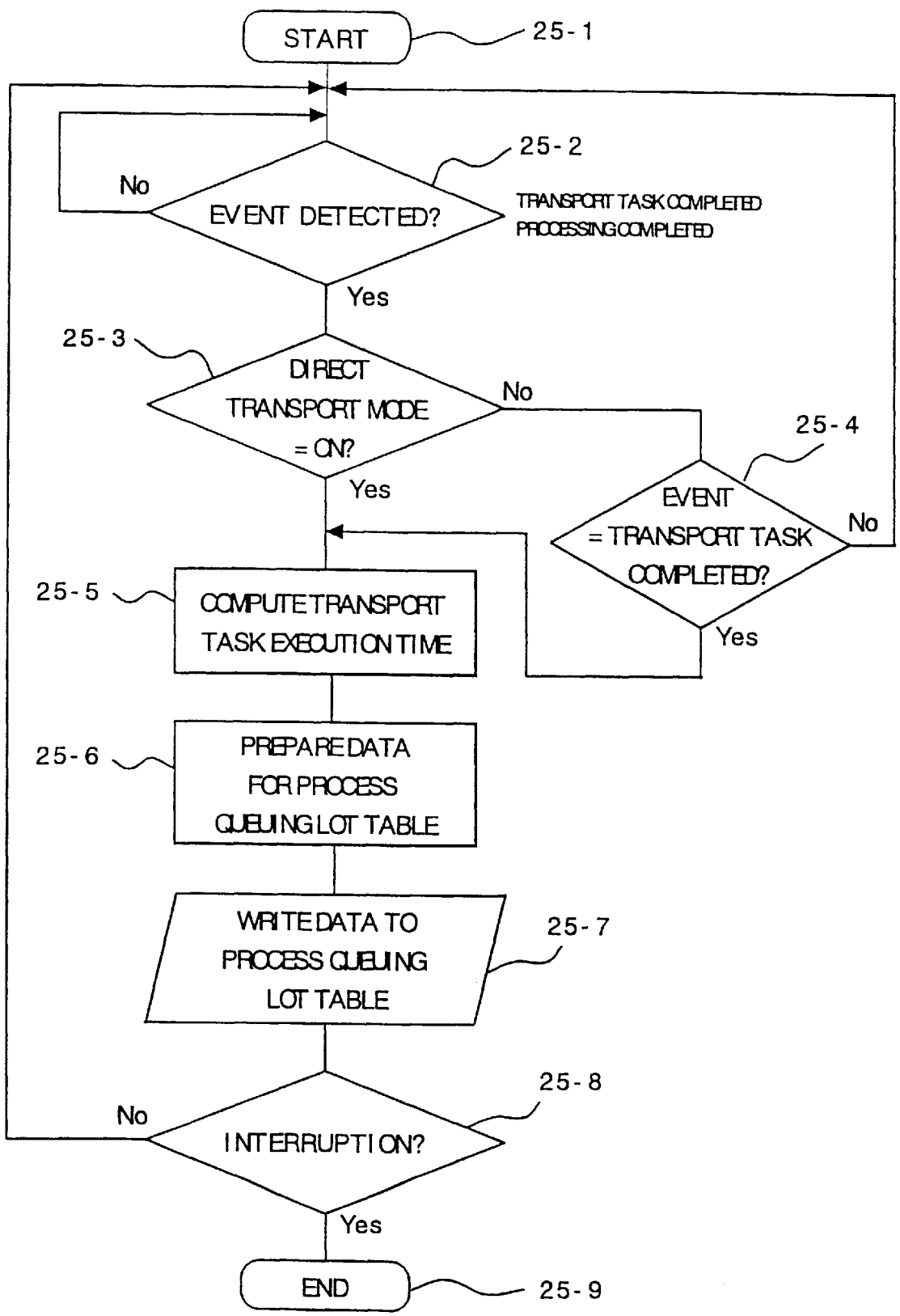
FIG. 25 is a flowchart of steps describing a process queuing lot table preparation program according to the invention.

FIG. 25 is a flowchart of steps describing the process queuing lot table preparation program according to the invention. The process queuing lot table preparation program, residing in the host 12 of the first embodiment, is started in step 23-3 of the above-mentioned automatic control program (step 25-1). A check is made to see if the processing of the cassette 2 by the processor 3, 4 or 5 is complete or if the transport of the cassette 2 to the stocker 8 or 10 is finished (step 25-2). When the end of the processing or transport is detected in step 25-2, a check is made to see if direct transport mode is on (step 25-3). If the mode is not found to be on, a check is made to see if the detected event is the end of the transport (step 25-4).

Direct transport mode is derived from a type of transport control changeover code attached to the processing means or storage means. Depending on its contents, the code initiates changeover of processing steps associated with transport control. Also derived from the transport control changeover code are transport prediction mode, cassette withdrawal mode and forward-justify mode, to be described later.

If the detected event turns out to be other than the end of the transport, step 25-2 is reached again. If the detected event is found to be the end of the transport, the next step 25-5 is reached and executed in the same manner as when direct transport mode is found to be on in step 25-3. Where direct transport mode is not on in step 25-3, the cassette 2 whose processing has just been finished in the processor 3, 4 or 5 is not written to the process queuing lot table for the processor 3, 4 or 5 which will perform the next process of fabrication. Hence occurs no direct transport of the cassette 3 between the processors 3, 4 and 5. The cassette 2 with its processing found completed in step 25-2 is located on the stage 3a for the processor (A) 3, in the front buffer 4b for the processor (B) 4, or in the buffer 5b for the processor (C) 5.

The processors (B) 4 and (C) 5 are controlled, starting from the evacuation of cassettes from the buffers 4b and 5b to the stages 4a and 5a, either by the semiconductor wafer supply control (pull) program in the host 12 described so far, or by a semiconductor wafer output control (push) program to be described later. In this respect, it is conceivable to include in the transport task execution unit time table the transport times required to evacuate cassettes from the buffers 4b and 5b and forward them to the stages 4a and 5a in the processors (B) 4 and (C) 5. Next, the processor 3, 4 or 5 that will perform the next process on the cassette 2 detected in step 25-2 is determined on the bass of the manufacturing criteria input through the input means 12b regarding cassettes 2 and their wafers 1. A transport route is determined in the form of a series of transport devices such as the stockers 8 or 10, OHS 9 and AGVs 7 as well as of the processors 3, 4 and 5 transited or used by the cassette 2 in question as it moves from the current stocker 8 or 10 or from the current processor 3, 4 or 5 to the next processor 3, 4 or 5 determined above. The times required to complete the transport tasks making up the transport route are obtained from the transport task execution unit time table prepared by the transport task execution unit time table in FIG. 24. The acquired unit transport times are totaled, thereby computing the time it takes to perform the transport work involved (step 25-5).

The computed transport times and related data necessary for the process queuing lot table are prepared (step 25-6). These data are written to the process queuing lot table for the next processor 3, 4 or 5 (step 25-7). FIG. 52 shows an example of the process queuing lot table. As illustrated in FIG. 52, the table comprises ID data about each cassette 2; data about in-process sites such as the processor 3, 4 or 5 or stocker 8 or 10 where the cassette in question 2 is currently located; data about transport routes as series of devices transited or used by each cassette as it moves from the source to the destination; data about the time it takes to transport each cassette from the source to the destination; data about priority for each cassette to be processed in the semiconductor fabrication equipment; and data about reserve flags. Specific data contained in the table of FIG. 52 are based on the setup in FIG. 11. Unlike the conventional process queuing lot table, the inventive process queuing lot table has its in-process site data supplemented by the region data described in connection with FIGS. 50 and 51. Also added to the table are the transport routes and transport task execution times obtained in step 25-5 above as well as reserve flag data to be described later. The priority data is the same in content as that in the conventional table. Following step 25-7, a check is made to see if any interruption has occurred (step 25-8). If no interruption is detected, step 25-2 is reached again. If an interruption is found to have occurred, the process queuing lot table preparation program is terminated (step 25-9).

Figure 26:
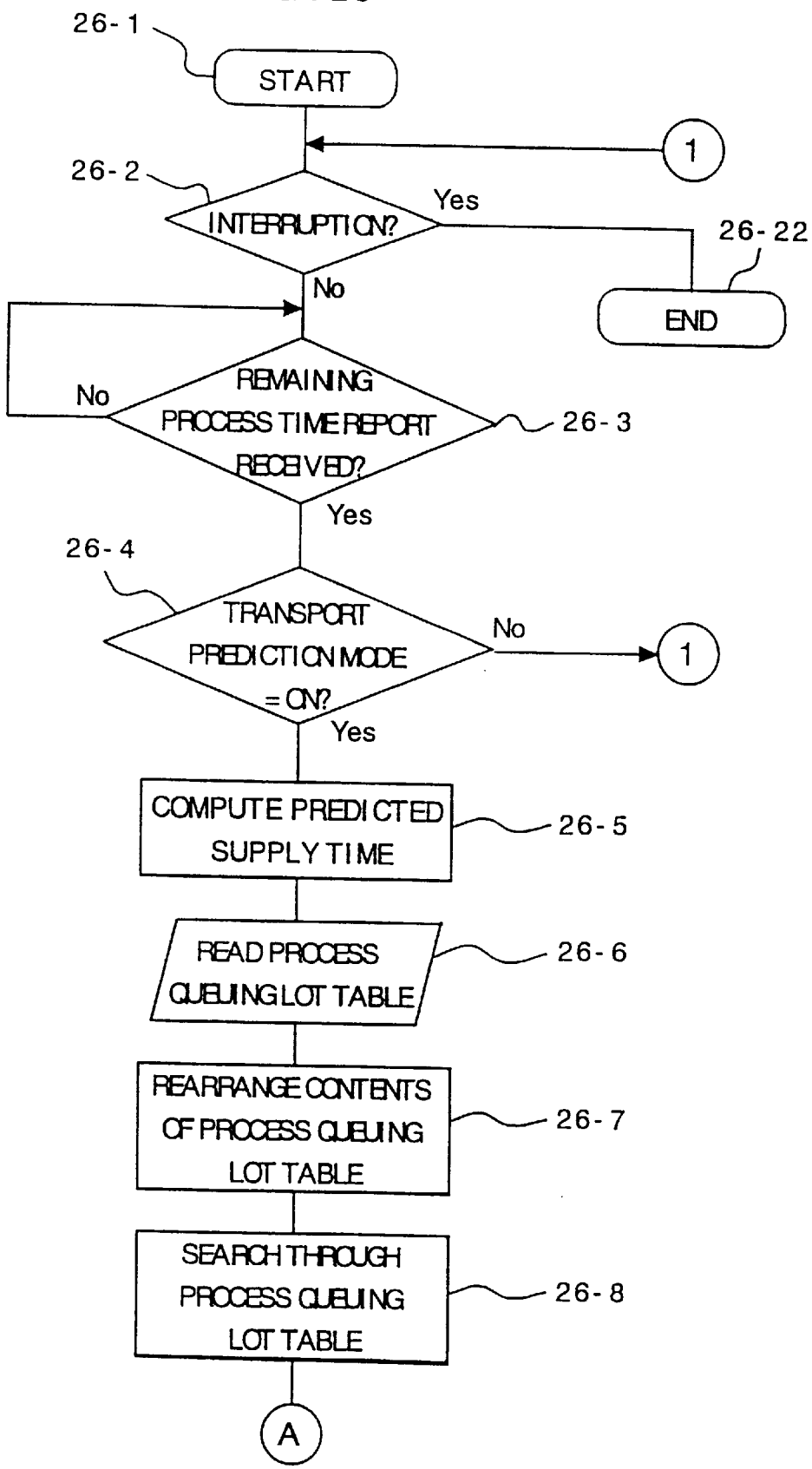
FIG. 26 is a flowchart of steps describing the first half of a predicted transport task preparation program according to the invention.
Figure 27:
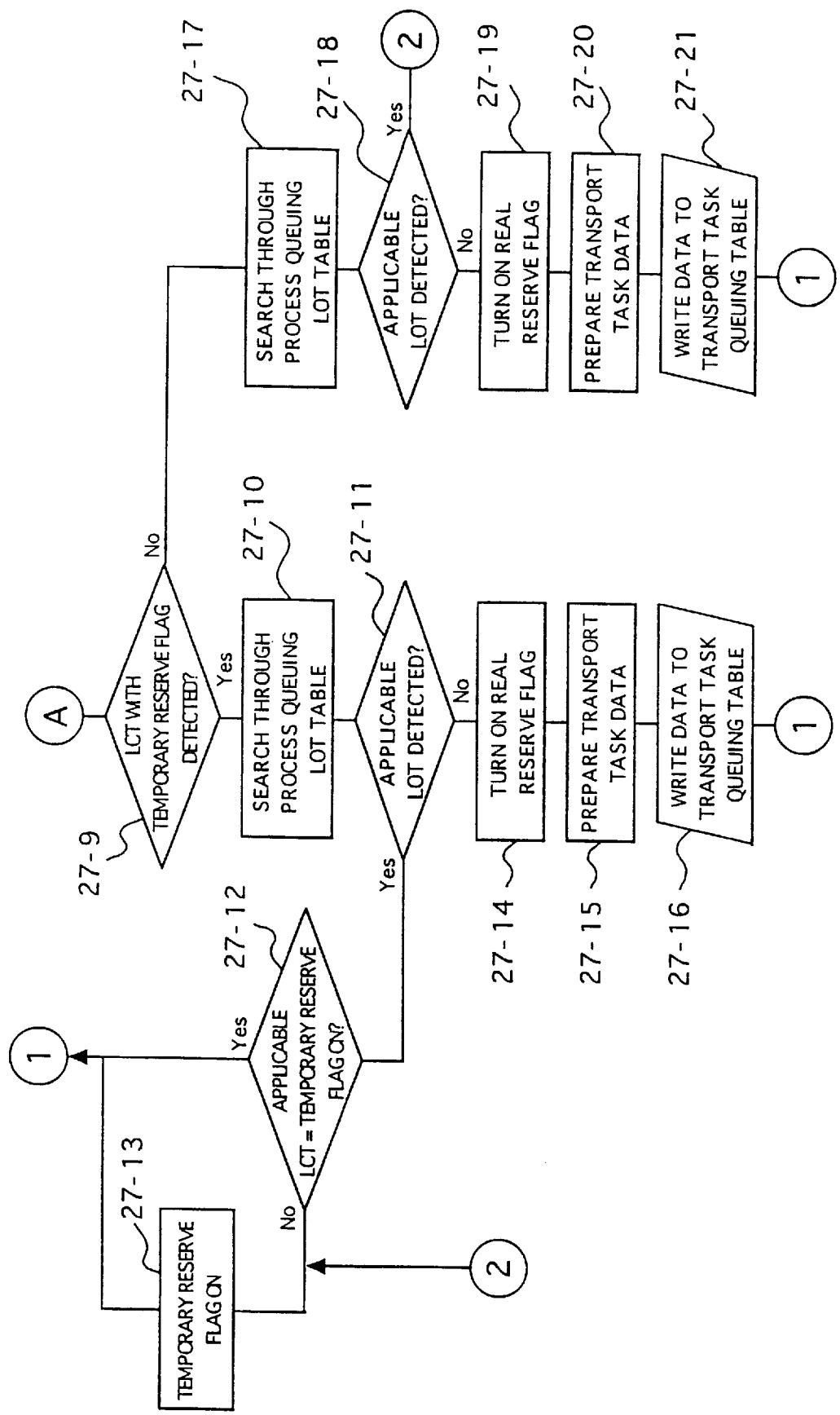
FIG. 27 is a flowchart of steps describing the second half of the predicted transport task preparation program according to the invention.

FIG. 26 is a flowchart of steps describing the first half of a predicted transport task preparation program according to the invention, and FIG. 27 is a flowchart of steps describing the second half of the same program. The predicted transport task preparation program residing in the host 12 of the first embodiment is started in step 23-4 of the above-described semiconductor wafer supply control program (step 26-1). A check is made to see if any interruption has occurred (step 26-2). If no interruption is detected, the next step 26-3 is reached. If an interruption is found to have occurred, the predicted transport task preparation program is terminated (step 26-22). With no interruption detected in step 26-2, a check is made to see if a remaining process time report is received from step 14-6 or 15-7 in the remaining process time reporting program of the processor 3, 4 or 5 in FIG. 14 or 15 (step 26-3). With the remaining process time report received, a check is made to see if transport prediction mode is on (step 26-4). If transport prediction mode is found to be on, the next step 26-5 is reached. If transport prediction mode is not on, step 26-2 is reached again.

Upon receipt of the remaining process time report, a predicted time within which to supply the next unprocessed cassette 2 is computed in consideration of the remaining process time found in the report, the in-process status of other cassettes 2 in the processors 3, 4 and 5, and the times required for cassette storage in the processors (B) 4 and (C) 5 from the stages 4a and 5a to the front buffer 4b and buffer 5b (step 26-5). Then the process queuing lot table prepared by the process queuing lot table preparation program in FIG. 25 for the processor 3, 4 or 5 in question is read in (step 26-6). The contents of the process queuing lot table are rearranged so that the cassette entries (i.e., data items) therein will occur in order of decreasing precedence (step 26-7). A search is made through the process queuing lot table for any of the reserve flags having their temporary data (called temporary reserve flags hereunder) turned on (step 26-8). Step 26-8 in FIG. 26 is followed by step 27-9 in FIG. 27 by way of point (A) in both flowcharts. A check is made to see if any temporary reserve flags are turned on (step 27-9).

If any temporary reserve flag is found to be on, comparisons are made between the predicted supply time obtained in step 26-5 and the transport task execution times in the process queuing lot table, from the first cassette up to a cassette 2 for which the reserve flag is set, so as to find the cassette 2 whose transport time data is smaller than the predicted time and which is closest to the first cassette (step 27-10). A check is made to see if any cassette 2 meeting the conditions of step 27-10 exists (step 27-11). If a candidate cassette 2 is found, a check is made to see if that cassette is the same as that for which the temporary reserve flag has been turned on (step 27-12). If the cassette 2 is found to be the same one, step 26-2 is reached again. If the cassette 2 turns out to be different, the temporary reserve flag for that cassette is turned on whereas the temporary reserve flag for the other cassette is turned off (step 27-13). Thereafter, step 26-2 is reached again.

If it is judged in step 27-11 that there exists no cassette 2 whose transport time data is smaller than the predicted supply time, the real data of a reserve flag (called the real reserve flag hereunder) is turned on for the cassette 2 whose temporary reserve flag has been on (step 27-14). Transport task data about the task of transporting the cassette 2 from its current in-process site to the next processor 3, 4 or 5 is prepared (step 27-15). The data thus prepared is written to a transport task queuing table (step 27-16). FIG. 53 shows an example of the transport task queuing table to which to write the transport task data.

As shown in FIG. 53, the transport task queuing table comprises ID data about the cassette 2 in question, transport source data representing the current in-process site of the cassette 2, transport destination data denoting the location to which the cassette 2 is to be transported, transport route data, transport time data, and predicted supply time data. The transport time data falls into two categories: the total time required to transport the cassette from the source to the destination, and the transport task execution unit time for each of the transport tasks involved. Unlike conventional transport task queuing tables, the inventive table has its transport source and destination data supplemented by the region data discussed in connection with FIGS. 51 and 52. Also included in the table are the transport route data and transport task execution time data taken from the process queuing lot table, as well as the transport task execution unit time data from the transport task execution unit time table. The transport task queuing table is further supplemented by the predicted supply time data obtained in step 26-5.

Figure 11:
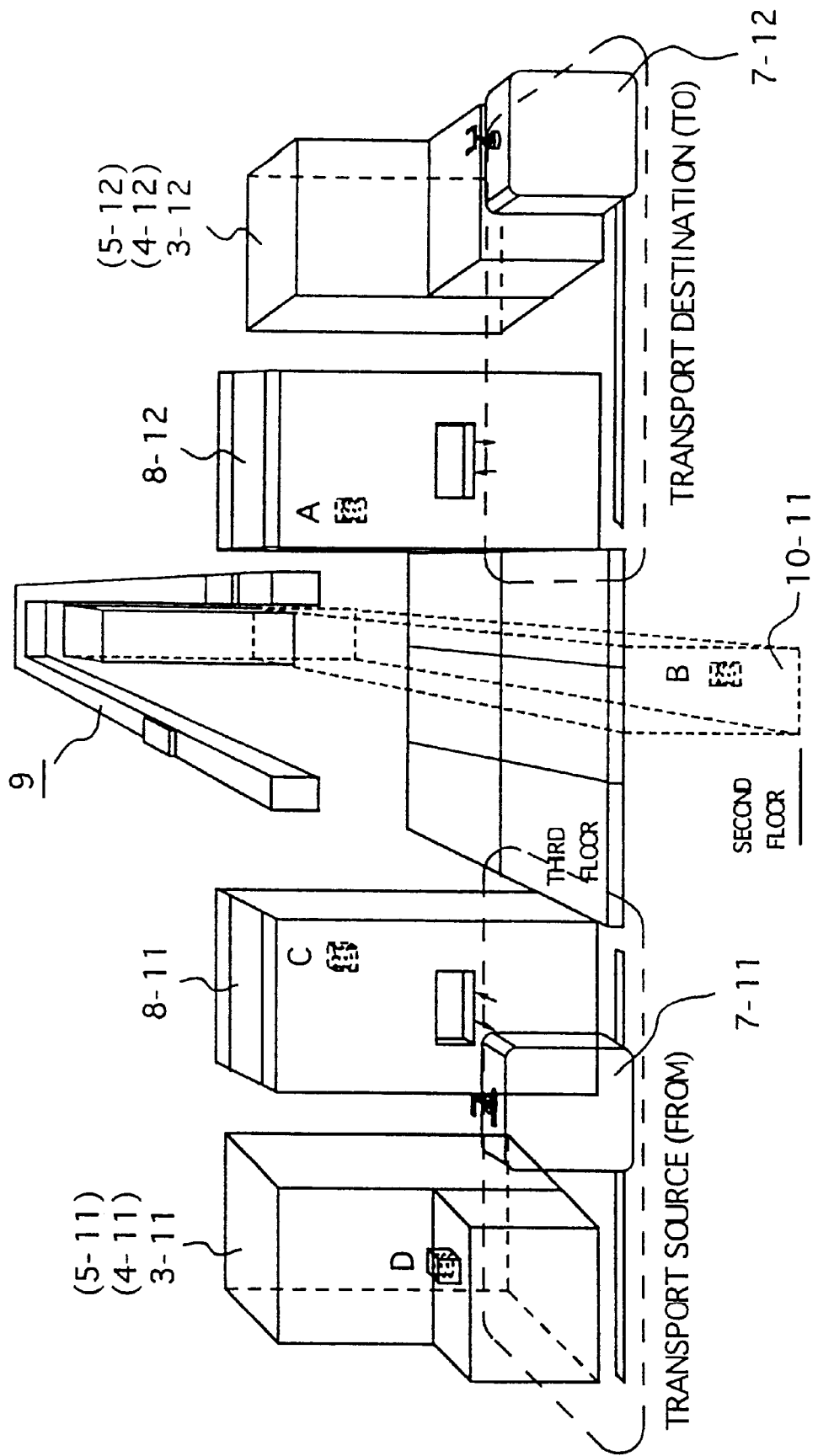
FIG. 11 is a schematic view of a minimal model of the semiconductor fabrication equipment as it handles cassettes.

The data set in the table of FIG. 53 will now be described with reference to FIG. 11. The D cassette 2 is currently located in the processor (A) 3-11 and is to be transported to the next processor (A) 3-12. The transport route involved here passes through the processor (A) 3-11 (transport source), AGV 7-11, bay stocker 8-11, OHS 9, bay stocker 8-12, AGV 7-12, and processor (A) 3-12 (transport destination), in that order. The time required to transit the transport route is made up of "td1" from the processor (A) 3-11 to the bay stocker 8-11, "td2" from the bay stocker 8-11 to the bay stocker 8-12, and "td3" from the bay stocker 8-12 to the processor (A) 3-12. The total transport time is predicted to be "td" and the predicted supply time is "tp."

Referring again to the flowcharts of FIGS. 26 and 27, step 27-16 where the writing of data to the transport task queuing table has been completed is followed by step 26-2. If the check in step 27-9 detects no cassette 2 for which the temporary reserve flag is on, comparisons are made between the predicted supply time obtained in step 26-5 and the transport task execution times in the process queuing lot table, from the first cassette 2 up to the last one, to find the cassette 2 whose transport time data is smaller than the predicted time and which is closest to the first cassette (step 27-17). A check is made to see if any cassette 2 meeting the conditions of step 27-17 exists (step 27-18). If a candidate cassette 2 is found, the temporary reserve flag for that cassette is turned on (step 27-13), and step 26-2 is reached again.

If it is judged in step 27-18 that there is no cassette 2 whose transport time data is smaller than the predicted supply time, the real reserve flag is turned on for the cassette 2 whose transport time is the shortest (step 27-19). Transport task data about the task of transporting the cassette 2 from its current in-process site to the next processor 3, 4 or 5 is prepared (step 27-20). The data thus prepared is written to the transport task queuing table (step 27-21). The transport task queuing table to which to write the data in step 27-21 is the same as that to which data was written in step 27-16. Step 27-21, with its write operation completed, is followed by step 26-2.

The description above has covered the predicted transport task preparation program. As an alternative to the foregoing setup, the host 12 may be provided with what may be termed device status data indicating the operating status of such transport devices as the bay stockers 8, OHS 9 and AGVs 7. When a single cassette 2 is to be selected in step 27-10 or 27-17, the host 12 may verify the device status data about all transport devices constituting the transport route in question, whereby any faulty transport device is detected. If any one of the transport devices making up the transport route is found defective and inoperable, the corresponding cassette 2 will not be selected. Whereas the host 12 was shown waiting for a remaining process time report from the processors 3, 4 and 5 in step 26-3 above, this is not limitative of the invention. Alternatively, the host 12 may predict the time it will take to complete the process in question before sending a process start instruction to each of the processors 3, 4 and 5. On receiving a process start report from any of the processors, the host 12 may start a timer so as to compute remaining process times at predetermined intervals. In this manner, events may be generated as if remaining process time reports were being received from the processor 3, 4 or 5.

Figure 28:
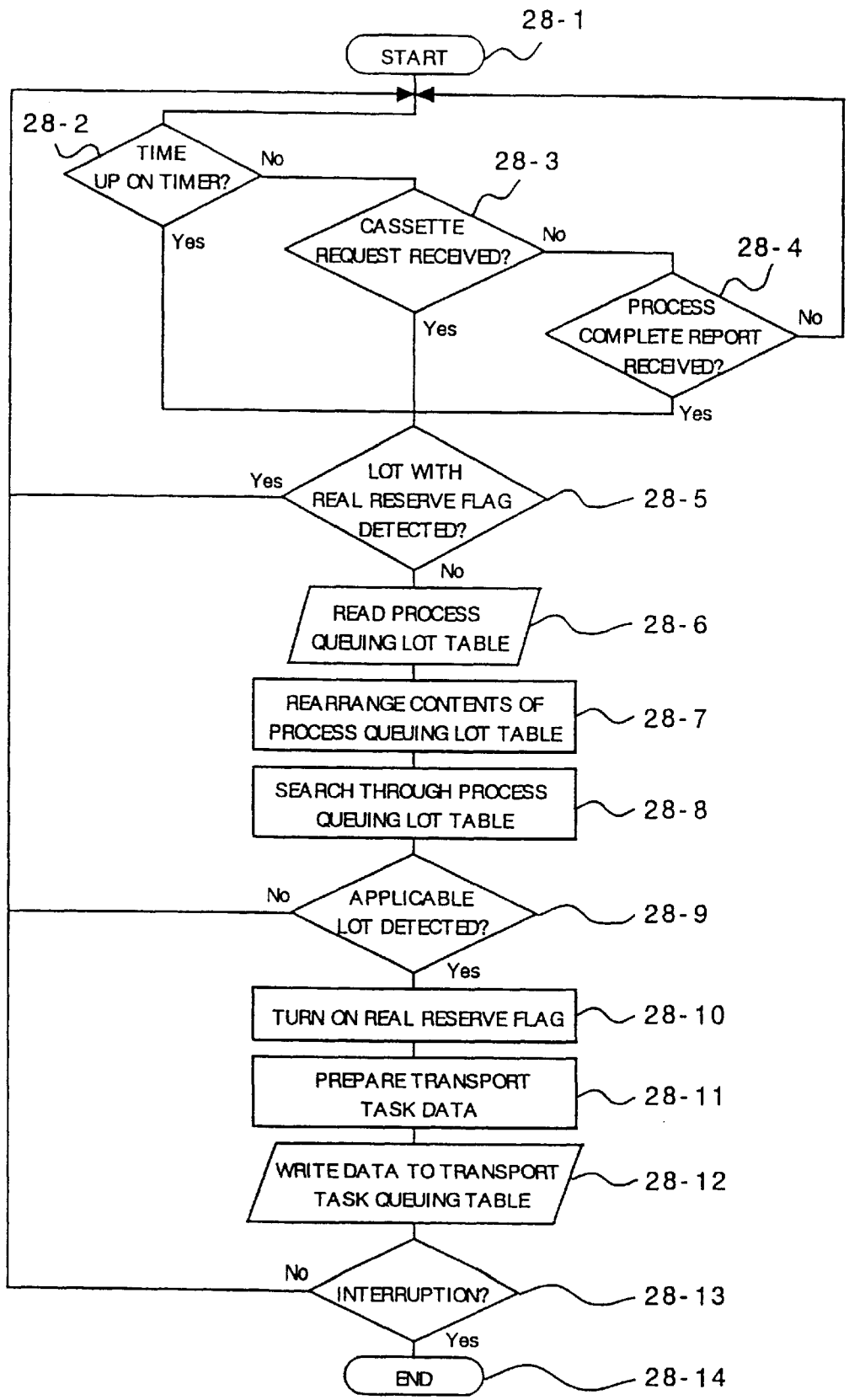
FIG. 28 is a flowchart of steps describing a transport task preparation program according to the invention.

FIG. 28 is a flowchart of steps describing the transport task preparation program according to the invention. The transport task preparation program is started in step 23-5 of the semiconductor wafer supply control (pull) program in FIG. 23 by the host 12 of the first embodiment (step 28-1). Thus started, the transport task preparation program checks to see if time is up repeatedly on a timer provided in the host 12 for each of the processors 3, 4 and 5 (step 28-2). If time-up has yet to be detected, the program receives a cassette request sent either from step 12-3 of the automatic control program of the processor (A) in FIG. 12, or from step 13-7 of the corresponding processing task control program in FIG. 13. Also received is a cassette request sent from step 16-3 of the automatic control program for the processors (B) 4 and (C) 5 in FIG. 16 or from step 17-7 of the corresponding buffer storage control program in FIG. 17 (step 28-3). If no cassette request is received yet, a check is made to see if a process complete report is received from step 13-5 of the processing task control program in FIG. 13 or from step 20-5 of the same program in FIG. 20 (step 28-4). Following any one of these steps, a check is made to see if there is no preceding in-process cassette 2 moving towards the stage 3a, 4a or 5a of the processor 3, 4 or 5 in question (step 28-5).

If there exists a preceding cassette 2 being transported, step 28-2 is reached again. If no preceding cassette 2 is detected in step 28-5, the above-described process queuing lot table is read in (step 28-6). The contents of the process queuing lot table are rearranged so that the cassette entries therein will occur in order of decreasing precedence (step 28-7). A search is made consecutively through the process queuing lot table, in ascending order of transport task execution time periods, for any applicable cassette 2 (step 28-8). Through the search, a check is made to see if any applicable cassette 2 exists in the table (step 28-9). If no applicable cassette 2 is found to exist, step 28-2 is reached again. If an applicable cassette 2 is detected, the real reserve flag for that cassette is turned on in the process queuing lot table so that the cassette will not be transported to the stage 3a, 4a or 5a of the processor 3, 4 or 5 (step 28-10). Thereafter, transport task data about the cassette 2 in question is prepared (step 28-11), and the data is written to the transport task queuing table (step 28-12).

At the end of the write operation, a check is made to see if any interruption has occurred (step 28-13). If no interruption is detected, step 28-2 is reached again. If an interruption is found to have occurred, the transport task preparation program is terminated (step 28-14). The transport task queuing table to which to write the data in step 28-12 is the same as that used in steps 27-16 and 27-21 of FIG. 27. Because predicted supply time data to be set in this table has yet to be computed by the transport task preparation program, zero is written in place of the data in step 27-12.

Figure 29:
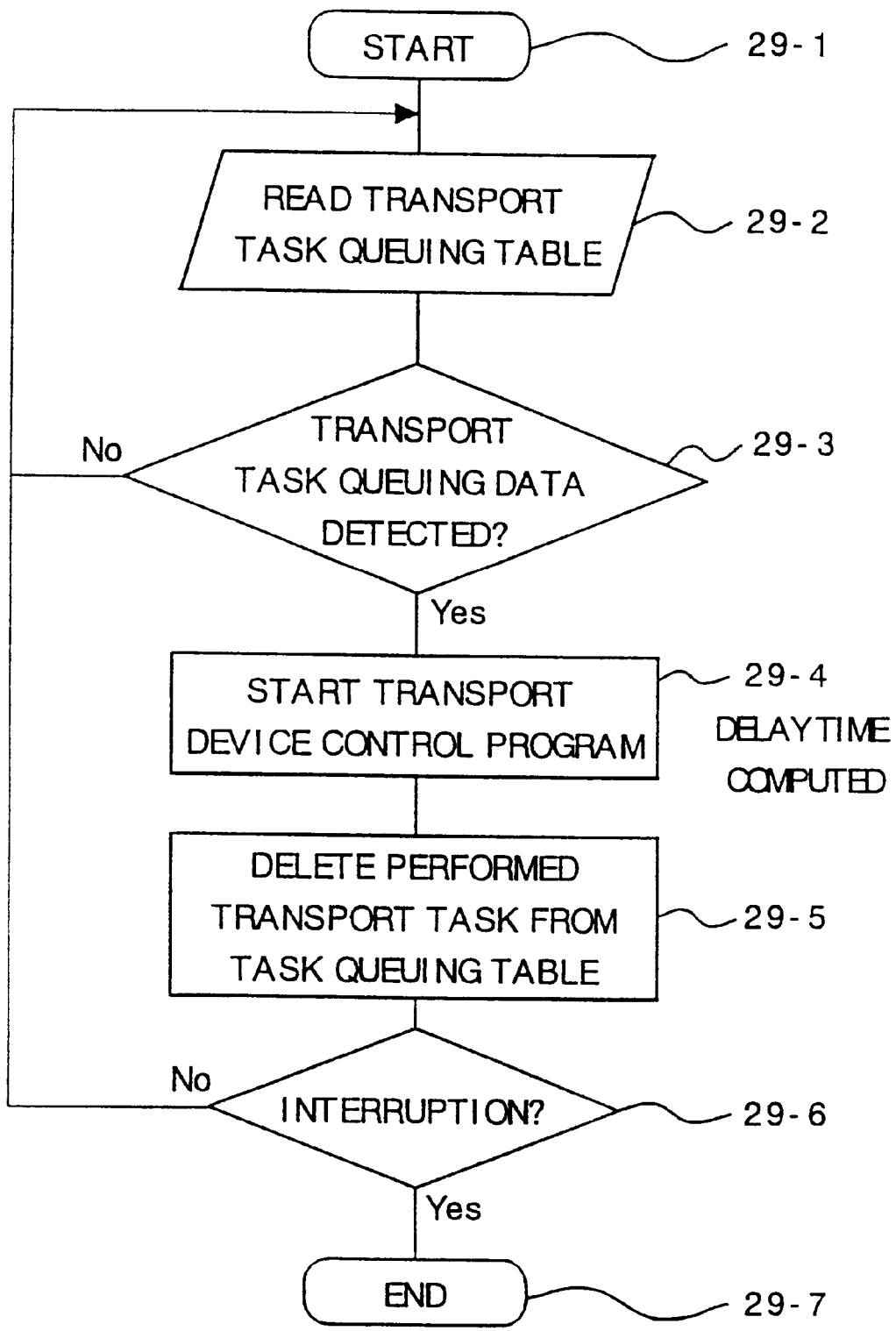
FIG. 29 is a flowchart of steps describing a transport task execution control program according to the invention.

FIG. 29 is a flowchart of steps describing the transport task execution control program according to the invention. The program shown in FIG. 29 is started in step 23-6 of the semiconductor wafer supply control (pull) program in FIG. 23 residing in the host 12 of the first embodiment (step 29-1). Thus started, the program reads in the transport task queuing table (step 29-2). A check is made on the table to see if there exist any queuing transport tasks (step 29-3). If no such transport task is detected, step 29-2 is reached again. If applicable transport tasks are found, a transport device control program is started to execute the first transport task set in the transport task queuing table using such transport devices as the bay stocker 8, AGV 7 and OHS 9 (step 29-4). When the host 12 sends transport task instructions to such transport devices as the bay stocker 8, AGV 7 and OHS 9, the instructions unlike their conventional counterparts include two parameters each: a delay time defined as explained below, and transport task execution unit time data applicable to the transport task in question and set in the transport task queuing table.

The delay time mentioned above has two definitions: (1) transport task execution time data set in the transport task queuing table, minus the time that has elapsed since entry of the data into that table, minus the sum of the transport task execution unit times of the remaining transport tasks; and (2) transport task execution time data set in the transport task queuing table, minus the actual time it took to carry out the transport task in question as reported from each transport device controller along the transport route, minus the sum of the transport task execution unit times of the remaining transport tasks.

When the process performed by the transport device control program started in step 29-4 has ended, the data about the cassette 2 in question is erased from the process queuing lot table. After the performed transport task is deleted from the transport task queuing table (step 29-5), a check is made to see if any interruption has occurred (step 29-6). If no interruption is detected, step 29-2 is reached again. If an interruption is found to have occurred, the transport task execution control program is terminated (step 29-7). If the transport source is the processor (B) 4 or (C) 5, the evacuation of cassettes from the front buffer 4b and buffer 5b onto the stages 4a and 5a is accomplished in step 29-4.

Typical transport tasks such as those set in the table of FIG. 52 are handled as follows: in step 29-4, the host 12 issues a first task instruction over the communication cable 13 to the bay stocker 8-11 telling the latter to carry the D cassette 2 from the processor (A) 3-11 to the bay stocker 8-11. The first task instruction includes a delay time (=td−elapsed time−(td1+td2+td3)) and a transport task execution unit time (=td1). When the task is complete, the host 12 then issues a second task instruction over the communication cable 13 to the OHS 9 telling the latter to transport the D cassette 2 from the bay stocker 8-11 to the bay stocker 8-12. The second task instruction includes a delay time (=td−elapsed time−(td2+td3)) and a transport task execution unit time (=td2). Thereafter, the host 12 issues a third task instruction over the communication cable 13 to the bay stocker 8-12 telling the latter to carry the D cassette 2 from the bay stocker 8-12 to the processor (A) 3-12. The third task instruction includes a delay time (=td −elapsed time −td3) and transport task execution unit time (=td3). As defined above, each elapsed time in the parentheses is obtained by taking into account either the time that has elapsed since entry of the data into the transport task queuing table, or the time it actually took to perform the transport task as reported from the transport device controller in question.

Figure 30:
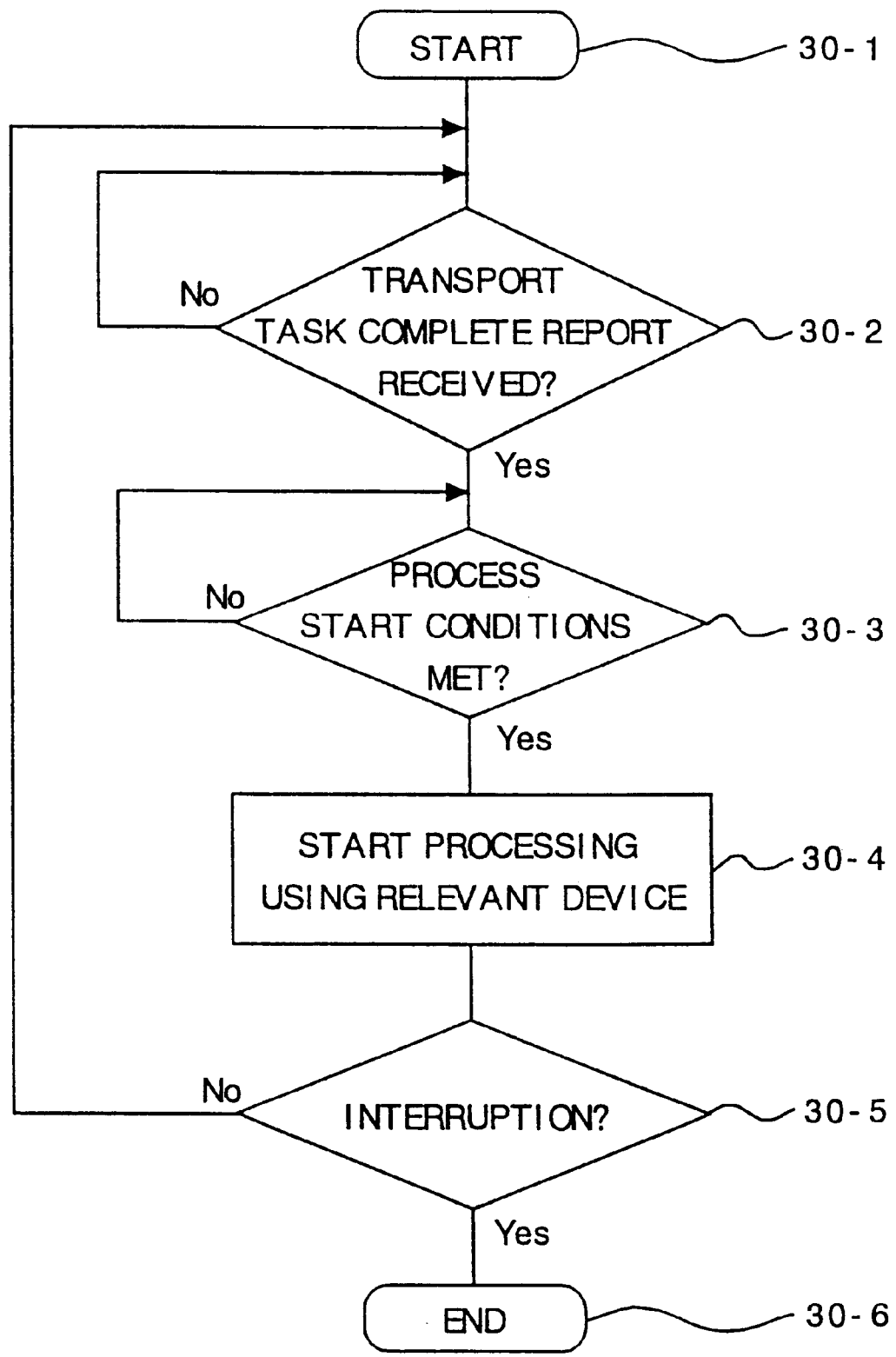
FIG. 30 is a flowchart of steps describing a process control program according to the invention.

FIG. 30 is a flowchart of steps describing the process control program according to the invention. The process control program shown in FIG. 30 is started in step 23-7 of the semiconductor wafer supply control (pull) program in FIG. 23 residing in the host 12 of the first embodiment (step 30-1). After being started, the program waits for and receives a transport task complete report from the transport task execution control program in the host 12 confirming that the cassette 2 has been carried to the stage 3a, 4a or 5a of the processor 3, 4 or 5 in question (step 30-2). A check is made to see if the processor 3, 4 or 5 is ready to start its processing (step 30-3). If the processor is found ready, its processing is started (step 30-4). A check is made to see if any interruption has occurred (step 30-5). If no interruption is detected, step 30-2 is reached again. If an interruption is found to have occurred, the process control program is terminated (step 30-6). A process start instruction sent by the host 12 in step 30-4 is received by the processor (A) 3 in step 12-4 of FIG. 12, and by the processors (B) 4 and (C) 5 in steps 17-2 of FIG. 17 and in step 19-2 of FIG. 19.

As described, the semiconductor wafer supply control (pull) program of the first embodiment and the related programs accomplish three categories of work: computing the predicted supply time of the next cassette 2 based either on the remaining process time sent from the processor 3, or 5, or on the program-computed remaining process time; selecting as the next cassette 2 the one that has the highest priority among those which, regardless of their current in-process sites, can arrive in time; and accurately completing the transport task in question within the predicted supply time.

The semiconductor wafer supply control (pull) program of the first embodiment has been described above. Explained below are the workings of the transport control program of the first embodiment residing and operating in such transport device controllers as the bay stocker controller 8x, overflow stocker controller 10x, OHS controller 9x and AGV controller 7x. These are the controllers that carry out the actual transport tasks after being started by the host 12 issuing the transport task instructions in step 29-4 of the transport task execution control program in FIG. 29.

Figure 31:
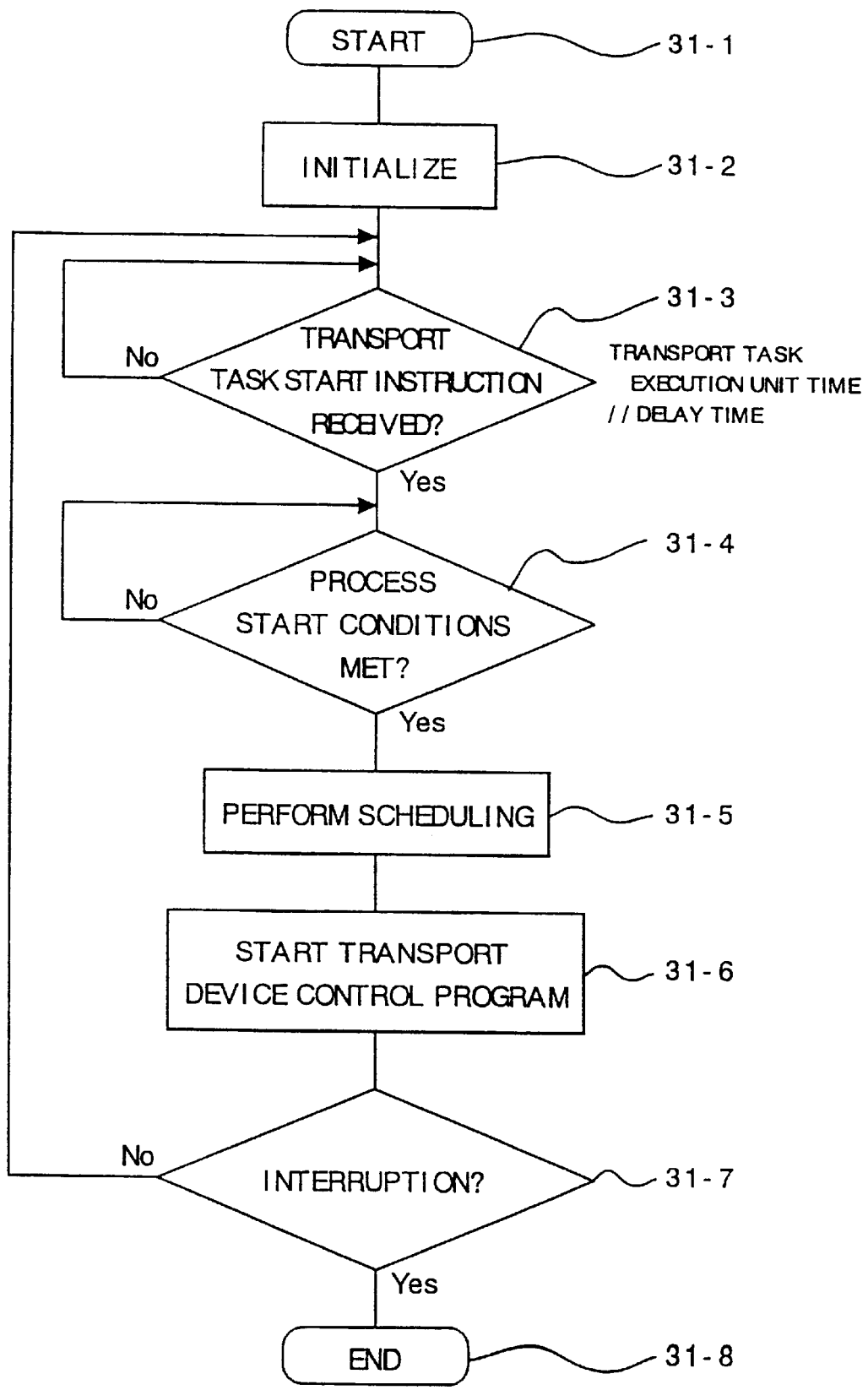
FIG. 31 is a flowchart of steps describing a transport control program used by a transport device controller according to the invention.

FIG. 31 is a flowchart of steps describing the transport control program of the first embodiment for use by the transport device controllers. In FIG. 31, when the transport device controllers are started (step 31-1), all device components are initialized and their performance is verified (step 31-2). Each transport device controller waits for a transport task instruction coming from the immediately upstream controller (step 31-3). The transport task instruction from the host 12 includes delay time data and transport task execution unit time data, as described in connection with step 29-4 in FIG. 29. With the transport task instruction received, a check is made on the component status and the status of the preceding transport task (step 31-4). Transport task start times and task priorities are scheduled on the basis of the delay time data and transport task execution unit time data set in the transport task instruction (step 31-5). Specifically, the transport task execution unit time data minus the delay time data is used as a target transport time for the scheduling. Then a transport device control program is started to control each transport device performing the applicable transport task (step 31-6). A check is made to see if any interruption has occurred (step 31-7). If no interruption is detected, step 31-3 is reached again. If an interruption is found to have occurred, the transport control program is terminated (step 31-8). The upstream controller transmitting the transport work instruction in step 31-3 acts in the same manner as in the conventional setup.

Figure 32:
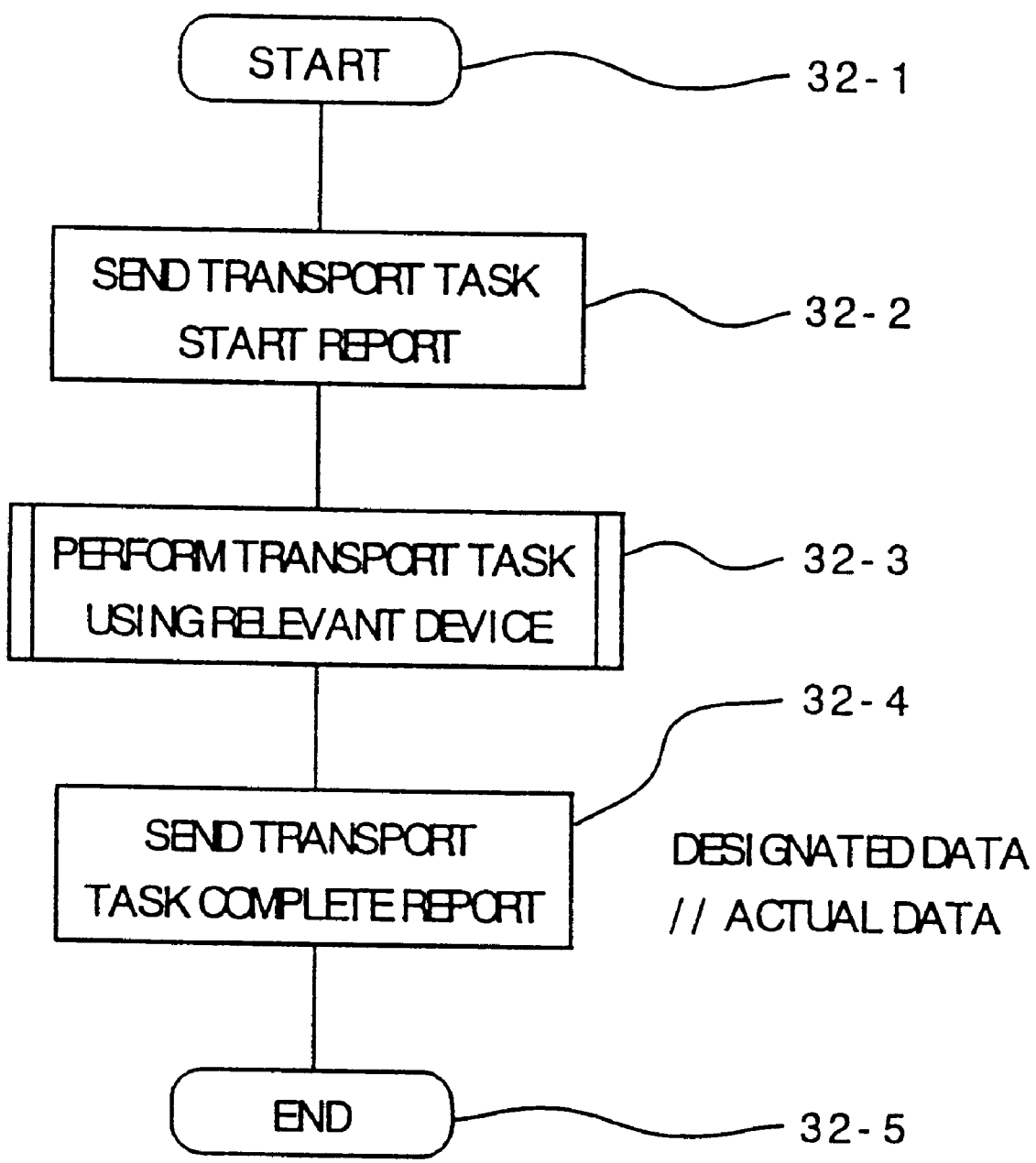
FIG. 32 is a flowchart of steps describing a transport device control program according to the invention.
Figure 45:
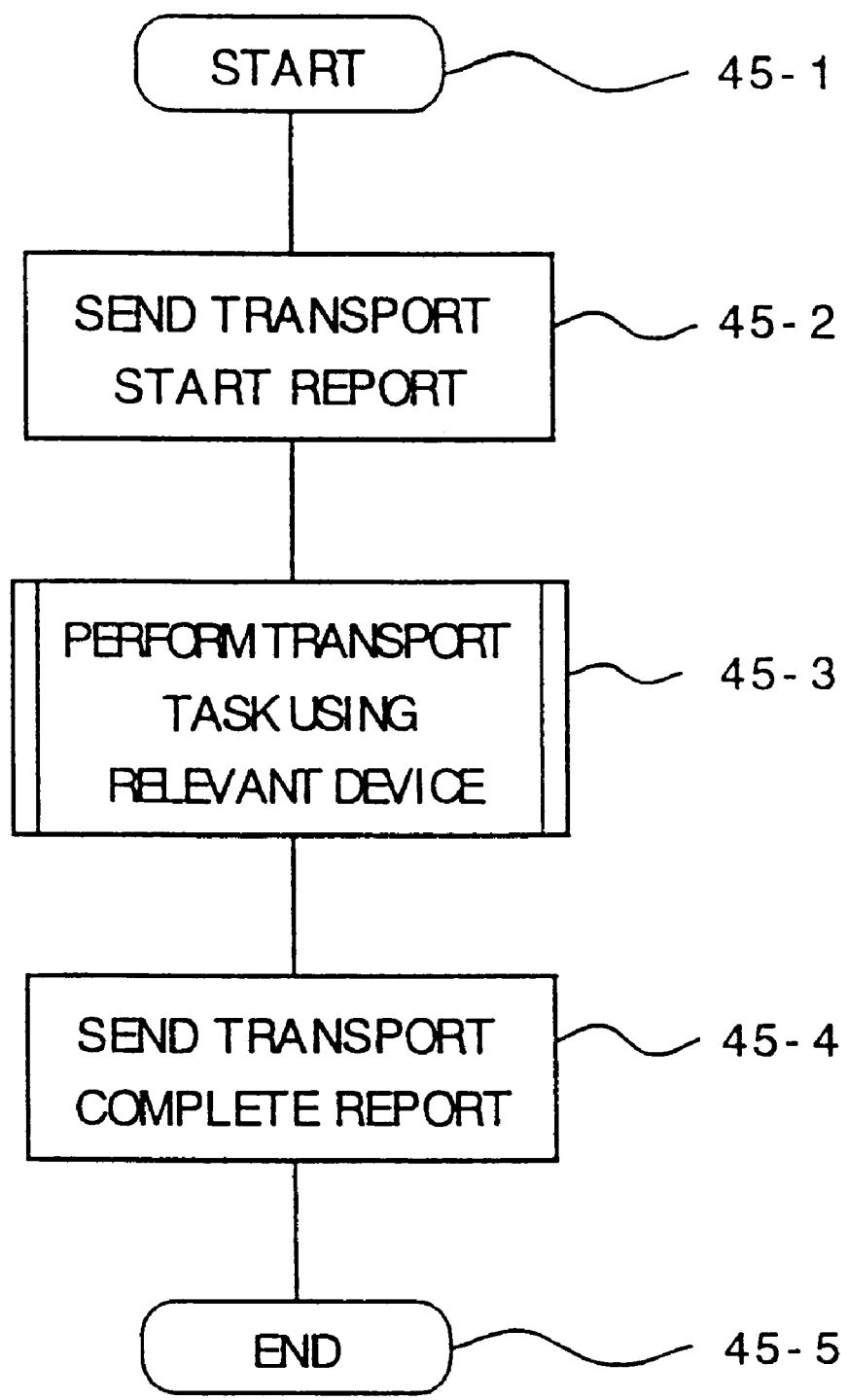
FIG. 45 is a flowchart of steps describing a conventional transport device control program.
Figure 46:
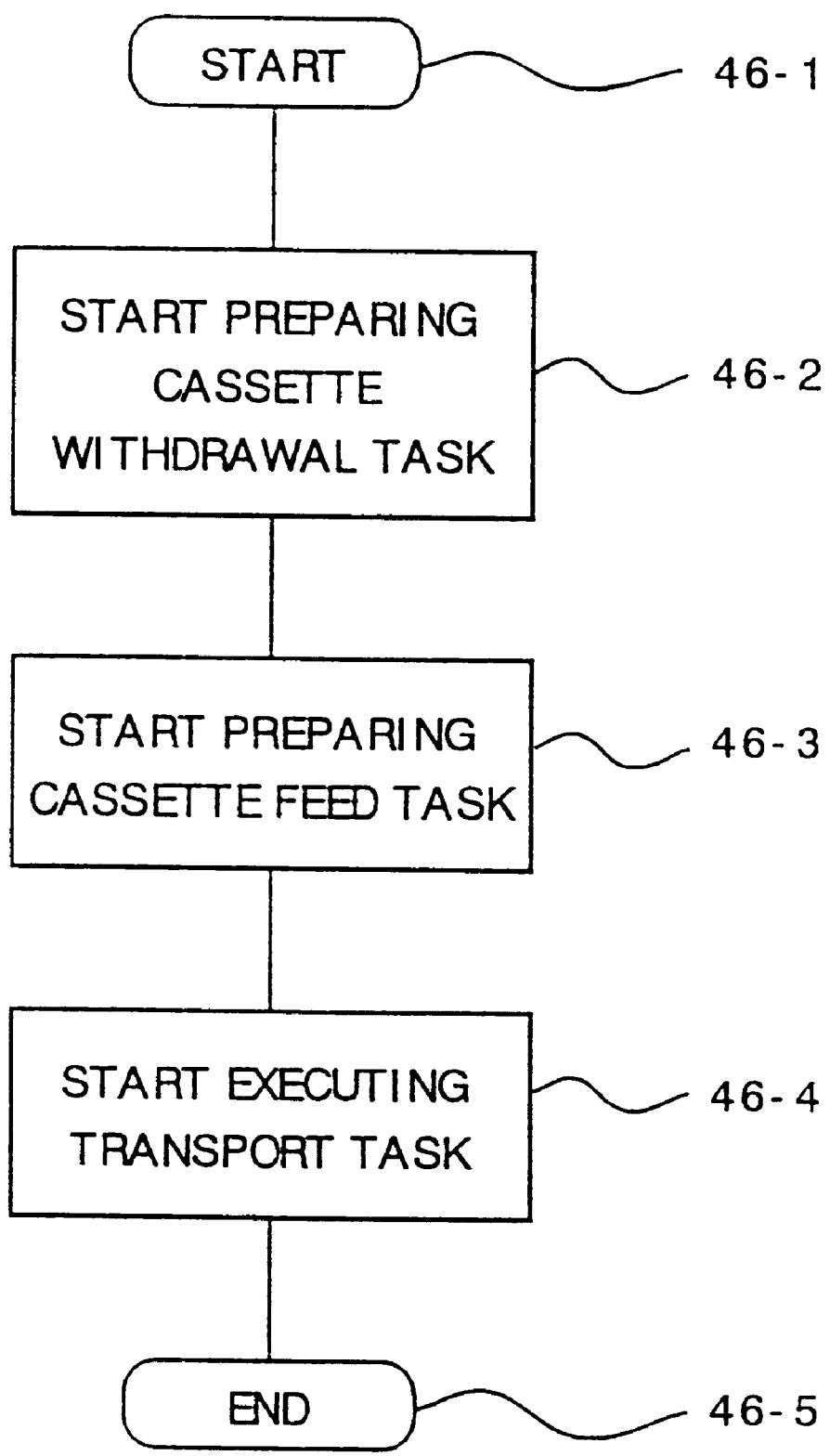
FIG. 46 is a flowchart of steps describing a conventional semiconductor wafer output control (push) program.
Figure 47:
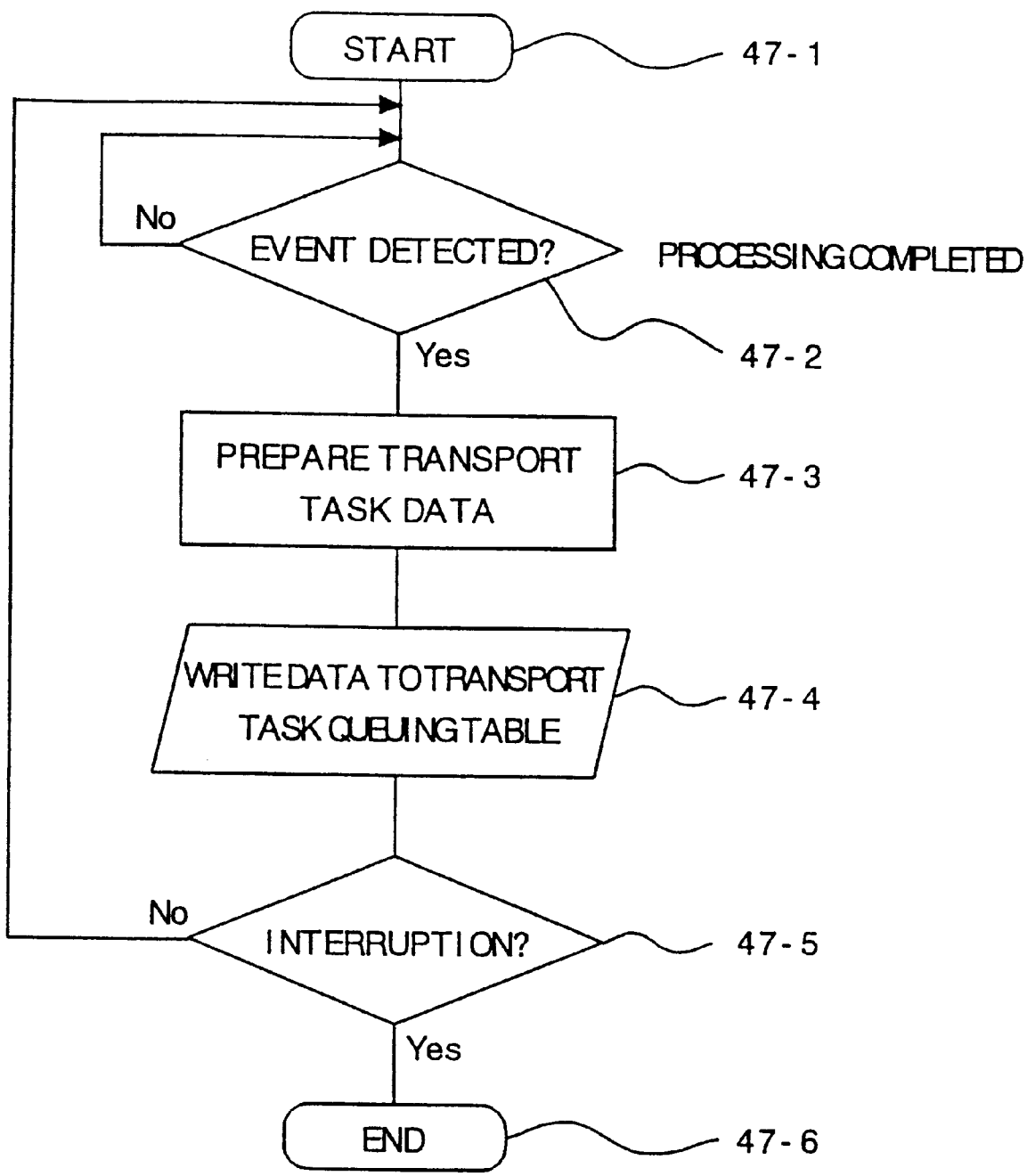
FIG 47 is a flowchart of steps describing a conventional cassette withdrawal task preparation program.
Figure 48:
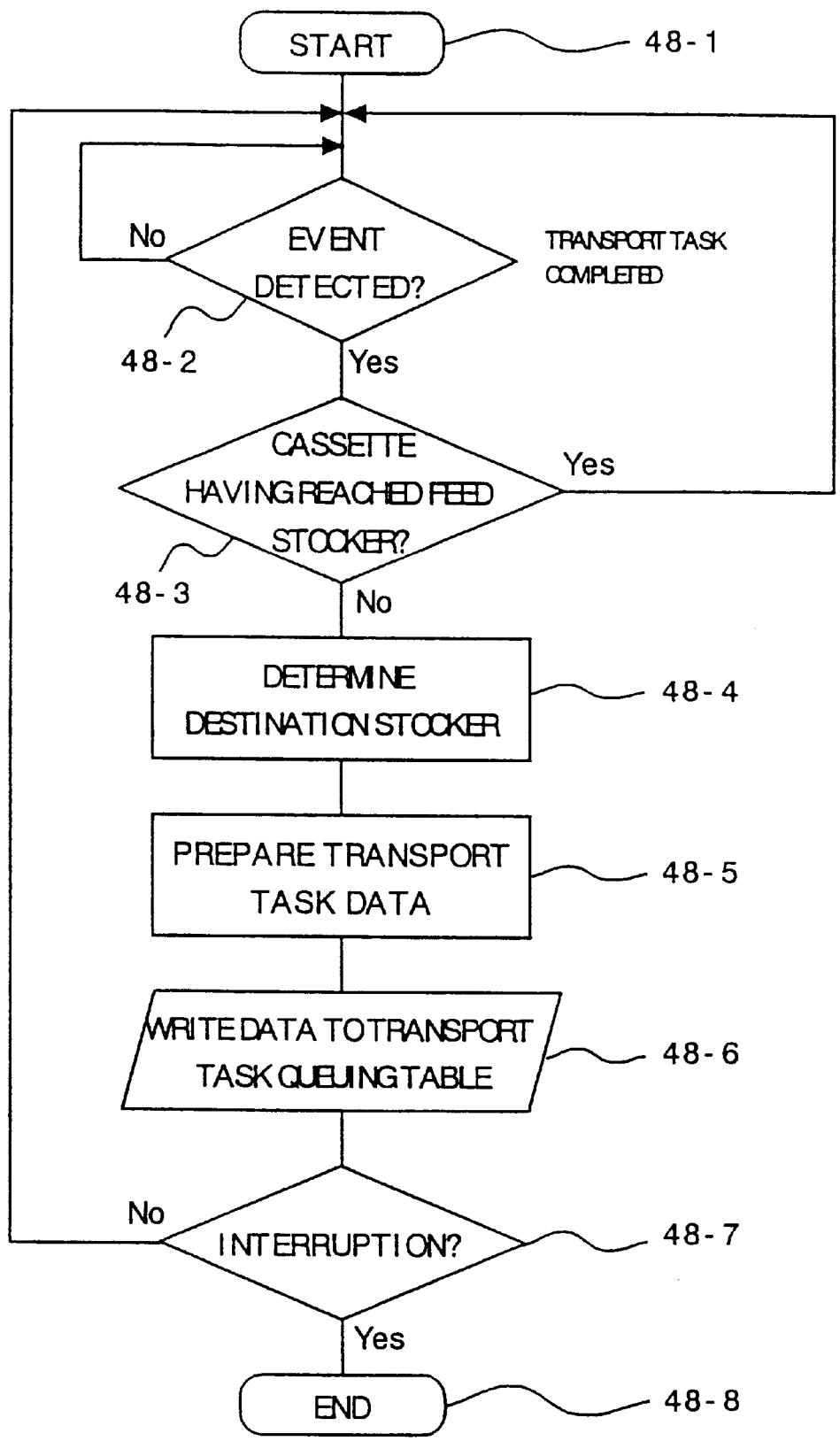
FIG. 48 is a flowchart of steps describing a conventional cassette feed task preparation program.
Figure 49:
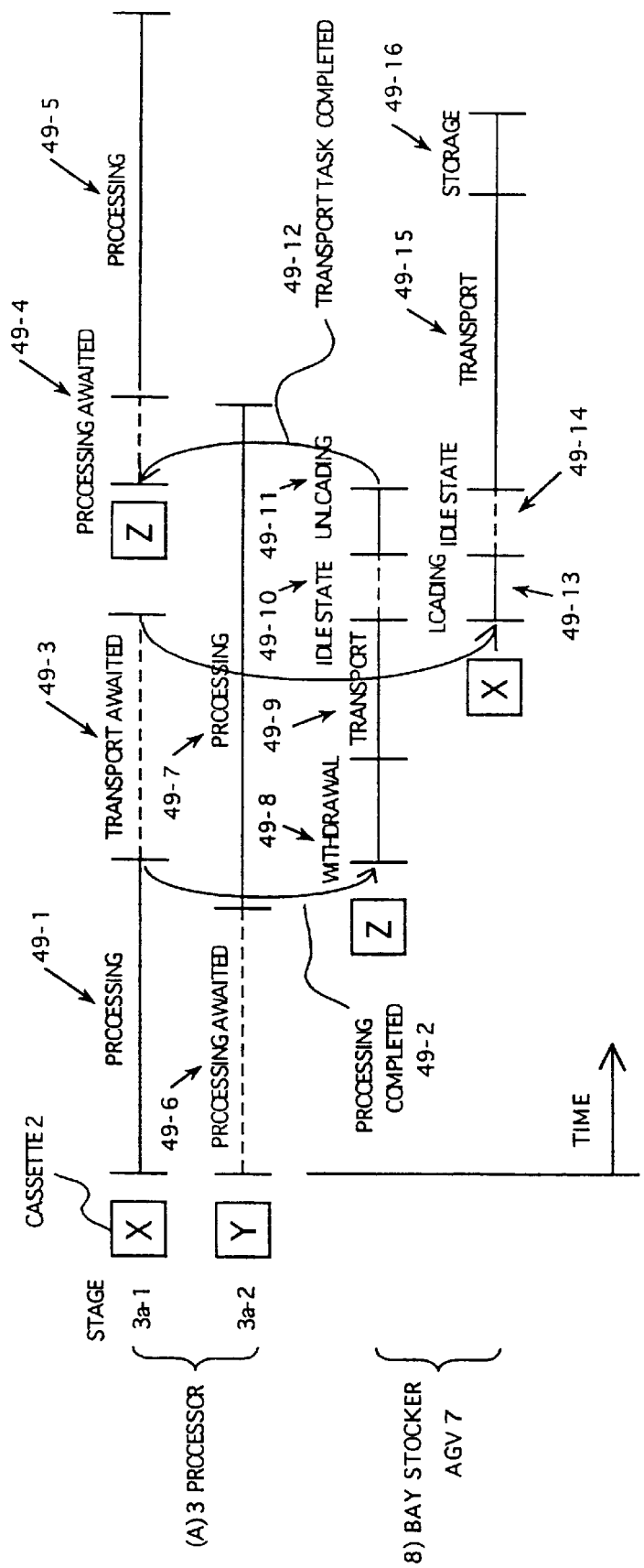
FIG. 49 is a timing chart for transport tasks under a conventional transport control method used by semiconductor fabrication equipment exemplified by the processor (A)

FIG. 32 is a flowchart of steps describing the transport device control program according to the invention. The transport device control program in FIG. 32 of the first embodiment residing in the transport device controllers is started in step 31-6 of the transport control program in FIG. 31 for the transport device controllers (step 32-1). With the program started, each transport device controller sends a transport task start report to the upstream controller that has transmitted the transport task instruction (step 32-2). The actual transport task is carried out by use of the appropriate component devices (step 32-3). With the transport task completed, the transport device controller in question sends a transport task complete report to the same upstream controller to which the transport task start report was sent earlier (step 32-4). The transport device control program is then terminated (step 32-5).

Where delay time data and transport task execution unit time data are found set in each transport task instruction, the transport task complete report sent in step 32-4 is set with the actually elapsed transport task time and the transport task execution unit time data. The specific work performed by each transport device controller in step 32-4 is the same as that carried out in step 45-3 of the conventional setup in FIG. 45, except for the following aspect: in step 32-3, the bay stocker controller 8x receives the transport task instruction from the host 12 and moves accordingly the cassette 2 to the OHS port 8e, without stopover in the cassette shelves 8c, from the AGV port 8d to which the cassette 2 had been brought by the AGV 7 from the processor 3, 4 or 5. In the reverse direction, the bay stocker controller 8x transports the cassette 2 from the OHS port 8e to the AGV port 8d without stopover in the cassette shelves 8c, and forwards the cassette 2 from the AGV port 8d on to the processor 3, 4 or 5 using the AGV 7. In this manner, even if a given bay stocker 8 is full of cassettes and has no room for more, that bay stocker 8 is allowed to act as a relaying device in terms of transport to the destination processor 3, 4 or 5.

As described, the transport control program and transport device control program for the transport device controllers of the first embodiment permit scheduling transport task start times and task priorities based on the delay time data and transport task execution unit time data included in the transport task instructions from the host 12, whereby transport work is completed as planned by the host 12. In addition, the bay stocker controller 8x is allowed to act as means of connection in terms of transport, carrying cassettes 2 directly between the OHS port 8e and the AGV port 8d.

The semiconductor wafer output control (push) program of the first embodiment will now be described. Each cassette 2 has been processed so far by the automatic control program in FIG. 12 and the processing task control program in FIG. 13 for the processor (A), as well as by the automatic control program in FIG. 16 and the processing task control program in FIG. 20 for the processors (B) 4 and (C) 5. Under the semiconductor wafer output control (push) program and its related programs, each cassette 2 following the above processing will now be transported from the corresponding processor to a withdrawal stocker 8 or 10, to be described later, and on to a feed stocker 8 or 10, also described later, of the processor 3, 4 or 5 that will perform the next process of fabrication. The moniker "push" signifies that the processor 3, 4 or 5 sends out the cassette 2 to the bay stocker 8 or to processing means at the transport destination.

Figure 33:
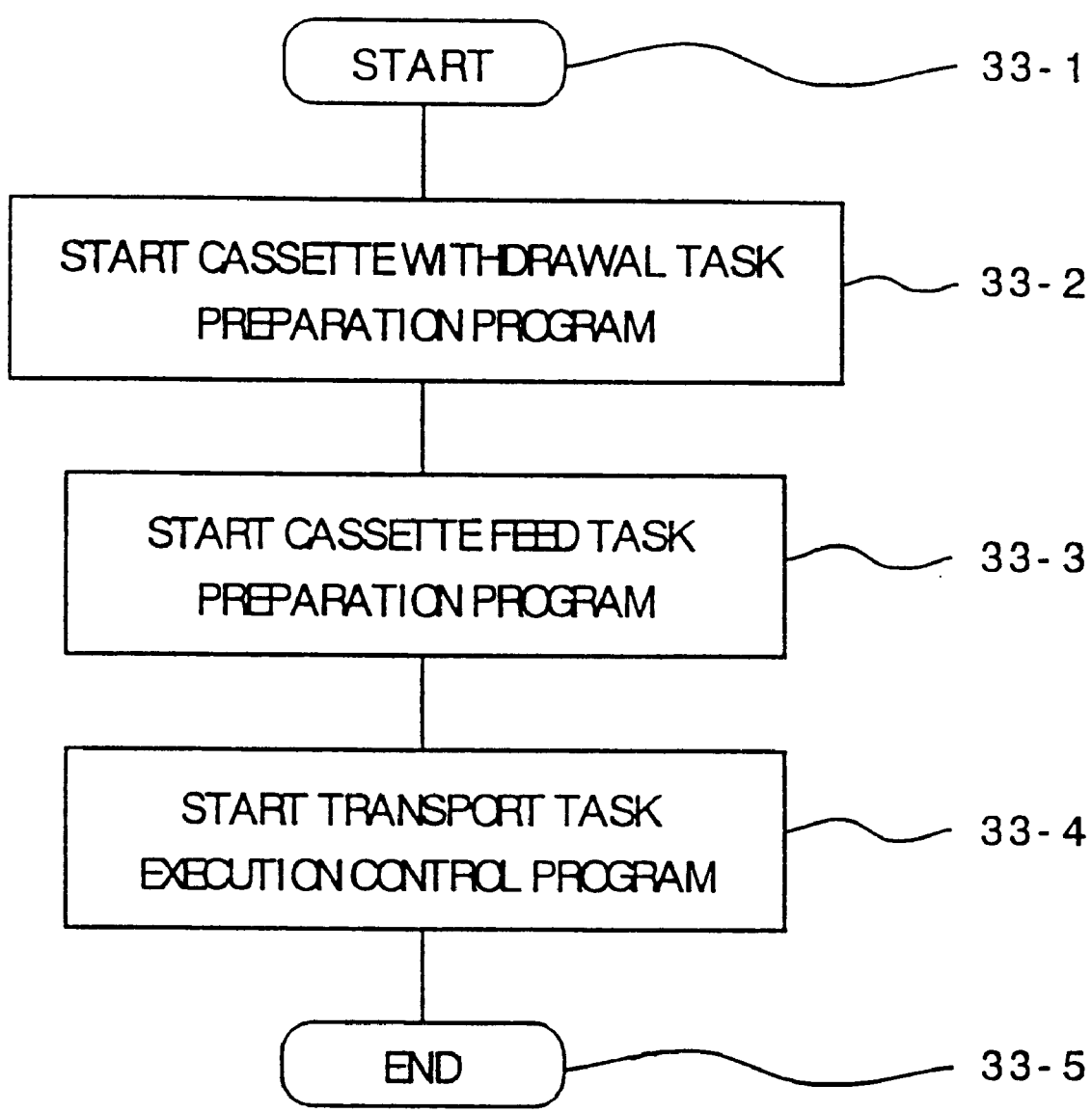
FIG. 33 is a flowchart of steps describing a semiconductor wafer output control (push) program according to the invention.

FIG. 33 is a flowchart of steps describing the semiconductor wafer output control (push) program of the first embodiment. In FIG. 33, with the host 12 started (step 33-1), a cassette withdrawal task preparation program is started to withdraw the processed cassette 2 from the processor 3, 4 or 5 into the withdrawal stocker 8 or 10 determined according to a cassette withdrawal stocker table of the processor in question (step 33-2). Then a cassette feed task preparation program is started to feed a cassette 2 which is not housed in a given feed stocker 8 or 10 included in feed stocker table and which is to be fed to that stocker 8 or 10 of the processor 3, 4 or 5 that will perform the next process of fabrication (step 33-3). In line with the transport task queuing table having data written thereto by the programs started in steps 33-2 and 33-3, the transport task execution control program is started (step 33-4). This terminates the series of processes making up the semiconductor wafer output control program (step 33-5).

Figure 34:
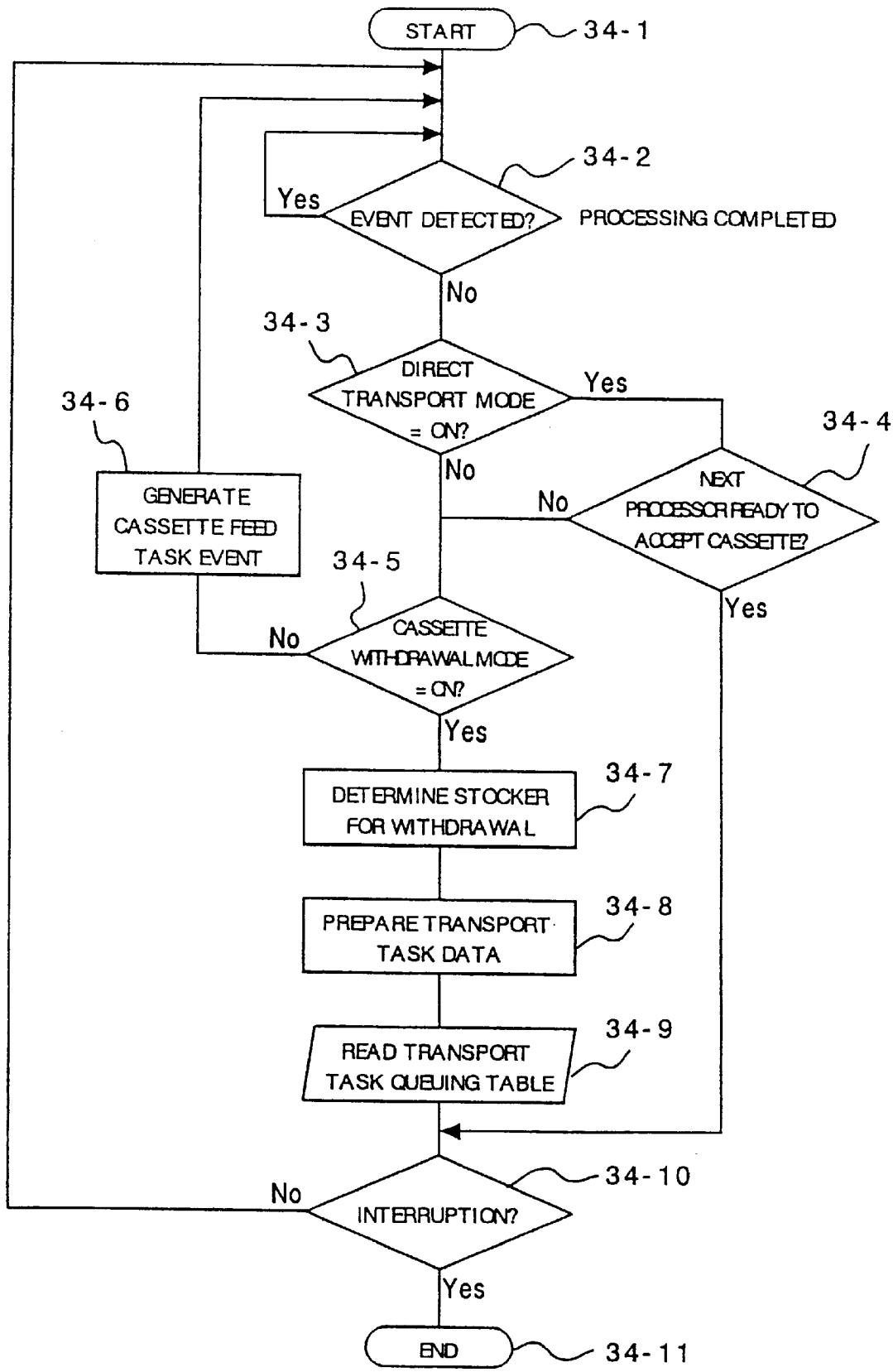
FIG. 34 is a flowchart of steps describing a cassette withdrawal task preparation program according to the invention.
Figure 35:
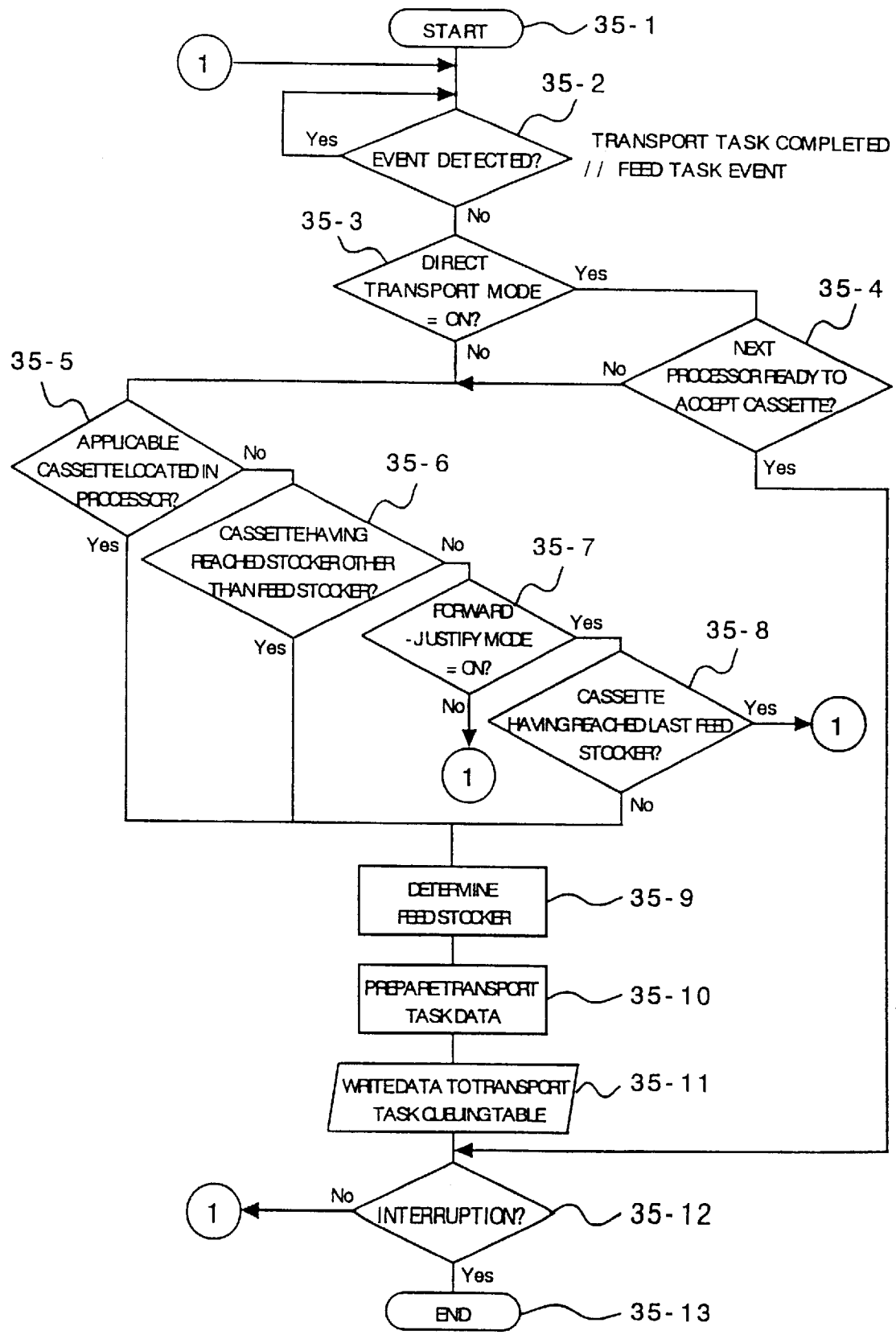
FIG. 35 is a flowchart of steps describing a cassette feed task preparation program according to the invention.

FIG. 34 is a flowchart of steps describing the cassette withdrawal task preparation program according to the invention. The program of FIG. 34 is started in step 33-2 of the semiconductor wafer output control (push) program of the first embodiment. FIG. 35 is a flowchart of steps describing the cassette feed task preparation program according to the invention. The program of FIG. 35 is started in step 33-3 of the "push" program of the first embodiment.

The transport task execution control program started in step 33-4 is the same as that explained with reference to FIG. 29 and thus will not be described further. FIG. 54 shows an example of the cassette withdrawal stocker table used in step 33-2. In this table, stockers 8 and 10 into which to withdraw processed cassettes 2 are determined for each of the processors 3, 4 and 5. FIG. 55 shows an example of the cassette feed stocker table used in step 33-3.

In the cassette feed stocker table, stockers 8 and 10 into which to feed cassettes 2 to be processed coming from the preceding processor for storage are determined for each of the processors 3, 4 and 5. In the tables of FIGS. 54 and 55, the stocker data is supplemented by the region data described in connection with FIGS. 50 and 51. Typical data entries in these tables are prepared on the basis of the semiconductor fabrication equipment shown in FIG. 2.

In FIG. 34, the cassette withdrawal task preparation program residing in the host 12 of the first embodiment is started in step 33-2 of the above-mentioned automatic control program (step 34-1). A check is made to see if a process complete report about the cassette 2 is received from the processor 3, 4 or 5 (step 34-2). With the report received, a check is made to see if direct transport mode is turned on (step 34-3). With direct transport mode found to be on, a processor 3, 4 or 5 that will perform the next process of fabrication is determined, and a check is made on the determined processor to see if it is ready to accept the cassette 2 (step 34-4). If the processor is found ready, step 34-10 is reached so that the subsequent transport task will be taken over by the semiconductor wafer supply control (pull) program of FIG. 23. If direct transport mode is not found to be on in step 34-3 or if the processor 3, 4 or 5 that will perform the next process of fabrication is not found ready in step 34-4, then a check is made to see if cassette withdrawal mode is on (step 34-5).

If cassette withdrawal mode is not on, no cassette storage will take place into the bay stockers 8 set in the cassette withdrawal stocker table, and an event is generated to invoke the cassette feed task preparation program (step 34-6) before step 34-2 is reached again. If cassette withdrawal mode is found on in step 34-5, a stocker 8 or 10 into which to withdraw the processed cassette 2 from the preceding processor 3, 4 or 5 is determined in line with the cassette withdrawal stocker table (step 34-7). Then transport task data is prepared (step 34-8), and the prepared data is written to the transport task queuing table (step 34-9). A check is made to see if any interruption has occurred (step 34-10). If no interruption is detected, step 34-2 is reached again. If an interruption is found to have occurred, the cassette withdrawal task preparation program is terminated (step 34-11). FIG. 53 shows an example of the transport task queuing table.

The cassette feed task preparation program, shown in FIG. 35 and residing in the host 12 of the first embodiment, is started in step 33-3 of the semiconductor wafer output control (push) program shown in FIG. 33 (step 35-1). Upon arrival of the cassette 2 at the stocker 8 or 10 or after detection of an event generated in step 34-4 of FIG. 34 (step 35-2), a check is made to see if direct transport mode is on (step 35-3). If direct transport mode is found to be on, a processor 3, 4 or 5 that will perform the next process of fabrication is determined and a check is made to see if the determined processor is ready to accept the cassette 2 (step 35-4). If the process is found ready, step 35-12 is reached so that the subsequent transport task will be taken over by the "pull" program of FIG. 23.

If direction transport mode is not on in step 35-3 or if the next processor 3, 4 or 5 is not ready in step 35-4, then a check is made to see if the cassette 2 is located in the processor 3, 4 or 5 (step 35-5). If the cassette 2 is located there, step 35-9 is reached. If the cassette 2 is not located in the processor in step 35-5, the cassette is judged to have arrived at a stocker 8 or 10. A check is then made to see if the stocker 8 or 10 is any of the cassette feed stockers 8 or 10 set in the cassette feed stocker table (step 35-6). If the stocker 8 or 10 in question is other than the cassette feed stockers, step 35-9 is reached.

If the cassette 2 is found to have arrived at a cassette feed stocker 8 or 10 in step 35-6, a check is made to see if forward-justify mode is on (step 35-7). If forward-justify mode is not found on, step 35-2 is reached again. If forward-justify mode is found on in step 35-7, a check is made to see if the stocker 8 or 10 at which the cassette 2 has arrived is the last cassette feed stocker 8 or 10 set in the cassette feed stocker table (step 35-8). If the stocker 8 or 10 in question is other than the last cassette feed stocker, step 35-9 is reached. If the cassette 2 is judged to have reached the last cassette feed stocker in step 35-8, step 35-2 is reached again.

The destination stocker 8 or 10 is then determined by resorting to the cassette feed stocker table (step 35-9). In this stocker table, as shown in FIG. 55, a plurality of stockers 8 and 10 (three in this example) may be set for each of the processors 3, 4 and 5. The table is headed by what is termed the "last" stocker having the highest priority. When the destination stocker 8 or 10 is determined by use of the table, a check is made on the listed stockers in descending order of their priorities to see if one of them, with the highest possible priority, is ready to accept the cassette 2. Specifically, if the stocker 8 or 10 with the highest priority is full of cassettes and has no room for more, the stocker with the next-highest priority is selected to accommodate the cassette 2. Then data about the task of cassette transport to the selected stocker 8 or 10 is prepared (step 35-10). The prepared data is written to the transport task queuing table (step 35-11). A check is then made to see if any interruption has occurred (step 35-12). If no interruption is detected, step 35-2 is reached again. If an interruption is detected, the cassette feed task preparation program is terminated (step 35-13). FIG. 53 shows an example of the transport task queuing table.

As described, the semiconductor wafer output control (push) program of the first embodiment and the related programs first read a transport control changeover code from each of the processors 3, 4 and 5 or each group thereof. As specified by the code thus read, the programs check to see if the processed cassette 2 leaving the source processor 3, 4 or 5 or transported to the stocker 8 or 10 of the destination is accepted by the destination processor 3, 4 or 5. If the destination processor 3, 4 or 5 is judged ready to accept the cassette 2, the cassette is immediately transported in direct transport mode to the destination processor 3, 4 or 5. Alternatively, as specified by the transport control changeover code under the programs, cassette withdrawal mode is set up in which a check is made to see if the cassette is transported to a source stocker 8 located near the source processor 3, 4 or 5. Otherwise, as specified by the transport control changeover code under the programs, forward-justify mode is set up in which a check is made to see if the cassette 2 stored temporarily in a stopover stocker 8 or 10 prior to transport to the destination stocker 8 or 10 near the destination processor 3, 4 or 5 is transported from that stopover stocker to the destination stocker.

Figure 36:
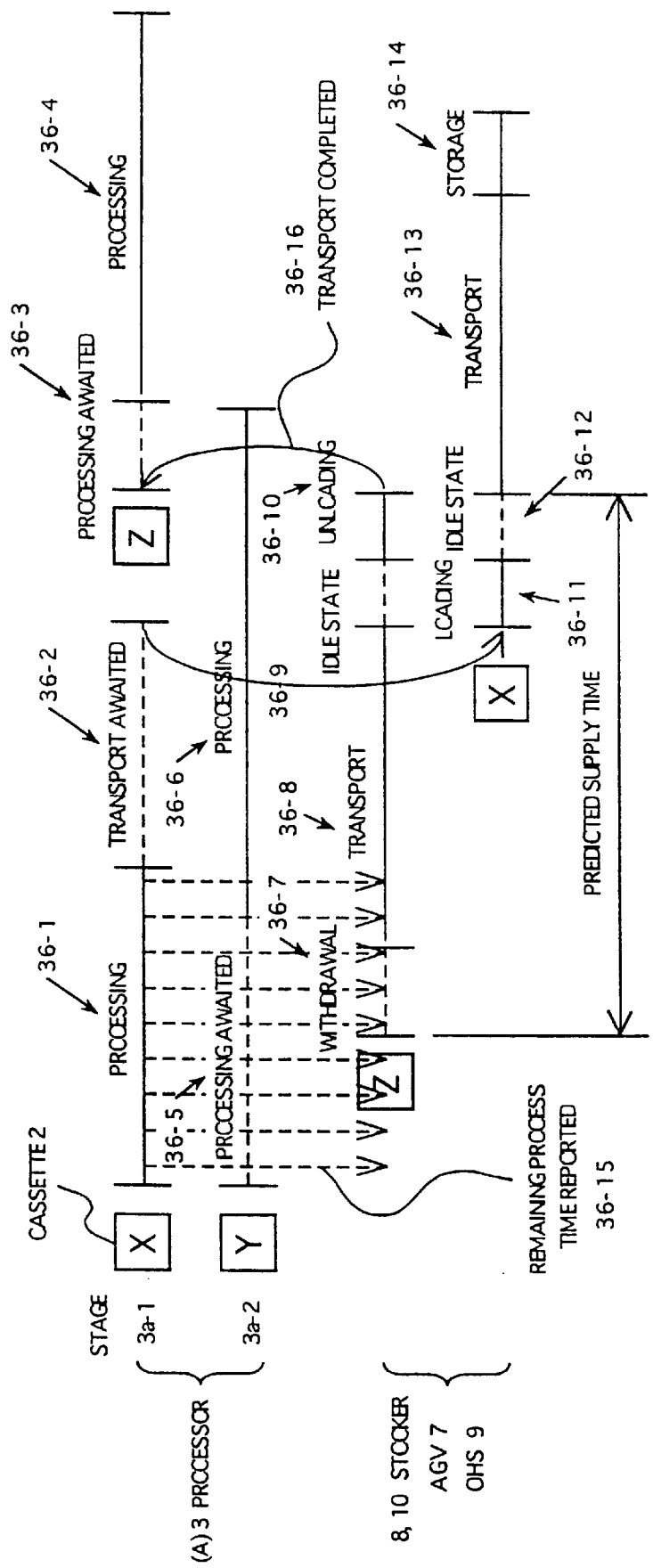
FIG. 36 is a timing chart for transport tasks under a transport control method used by a first embodiment of the invention exemplified by the processor (A)

FIG. 36 is a timing chart for transport tasks performed under the transport control method used by the first embodiment of the invention exemplified by the processor (A) 3. With an unprocessed X cassette 2 and Y cassette 2 placed on the stages 3a-1 and 3a-2 respectively, processing of the X cassette 2 is started (step 36-1). With the processing initiated, the remaining process time is reported to the host 12 at predetermined intervals (step 36-15). Given the remaining process time report, the host 12 computes a predicted supply time and selects the Z cassette 2 as the highest-priority cassette 2 that can arrive within the computed time. Then comes withdrawal from the stacker 8 or 10

(step 36-7) followed by transport by use of the OHS 9 and AGV 7 (step 36-8). During that time, the processing of the X cassette 2 is completed. On arrival at the processor (A) 3, the AGV 7 loads the X cassette 2 onto a currently free stage 7c (step 36-11). Meanwhile, the Z cassette 2 that has idled on the other stage 7c (step 36-9) is unloaded onto the stage 3a-1 of the processor (A) 3 (step 36-10). When recognizing the arrival of the Z cassette 2 at the stage 3a-1 of the processor (A) 3 (step 36-16), the host 12 transmits a task instruction designating the start of processing. Given the instruction, the processor (A) 3 idles the Z cassette 2 waiting to be processed depending on the processing status of the Y cassette 2 (step 36-3). Thereafter, the processing is started (step 36-4). The X cassette 2 placed on the stage 7c of the AGV 7 is made to wait for the Z cassette 2 to be unloaded to the processor (A) 3 (step 36-12). In accordance with the contents of the transport control changeover code as well as the status of the transport destination, the X cassette 2 is carried to the processor 3, 4 or 5 or to the stocker 8 or 10 (steps 36-13 and 36-14). In this manner, the task of transporting the Z cassette 2 to the stage 3a-1 can be initiated without the need to wait for processing of the X cassette 2 to be completed on the stage 3a-1. This prolongs significantly the time period allowed for carrying out transport tasks. Although the example above deals with the processor (A) 3 alone, the same applies to the processors (B) 4 and (C) 5 as well.

As described and according to one aspect of the invention, there is provided a method for controlling semiconductor wafer fabrication equipment, the method comprising the steps of supplying and outputting semiconductor wafers to and from the fabrication equipment. The semiconductor wafer supplying step includes the steps of selecting semiconductor wafers to be transported to processing means on the basis of a remaining process time applicable to that processing means included in the fabrication equipment, and transporting the semiconductor wafers selected by the semiconductor wafer selecting step to the processing means. The semiconductor wafer output step includes the steps of selecting a transport destination constituted by either processing means or storage means to which to transport the semiconductor wafers having been processed by processing means, and outputting and transporting the processed semiconductor wafers from a transport source constituted by processing means to either the processing means or the storage means selected by the transport destination selecting step in accordance with a transport control changeover code read from the processing means and storage means furnished in the fabrication equipment. Of the semiconductor wafer cassettes being processed inside the fabrication equipment, an optimal cassette to be supplied to each processing means is selected by the inventive method taking into consideration the priorities of the cassettes and their transport task execution times. This minimizes the idle time of each processing means, thereby enhancing the availability of all processing means configured. Because it is possible flexibly to select the transport destination to which to transport each semiconductor wafer cassette having been processed at one stage or another, transport tasks may be controlled with respect to each semiconductor wafer cassette. This improves transport efficiency and eases operating loads on the transport means.

Preferably, the inventive method may compute a remaining process time of each processing means in the fabrication equipment, compute a predicted supply time within which to supply semiconductor wafers to given processing means on the basis of the remaining process time, and select semiconductor wafers that may be transported to desired processing means within the predicted supply time thus computed. This method allows all processing means to be supplied continuously with semiconductor wafers, whereby the availability of the processing means is enhanced. Because there is no need to carry semiconductor wafers beforehand to the nearest storage means of given processing means, the semiconductor wafers may be placed temporarily in any available storage means. This increases the availability of the transport means.

Preferably, the inventive method may compute a transport task execution time for transport from a transport source constituted by either processing means or storage means to a transport destination constituted by processing means, on the basis of a transport task execution time for transport between each processing means and its nearest stocker, a transport task execution time for transport between stockers, and transport task execution unit times computed for each of the elements constituting each transport task. This method allows transport task execution times to be computed more accurately so that the transport means may be controlled in a more exacting manner. That is, a predicted transport time is obtained depending on the locations of the transport source and destination each constituted by processing means or a stocker. This makes it possible to select, from among semiconductor wafers being processed in the fabrication equipment, the suitable wafers that may be transported to desired processing means within a predicted supply time.

Preferably, the inventive method may select the semiconductor wafers which may be transported to a transport destination constituted by processing means within the predicted supply time through comparisons between the transport task execution time and the predicted supply time. Because it is possible to select the semiconductor wafers that can be transported to the destination within the predicted supply time, there is no need to transport wafers in advance to the storage means of the processing means that will perform the next process of fabrication.

Preferably, the inventive method may detect any error in the transport means. Because the method permits detecting semiconductor wafers that cannot be transported to their destination due to faulty transport means, the wafers that can be transported are carried preferentially to their destination. Even if part of the transport means fails, the inventive method minimizes any consequential decline in the availability of the fabrication equipment as a whole. Since it is possible to stop transporting semiconductor wafers beyond the defective transport means to the wafer destination, the defect can be repaired quickly.

Preferably, the inventive method may set a predicted start time at which to start the transport means, i.e., at which the transport task is initiated. Because it is possible to detect a disparity between the predicted start time and the time at which the transport task has actually started, that disparity may be recognized as a delay time.

Preferably, the inventive method may compute a transport task completion target time on the basis of the delay time, i.e., a time period in which a given transport task is lagging behind, so that each transport means will complete the task of transporting the semiconductor wafers within the transport task completion target time. This helps eliminate transport task delays that may occur.

Preferably, the inventive method may compute repeatedly the remaining process time of each of the processing means furnished in the semiconductor wafer fabrication equipment until each processing means completes its processing. Because the semiconductor wafer selecting step is carried out repeatedly, the applicable semiconductor wafers may be selected for the respective processes in a more exacting manner.

Preferably, the inventive method may divide transport task execution unit times into two groups to be computed separately, one group being made up of transport task execution unit times for transport between processing means and storage means within the same process region, the other group being composed of transport task execution unit times for transport between different process regions. This method enhances the accuracy of computed transport task execution times, whereby the efficiency of transport tasks is improved.

Preferably, the inventive method may partly correct the transport task execution unit times depending on where semiconductor wafers are stored in the storage means. This also helps improve the accuracy of the transport task execution unit times.

Preferably, the inventive method may designate, from among the processing means of the semiconductor wafer fabrication equipment, those processing means to which to supply the semiconductor wafers cassettes selected on the basis of their remaining process time. The method removes those processing means liable to vary in their process time from the target processing means to which to supply the semiconductor wafers selected according to their remaining process time. This makes it possible to reduce the quantity of semiconductor wafer cassettes subject to the processing means with varying process times, whereby the loads on the processing means are alleviated.

Preferably, the inventive method may select a transport destination constituted by any one of a plurality of storage means located in each of the process regions to which to transport the semiconductor wafers having been processed by processing means constituting a transport source, the destination storage means being selected in accordance with priorities assigned to the plurality of storage means each capable of accommodating the processed semiconductor wafers; and may transport the semiconductor wafers from the source processing means to the destination storage means thus selected. The method permits flexibly selecting the transport destination depending on the status of the storage means. This makes it possible to utilize the storage means efficiently and alleviate loads on the transport means, whereby transport efficiency is enhanced.

Preferably, the inventive method may assign priorities to storage means, any one of which may serve as a transport destination to which to transport semiconductor wafers having been processed by processing means and, if the storage means with the currently-highest priority is not available as a destination, the method may select the storage means with the next-highest priority in accordance with the assigned priorities. Because the storage means having the currently-highest priority but not available is replaced by the storage means having the next highest priority and accommodating the semiconductor wafers transported thereto, the wafers are stored in the storage means with the shortest possible time for transport to the next processing means for fabrication. This minimizes any drop in the efficiency of transport tasks.

Preferably, the inventive method may control the transport means as specified by the transport control changeover switch read from the processing means or storage means. The method allows the way the semiconductor wafers are transported to be changed flexibly. This makes it possible to implement diverse forms of fabrication whereby semiconductor wafers are produced with due respect to their delivery schedules and the demand situation.

Preferably, if the transport control changeover code specifies that the semiconductor wafers having been processed by processing means be transported to storage means furnished in the same process region as that of the processing means having performed the processing, then the inventive method may transport the semiconductor wafers to the storage means in the same process region; if the transport control changeover code specifies that the semiconductor wafers having been processed by processing means be transported to storage means furnished in a process region different from that of the processing means having performed the processing, then the inventive method may transport the semiconductor wafers directly to the storage means in the different process region. The method shortens the time it takes to transport those semiconductor wafers that need to be urgently processed to the next processing means of fabrication.

Preferably, if the transport control changeover code specifies that semiconductor wafers transported to storage means with a low priority and stored temporarily therein be transported to storage means with a higher priority, then the inventive method may transport the semiconductor wafers to the storage means with that higher priority. While preferentially transporting the semiconductor wafers that need to be processed urgently, the inventive method still ensures reliable transport of semiconductor wafers that are housed in storage means with lower priorities.

Preferably, if the transport control changeover code specifies that the semiconductor wafers having been processed by processing means and not currently located in the nearest storage means of that processing means, the semiconductor wafers currently located in the nearest storage means of the processing means, or the semiconductor wafers currently located in the nearest storage means of destination processing means be transported directly to processing means that will perform the next process of fabrication, and if the next processing means is ready to perform the next process, then the inventive method may transport the semiconductor wafers immediately to that next processing means. Because the semiconductor wafers are transported as soon as possible to the processing means that will perform the next process of fabrication, the availability and productivity of the processing means are boosted.

According to another aspect of the invention, there is provided semiconductor wafer fabrication equipment comprising semiconductor wafer supply means and semiconductor wafer output means. The semiconductor wafer supply means includes: semiconductor wafer selecting means for selecting semiconductor wafers to be processed by processing means on the basis of a remaining process time applicable to the processing means included in the semiconductor wafer fabrication equipment; and transporting means for transporting the semiconductor wafers selected by the semiconductor wafer selecting means to the processing means. The semiconductor wafer output means includes: transport destination selecting means for selecting a transport destination constituted by either processing means or storage means to which to transport the semiconductor wafers having been processed by the processing means; and transporting means for transporting the processed semiconductor wafers to either the processing means or the storage means selected by the transport destination selecting means in accordance with a transport control changeover code read from the processing means and the storage means furnished in the semiconductor wafer fabrication equipment. The inventive equipment allows semiconductor wafer cassettes being processed therein to be optimally selected and supplied to each of the processing means in consideration of the priorities and transport task execution times applicable to the cassettes. Thus arranged, the equipment minimizes the idle time of each processing means and thereby improves the availability of all processing means. Because the destination to which to transport semiconductor wafer cassettes having been processed by given processing means may be selected flexibly, transport tasks maybe controlled for each semiconductor wafer cassette. This improves transport efficiency and eases loads on the transport means.

Preferably, the inventive equipment may further include: remaining process time computing means for computing a remaining process time of any processing means included in the fabrication equipment; and semiconductor wafer selecting means for selecting semiconductor wafers that may be transported to desired processing means within a predicted supply time computed on the basis of the remaining process time of the processing means in question. The inventive equipment allows the processing means to be supplied continuously with semiconductor wafers, thus enhancing the availability of the processing means. Because there is no need to transport semiconductor wafers beforehand to the nearest storage means of given processing means, the semiconductor wafers may be placed temporarily in any available storage means. This increases the availability of the transport means.

Preferably, the inventive equipment may further comprise: transport destination selecting means for selecting a transport destination constituted by any one of a plurality of storage means to which to transport the semiconductor wafers having been processed by processing means constituting a transport source, the destination storage means being selected in accordance with priorities assigned to the plurality of storage means each capable of accommodating the processed semiconductor wafers; and transporting means for transporting the semiconductor wafers to the destination storage means thus selected. The equipment allows the transport destination to be selected flexibly depending on the status of the storage means. This makes it possible to utilize the storage means efficiently and alleviate loads on the transport means, whereby transport efficiency is enhanced.

Obviously many modifications and variations of the present invention are possible in the light of the above teachings. It is therefore to be understood that within the scope of the appended claims the invention may by practiced otherwise than as specifically described.

What is claimed is:

1. A method for controlling semiconductor wafer fabrication equipment comprising processing means for processing semiconductor wafers; storage means for storing semiconductor wafers, said storage means being furnished corresponding to said processing means; first transport means for transporting semiconductor wafers between said processing means and said storage means; and second transport means for transporting semiconductor wafers between process regions each made up of said processing means, of said storage means and of said first transport means, said process regions being furnished as many as needed; said method further comprising a semiconductor wafer supplying step and a semiconductor wafer output step;

said semiconductor wafer supplying step including the steps of:
selecting semiconductor wafers to be transported to processing means on the basis of a remaining process time applicable to said processing means included in said semiconductor wafer fabrication equipment; and
transporting and supplying the semiconductor wafers selected by said semiconductor wafer selecting step to said processing means; and said semiconductor wafer output step including the steps of:
selecting a transport destination constituted by either processing means or storage means to which to transport the semiconductor wafers having been processed by processing means; and
outputting and transporting the processed semiconductor wafers from a transport source constituted by processing means to either the processing means or the storage means selected by said transport destination selecting step in accordance with a transport control changeover code read from said processing means and said storage means furnished in said semiconductor wafer fabrication equipment.

2. The method for controlling semiconductor wafer fabrication equipment according to claim 1, wherein said semiconductor wafer supplying step further comprises the steps of:
computing a remaining process time of any processing means included in said semiconductor wafer fabrication equipment;
computing a predicted supply time within which to supply semiconductor wafers to said processing means in accordance with the remaining process time of said processing means;
selecting semiconductor wafers that may be transported to said processing means within said predicted supply time; and
transporting and supplying the semiconductor wafers selected by said semiconductor wafer selecting step to the transport destination constituted by processing means.

3. The method for controlling semiconductor wafer fabrication equipment according to claim 2, wherein said semiconductor wafer supplying step further comprises the step of computing a transport task execution time required to transport said semiconductor wafers from a transport source constituted by either processing means or storage means to a transport destination constituted by processing means, said computing being performed on the basis of transport task execution unit times computed and required for said first and said second transport means to accomplish respective transport tasks.

4. The method for controlling semiconductor wafer fabrication equipment according to claim 3, wherein said semiconductor wafer supplying step further comprises the step of selecting, from among the semiconductor wafers which have been processed by processing means constituting a transport source and which currently remain in the source processing means or source storage means, those semiconductor wafers which may be transported to a transport destination constituted by processing means within said predicted supply time, said selecting being performed through comparisons between the transport task execution time computed by said transport task execution time computing step on the one hand and said predicted supply time within which to supply semiconductor wafers to the destination processing means on the other hand.

5. The method for controlling semiconductor wafer fabrication equipment according to claim 4, wherein said semiconductor wafer selecting step further comprises the step of detecting any error in said first and said second transport means operating to transport semiconductor wafers which have already been processed by processing means constituting a transport source, which are currently located either in the source processing means or in storage means thereof, and which are ready to be transported to a transport destination constituted by processing means, wherein, if said transport means error detecting step detects an error in any of said first and said second transport means connecting the source processing means or source storage means to the destination processing means, then said semiconductor wafers are not transported.

6. The method for controlling semiconductor wafer fabrication equipment according to claim 4, wherein said transporting and supplying step includes the steps of:

setting a predicted start time at which said first and said second transport means start transporting the semiconductor wafers selected by said semiconductor wafer selecting step to a transport destination constituted by processing means; and computing, with respect to said predicted start time, a delay time in effect if said first and said second transport means are started later than said predicted start time.

7. The method for controlling semiconductor wafer fabrication equipment according to claim 6, wherein said transporting and supplying step includes computing a transport task completion target time within which to complete a task of transporting the semiconductor wafers selected by said semiconductor wafer selecting step, on the basis of the transport task execution time computed by said transport task execution time computing step and of the delay time computed by said delay time computing step, so that said semiconductor wafers will be transported to complete the transport task within said transport task completion target time.

8. The method for controlling semiconductor wafer fabrication equipment according to claim 2, wherein said remaining process time computing step includes computing repeatedly the remaining process time of each of said processing means furnished in said semiconductor wafer fabrication equipment until each processing means completes processing thereof.

9. The method for controlling semiconductor wafer fabrication equipment according to claim 3, wherein said transport task execution time computing step includes correcting the transport task execution unit times depending on where semiconductor wafers are stored in said storage means.

10. The method for controlling semiconductor wafer fabrication equipment according to claim 2, wherein said semiconductor wafer supplying step includes dividing said processing means of said semiconductor wafer fabrication equipment into two groups, one processing means group being composed of the processing means for which said remaining process time computing step is performed, the other processing means group being made of the processing means for which said remaining process time computing step is not performed.

11. The method for controlling semiconductor wafer fabrication equipment according to claim 1, wherein said semiconductor wafer output step includes the steps of:

selecting a transport destination constituted by any one of a plurality of storage means located in each of said process regions to which to transport the semiconductor wafers having been processed by processing means constituting a transport source, the destination storage means being selected in accordance with priorities assigned to said plurality of storage means each capable of accommodating the processed semiconductor wafers; and outputting and transporting said semiconductor wafers from the source processing means to said destination storage means selected by said transport destination selecting step.

12. The method for controlling semiconductor wafer fabrication equipment according to claim 11, wherein, if the storage means with the currently-highest priority is not available, said transport destination selecting step selects the storage means with the next-highest priority in accordance with said priorities assigned to said plurality of storage means.

13. The method for controlling semiconductor wafer fabrication equipment according to claim 11, wherein said transport destination selecting step includes reading said transport control changeover code from said processing means and said storage means of said semiconductor wafer fabrication equipment and, as specified by the code, changing ways in which said outputting and transporting step is controlled to output and transport the semiconductor wafers having been processed by processing means.

14. The method for controlling semiconductor wafer fabrication equipment according to claim 13, wherein, if said transport control changeover code specifies that the semiconductor wafers having been processed by processing means be transported to storage means furnished in the same process region as that of said processing means having performed the processing, then said outputting and transporting step transports said semiconductor wafers to said storage means in the same process region.

15. The method for controlling semiconductor wafer fabrication equipment according to claim 13, wherein, if said transport control changeover code specifies that the semiconductor wafers having been processed by processing means be transported to storage means furnished in a process region different from that of said processing means having performed the processing, then said outputting and transporting step transports said semiconductor wafers directly to said storage means in the different process region.

16. The method for controlling semiconductor wafer fabrication equipment according to claim 13, wherein, if said transport control changeover code specifies that semiconductor wafers transported to storage means with a low priority and stored temporarily therein be transported to storage means with a higher priority, then said outputting and transporting step transports said semiconductor wafers to said storage means with said higher priority.

17. The method for controlling semiconductor wafer fabrication equipment according to claim 13, wherein, if said transport control changeover code specifies that the semiconductor wafers having been processed by processing means constituting a transport destination and currently located in either the destination processing means or storage means thereof be transported to processing means that will perform the next process of fabrication, and if said processing means is ready to perform said next process, then said outputting and transporting step transports said semiconductor wafers immediately to the next processing means.

18. Semiconductor wafer fabrication equipment comprising: processing means for processing semiconductor wafers; storage means for storing semiconductor wafers, said storage means being furnished corresponding to said processing means; first transport means for transporting semiconductor wafers between said processing means and said storage means; and second transport means for transporting semiconductor wafers between process regions each made up of said processing means, of said storage means and of said first transport means, said process regions being furnished as many as needed;

said semiconductor wafer fabrication equipment further comprising a semiconductor wafer supply device and a semiconductor wafer output device;

said semiconductor wafer supply devices including:
- semiconductor wafer selecting means for selecting semiconductor wafers to be processed by processing means on the basis of a remaining process time applicable to said processing means included in said semiconductor wafer fabrication equipment; and
- transporting means for transporting the semiconductor wafers selected by said semiconductor wafer selecting means to said processing means; and said semiconductor wafer output device including:
- transport destination selecting means for selecting a transport destination constituted by either processing means or storage means to which to transport the semiconductor wafers having been processed by said processing means; and
- transporting means for transporting the processed semiconductor wafers to either the processing means or the storage means selected by said transport destination selecting means in accordance with a transport control changeover code read from said processing means and said storage means furnished in said semiconductor wafer fabrication equipment.

19. Semiconductor wafer fabrication equipment according to claim 18, wherein said semiconductor wafer supply device further comprises:

remaining process time computing means for computing a remaining process time of any processing means included in said semiconductor wafer fabrication equipment;

predicted supply time computing means for computing a predicted supply time within which to supply semiconductor wafers to said processing means in accordance with the remaining process time of said processing means;

semiconductor wafer selecting means for selecting semiconductor wafers that may be transported to said processing means within said predicted supply time; and transporting means for transporting the semiconductor wafers selected by said semiconductor wafer selecting means.

20. Semiconductor wafer fabrication equipment according to claim 18, wherein said semiconductor wafer output device further comprises:

transport destination selecting means for selecting a transport destination constituted by any one of a plurality of storage means located in each of said process regions to which to transport the semiconductor wafers having been processed by processing means constituting a transport source, the destination storage means being selected in accordance with priorities assigned to said plurality of storage means each capable of accommodating the processed semiconductor wafers; and transporting means for transporting said semiconductor wafers to said destination storage means selected by said transport destination selecting means.

* * * * *